United States Patent
Takimoto et al.

(10) Patent No.: US 11,925,027 B2
(45) Date of Patent: Mar. 5, 2024

(54) THREE-DIMENSIONAL MEMORY DEVICE INCLUDING SENSE AMPLIFIERS HAVING A COMMON WIDTH AND SEPARATION

(71) Applicant: SANDISK TECHNOLOGIES LLC, Addison, TX (US)

(72) Inventors: Takuma Takimoto, Kamakura (JP); Masayuki Hiroi, Yokohama (JP); Hiroyuki Ogawa, Nagoya (JP); Masatoshi Okumura, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 245 days.

(21) Appl. No.: 17/562,248

(22) Filed: Dec. 27, 2021

(65) Prior Publication Data

US 2023/0209832 A1    Jun. 29, 2023

(51) Int. Cl.
*H10B 43/40* (2023.01)
*G11C 16/04* (2006.01)
(Continued)

(52) U.S. Cl.
CPC ......... *H10B 43/40* (2023.02); *G11C 16/0483* (2013.01); *G11C 16/26* (2013.01); *H01L 24/08* (2013.01); *H01L 25/0657* (2013.01); *H01L 25/18* (2013.01); *H10B 41/27* (2023.02); *H10B 41/41* (2023.02); *H10B 43/27* (2023.02);
(Continued)

(58) Field of Classification Search
CPC ........ H10B 43/40; H10B 41/27; H10B 41/41; H10B 43/27; H10B 41/10; H10B 43/10; H10B 43/50; G11C 16/0483; G11C 16/26; G11C 7/18; G11C 5/025; H01L 24/08; H01L 25/0657; H01L 25/18; H01L 2224/08145; H01L 2924/1431; H01L 2924/14511
See application file for complete search history.

(56) References Cited

U.S. PATENT DOCUMENTS 5,915,167 A    6/1999  Leedy
6,441,469 B1   8/2002  Chrysostomides et al.
(Continued)

OTHER PUBLICATIONS

U.S. Appl. No. 17/224,370, filed Apr. 7, 2021, SanDisk Technologies LLC.
(Continued)

*Primary Examiner* — Allison Bernstein
(74) *Attorney, Agent, or Firm* — THE MARBURY LAW GROUP PLLC

(57) ABSTRACT

A semiconductor structure includes a memory array including first and second bit lines and a sense amplifier circuit. The sense amplifier circuit includes a first sense amplifier array containing first active sense amplifier transistors that each have an active region having a first width, where the first active sense amplifier transistors are electrically connected to the first bit lines, and a second sense amplifier array including second active sense amplifier transistors that each have the active region having the first width, where the second active sense amplifier transistors are electrically connected to the second bit lines, and dummy active regions which are electrically inactive located between columns of the second active sense amplifier transistors.

20 Claims, 47 Drawing Sheets

(51) Int. Cl.
*G11C 16/26* (2006.01)
*H01L 23/00* (2006.01)
*H01L 25/065* (2023.01)
*H01L 25/18* (2023.01)
*H10B 41/27* (2023.01)
*H10B 41/41* (2023.01)
*H10B 43/27* (2023.01)

(52) U.S. Cl.
CPC .............. *H01L 2224/08145* (2013.01); *H01L 2924/1431* (2013.01); *H01L 2924/14511* (2013.01)

(56) References Cited

U.S. PATENT DOCUMENTS

| | | | |
|---|---|---|---|
| 6,920,079 B2 * | 7/2005 | Shibayama | G11C 11/412 |
| | | | 257/E27.098 |
| 8,378,892 B2 | 2/2013 | Sorvala et al. | |
| 10,115,681 B1 | 10/2018 | Ariyoshi | |
| 10,283,493 B1 | 5/2019 | Nishida | |
| 10,354,980 B1 | 7/2019 | Mushiga et al. | |
| 10,354,987 B1 | 7/2019 | Mushiga et al. | |
| 10,381,322 B1 | 8/2019 | Azuma et al. | |
| 10,381,362 B1 | 8/2019 | Cui et al. | |
| 10,510,738 B2 | 12/2019 | Kim et al. | |
| 10,622,367 B1 | 4/2020 | Nishikawa et al. | |
| 10,629,616 B1 | 4/2020 | Kai et al. | |
| 10,665,580 B1 | 5/2020 | Hosoda et al. | |
| 10,665,581 B1 | 5/2020 | Zhou et al. | |
| 10,714,497 B1 | 7/2020 | Nishida et al. | |
| 10,727,216 B1 | 7/2020 | Kai et al. | |
| 10,734,080 B2 | 8/2020 | Chibvongodze et al. | |
| 10,741,535 B1 | 8/2020 | Nishikawa et al. | |
| 10,790,296 B1 | 9/2020 | Yamaha et al. | |
| 10,797,035 B1 | 10/2020 | Sano et al. | |
| 10,797,062 B1 | 10/2020 | Nishikawa et al. | |
| 10,804,202 B2 | 10/2020 | Nishida | |
| 10,811,058 B2 | 10/2020 | Zhang et al. | |
| 10,854,573 B2 | 12/2020 | Ji et al. | |
| 10,854,619 B2 | 12/2020 | Chibvongodze et al. | |
| 10,861,873 B2 | 12/2020 | Kim et al. | |
| 10,872,899 B2 | 12/2020 | Kim et al. | |
| 10,879,260 B2 | 12/2020 | Uryu et al. | |
| 10,910,272 B1 | 2/2021 | Zhou et al. | |
| 10,957,680 B2 | 3/2021 | Yada et al. | |
| 10,957,705 B2 | 3/2021 | Totoki et al. | |
| 10,985,169 B2 | 4/2021 | Kai et al. | |
| 2005/0041499 A1 | 2/2005 | Shibayama | |
| 2008/0088511 A1 | 4/2008 | Sorvala et al. | |
| 2019/0019838 A1 | 1/2019 | Kropelnicki et al. | |
| 2019/0221557 A1 | 7/2019 | Kim et al. | |
| 2019/0252361 A1 | 8/2019 | Nishida | |
| 2020/0066745 A1 | 2/2020 | Yu et al. | |
| 2020/0075083 A1 | 3/2020 | Cole et al. | |
| 2020/0286815 A1 | 9/2020 | Moriyama et al. | |
| 2020/0286875 A1 | 9/2020 | Nishida et al. | |
| 2020/0343161 A1 | 10/2020 | Wu et al. | |
| 2020/0395350 A1 | 12/2020 | Wu et al. | |
| 2021/0028148 A1 | 1/2021 | Wu et al. | |
| 2021/0028149 A1 | 1/2021 | Makala et al. | |
| 2021/0057336 A1 | 2/2021 | Shao et al. | |
| 2021/0066317 A1 | 3/2021 | Wu et al. | |
| 2021/0098029 A1 | 4/2021 | Kim et al. | |
| 2021/0126008 A1 | 4/2021 | Tanabe et al. | |
| 2021/0134819 A1 | 5/2021 | Zhang et al. | |
| 2021/0134827 A1 | 5/2021 | Iwai et al. | |
| 2021/0193195 A1 | 6/2021 | Thyagarajan et al. | |
| 2021/0233900 A1 | 7/2021 | Kim et al. | |
| 2021/0391351 A1 | 12/2021 | Takimoto et al. | |

OTHER PUBLICATIONS

U.S. Appl. No. 17/315,938, filed May 10, 2021, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.
U.S. Appl. No. 16/774,372, filed Jan. 28, 2020, SanDisk Technologies LLC.
Notification of Transmittal of the International Search Report and Written Opinion of the International Searching Authority for International Patent Application No. PCT/US2022/029528, dated Oct. 12, 2022, 8 pages.

* cited by examiner

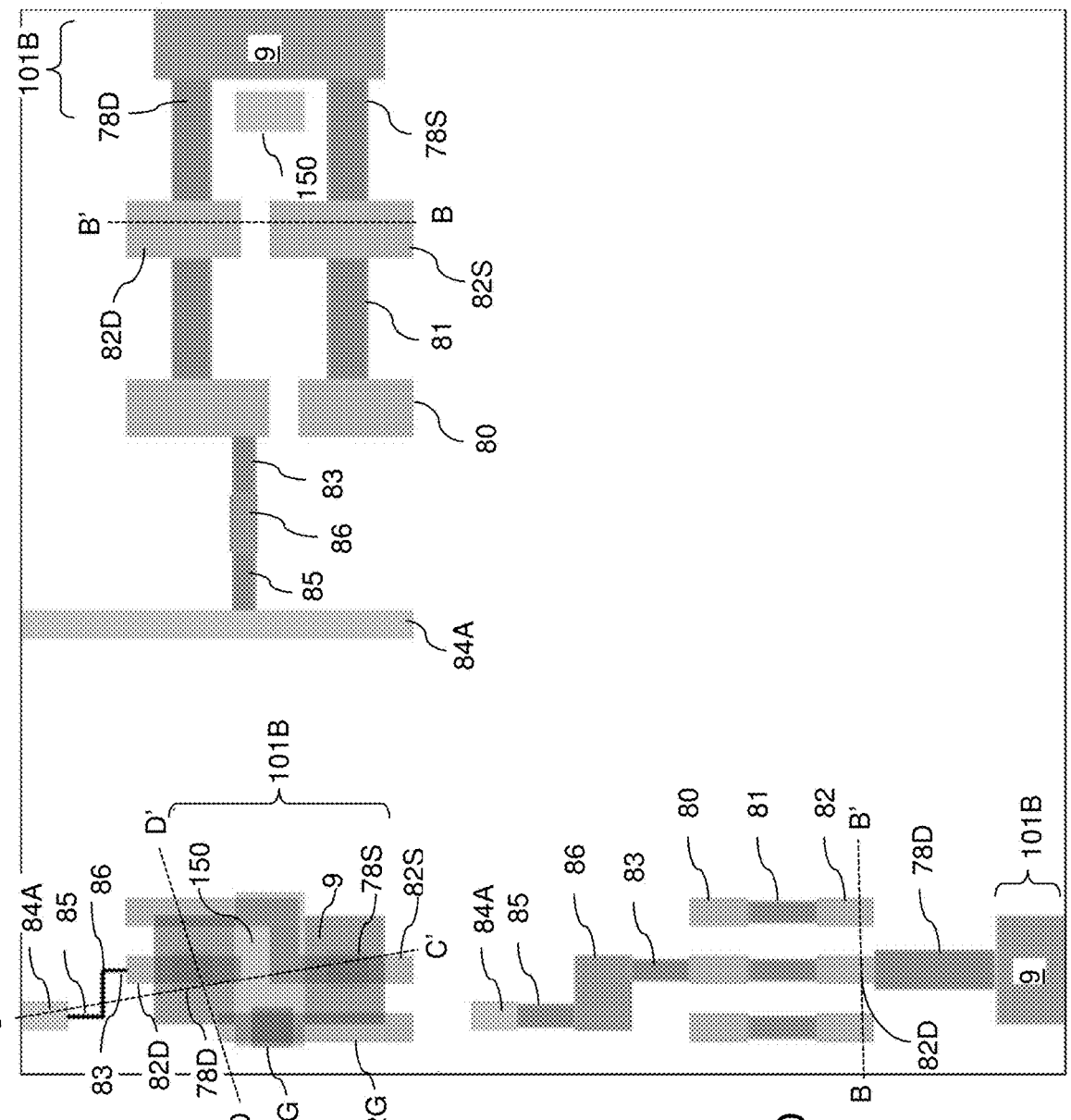

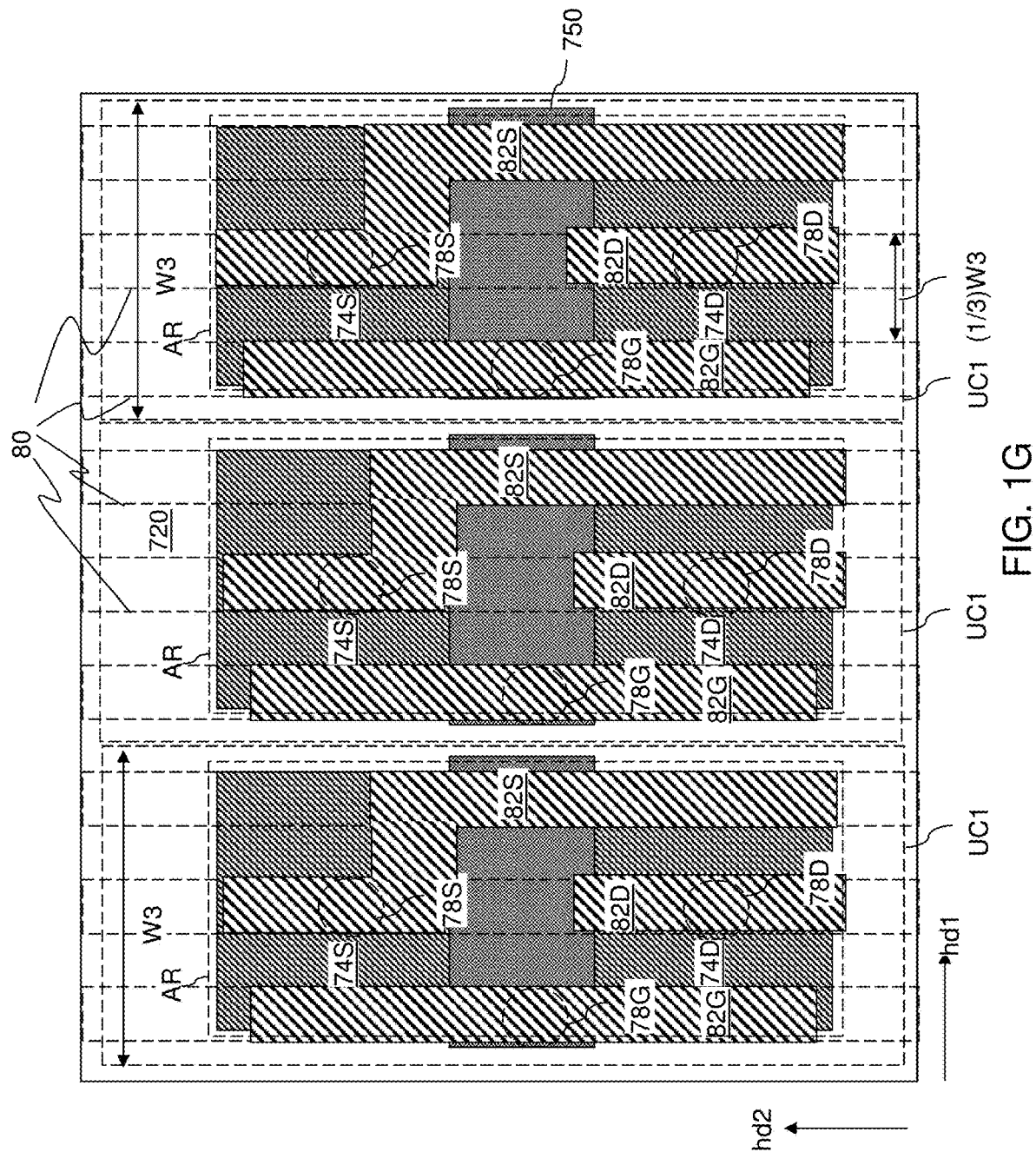

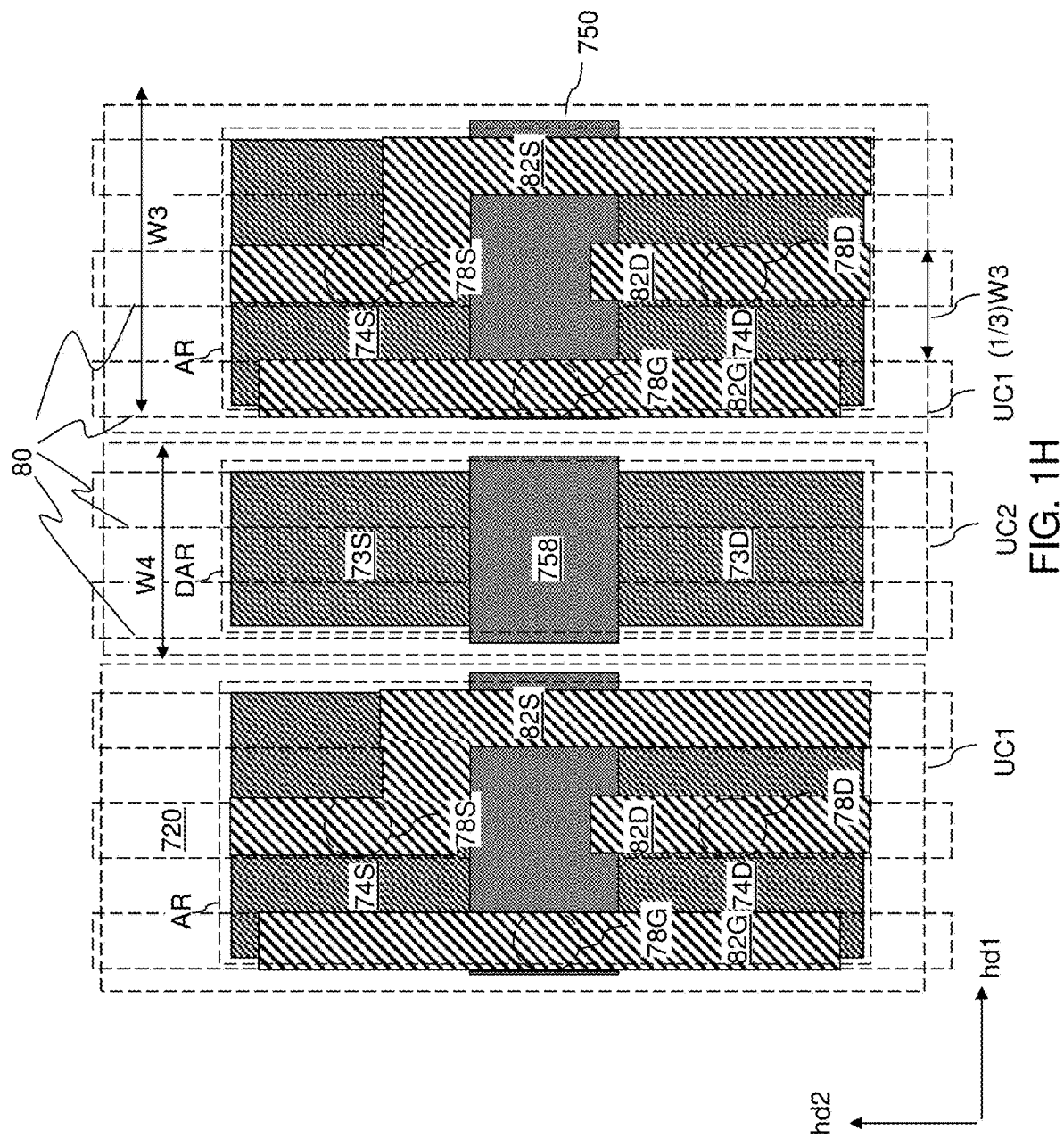

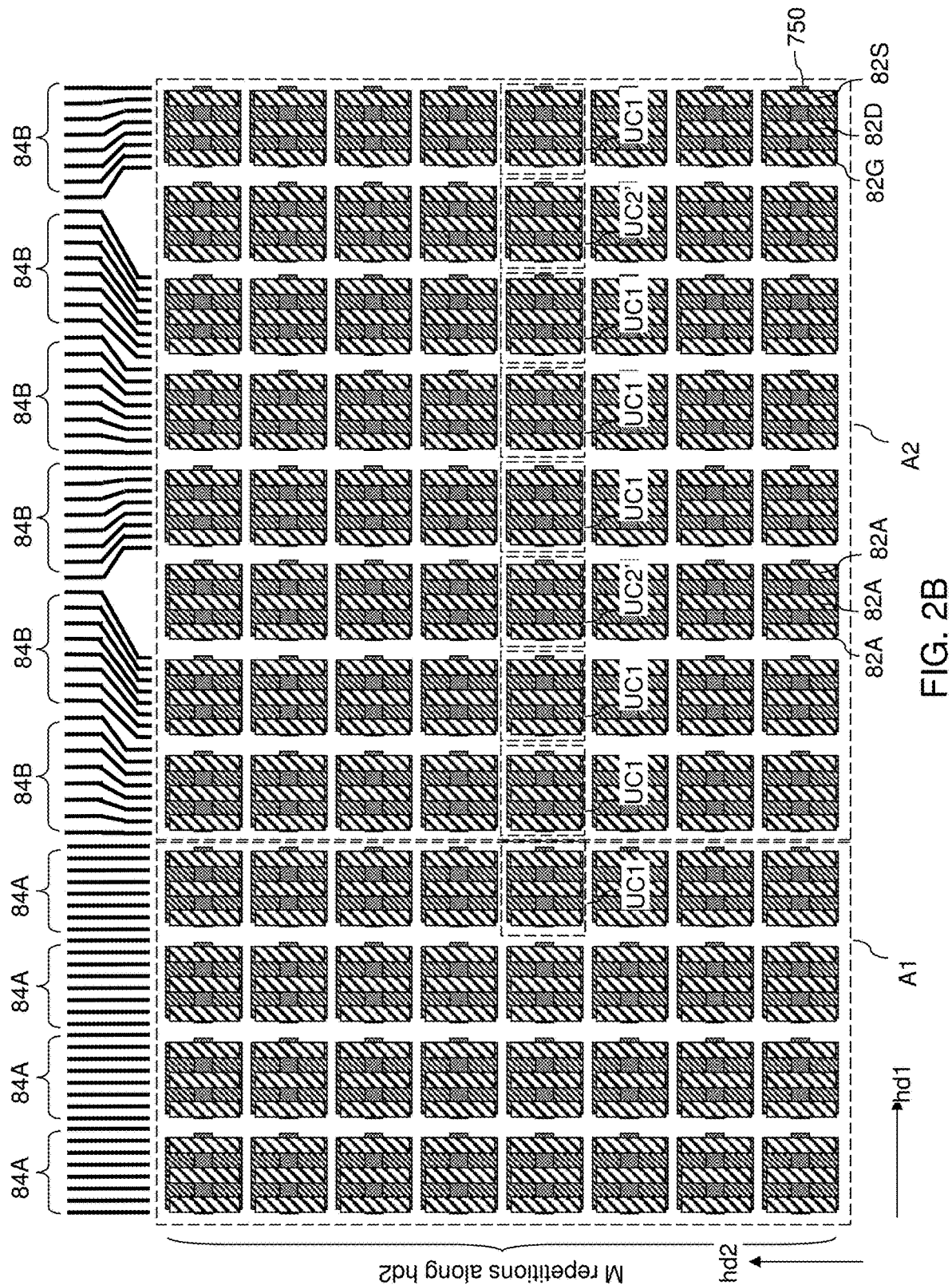

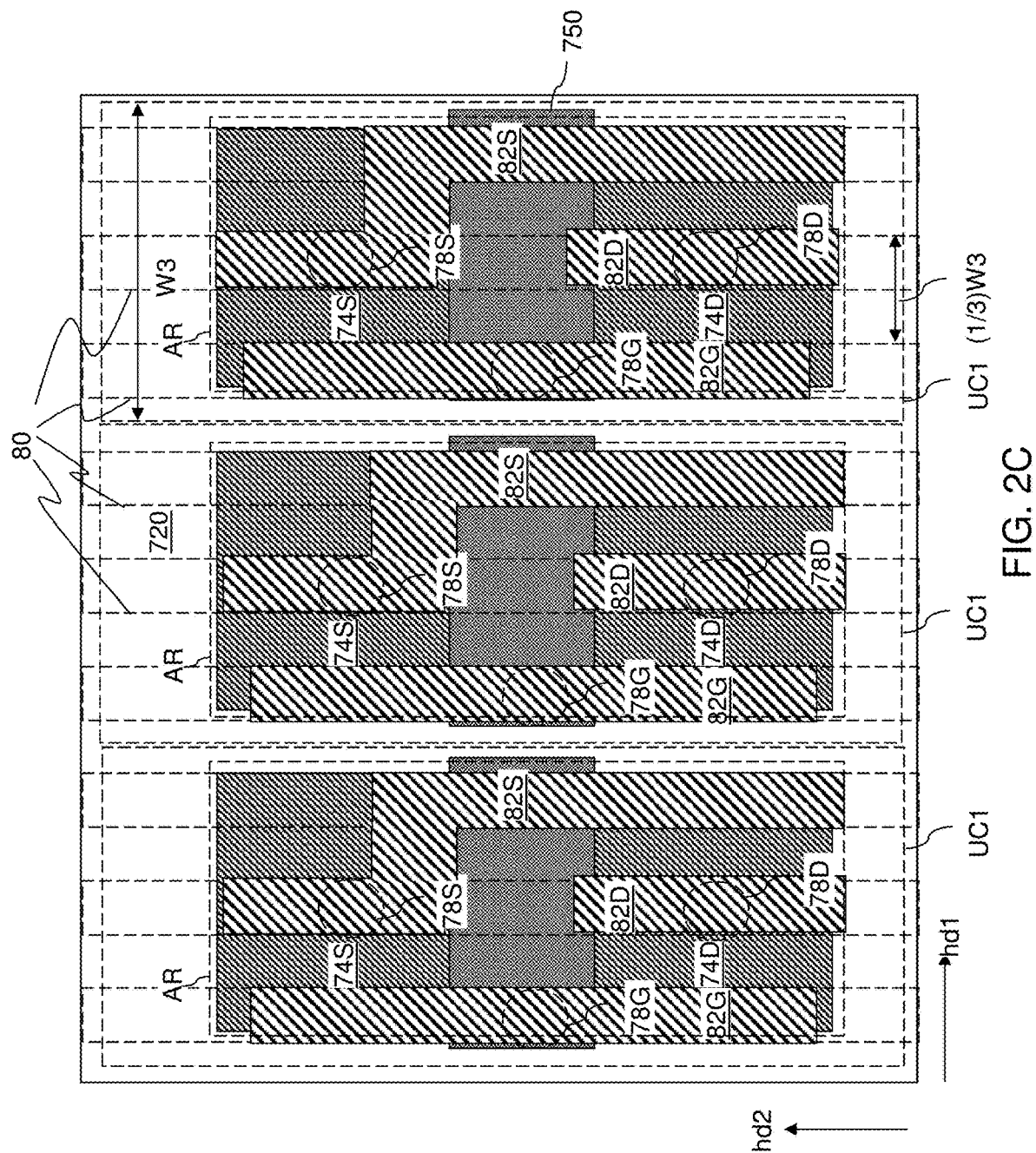

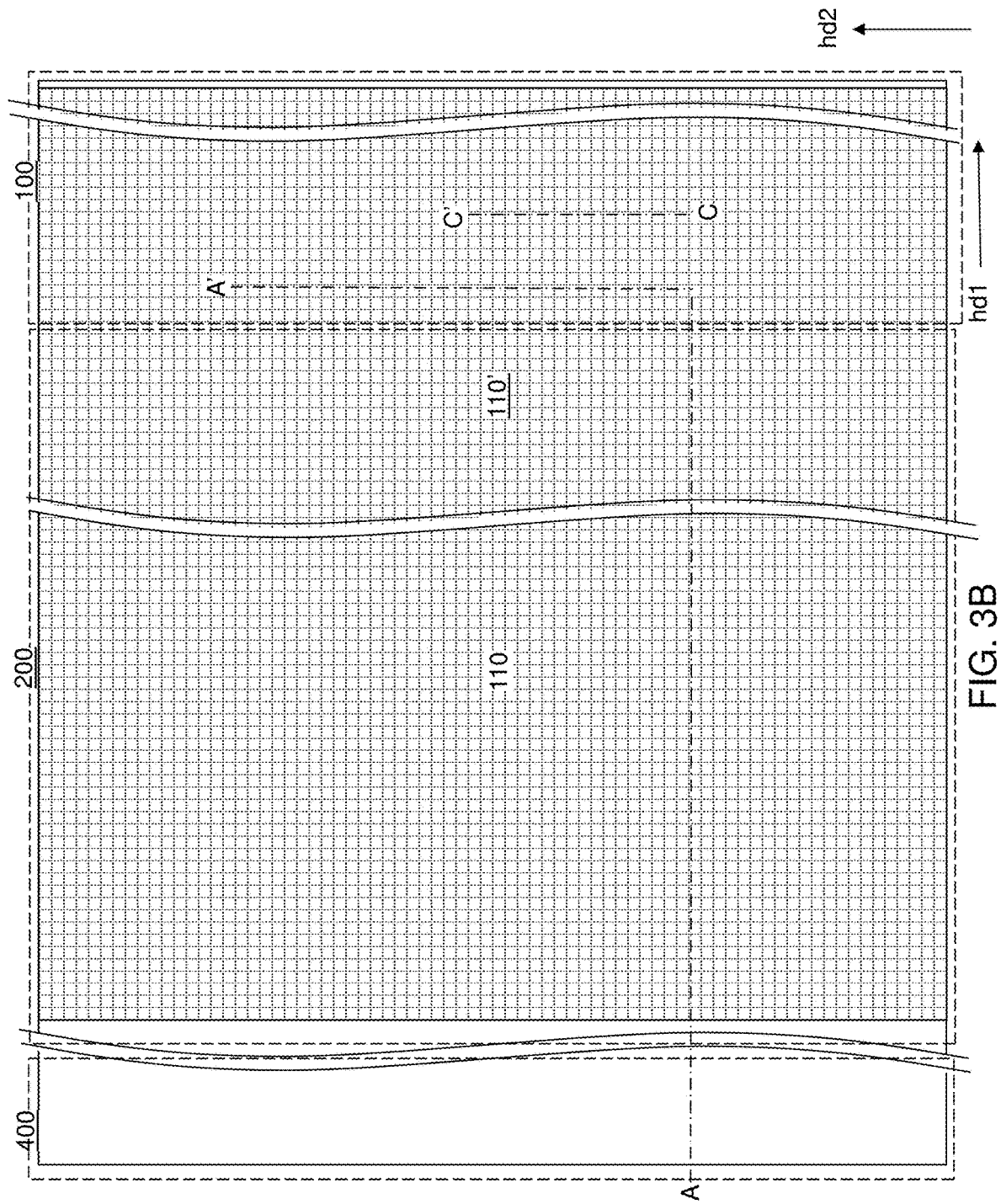

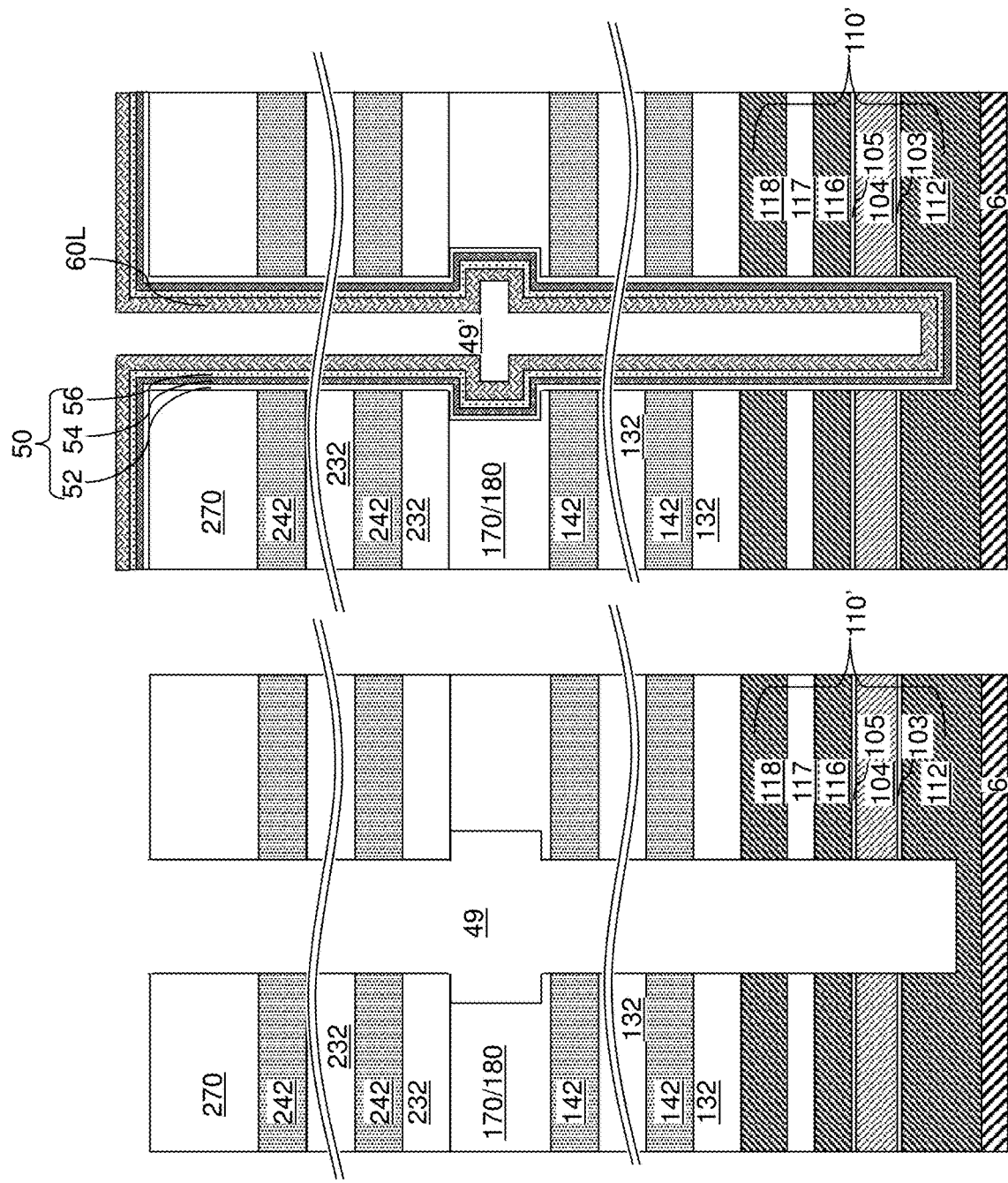

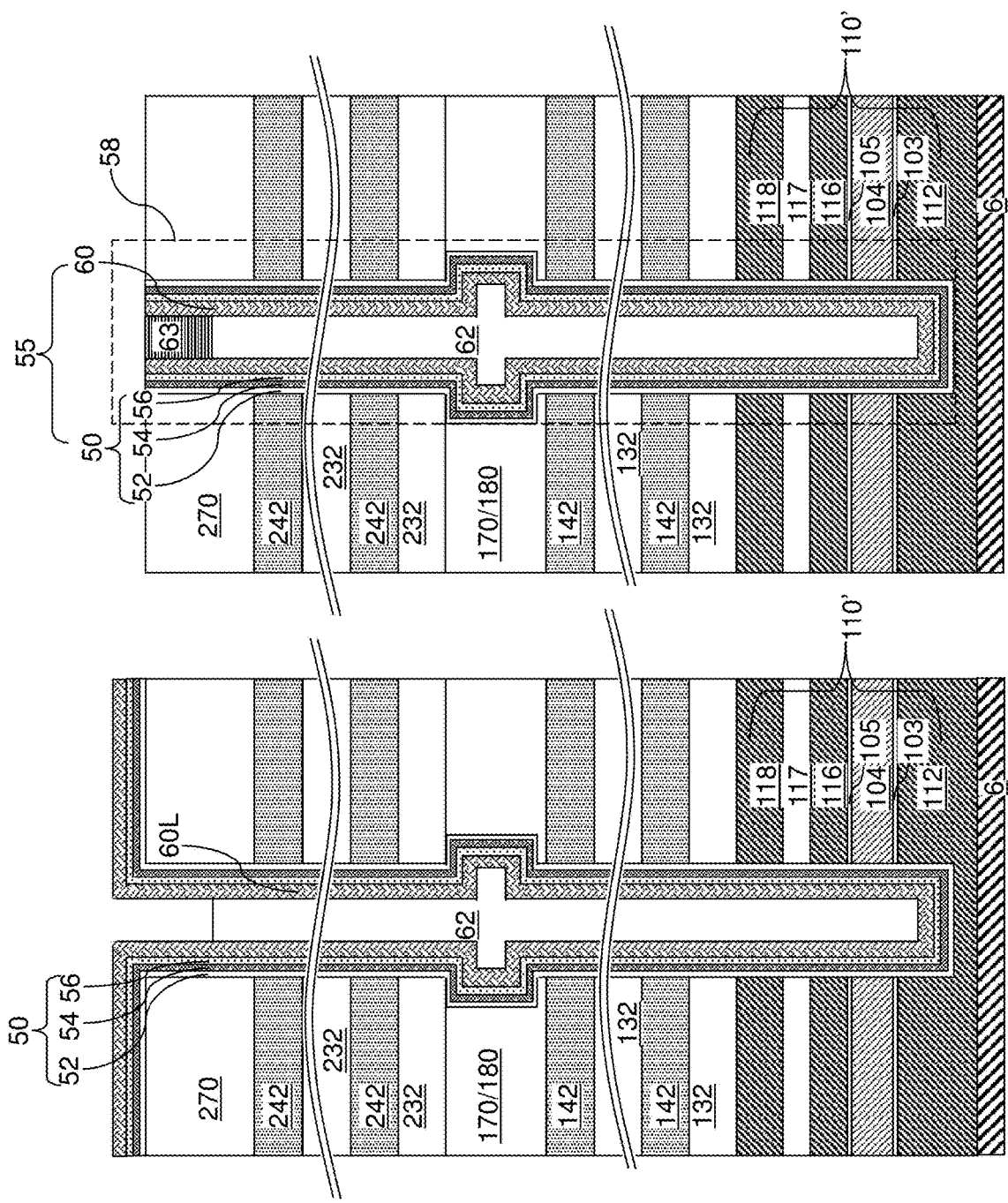

US 11,925,027 B2

THREE-DIMENSIONAL MEMORY DEVICE INCLUDING SENSE AMPLIFIERS HAVING A COMMON WIDTH AND SEPARATION

FIELD

The present disclosure relates generally to the field of semiconductor devices, and particularly to a three-dimensional memory device including sense amplifiers having a common width and separation, and methods for forming the same.

BACKGROUND

Sense amplifiers are a key part of a column circuit in memory chip. Each bit line is connected to a respective sense amplifier, and vice versa.

SUMMARY

According to an aspect of the present disclosure, a semiconductor structure includes a memory array including first and second bit lines and a sense amplifier circuit. The sense amplifier circuit includes a first sense amplifier array containing first active sense amplifier transistors that each have an active region having a first width, where the first active sense amplifier transistors are electrically connected to the first bit lines, and a second sense amplifier array including second active sense amplifier transistors that each have the active region having the first width, where the second active sense amplifier transistors are electrically connected to the second bit lines, and dummy active regions which are electrically inactive located between columns of the second active sense amplifier transistors.

BRIEF DESCRIPTION OF THE DRAWINGS

FIG. 1B is a magnified top down view of a region of one active unit cell in the circuit of FIG. 1A from a horizontal plane B-B' in FIGS. 1C and 1D.

FIGS. 1C and 1D are vertical cross-sectional vies of the active unit cell of FIG. 1B along the vertical planes C-C' and D-D', respectively.

FIG. 1G is a top down view from a horizontal plane B-B' in FIGS. 1C and 1D of a region within a N1×M rectangular periodic sense amplifier array A1 of first sense amplifiers in the first exemplary sense amplifier circuit of FIG. 1F.

FIG. 1H is a top down view from a horizontal plane B-B' in FIGS. 1C and 1D magnified view of a region within a N2×M rectangular sense amplifier array A2 of second sense amplifiers in the first exemplary sense amplifier circuit of FIG. 1F.

FIG. 2B is a top down view from a horizontal plane B-B' in FIGS. 1C and 1D of the second exemplary sense amplifier circuit of FIG. 2A.

FIG. 2C is a top down view from a horizontal plane B-B' in FIGS. 1C and 1D of a region within a N1×M rectangular periodic sense amplifier array A1 of first sense amplifiers in the second exemplary sense amplifier circuit of FIG. 2A.

FIG. 3B is a vertical cross-sectional view of the exemplary semiconductor structure along the vertical plane B-B' of FIG. 1A.

FIGS. 10A-10D illustrate sequential vertical cross-sectional views of a memory opening during formation of a memory opening fill structure according to an embodiment of the present disclosure.

12A. The hinged vertical plane A-A' corresponds to the plane of the vertical cross-sectional view of FIG. 12A.

Figure 13:
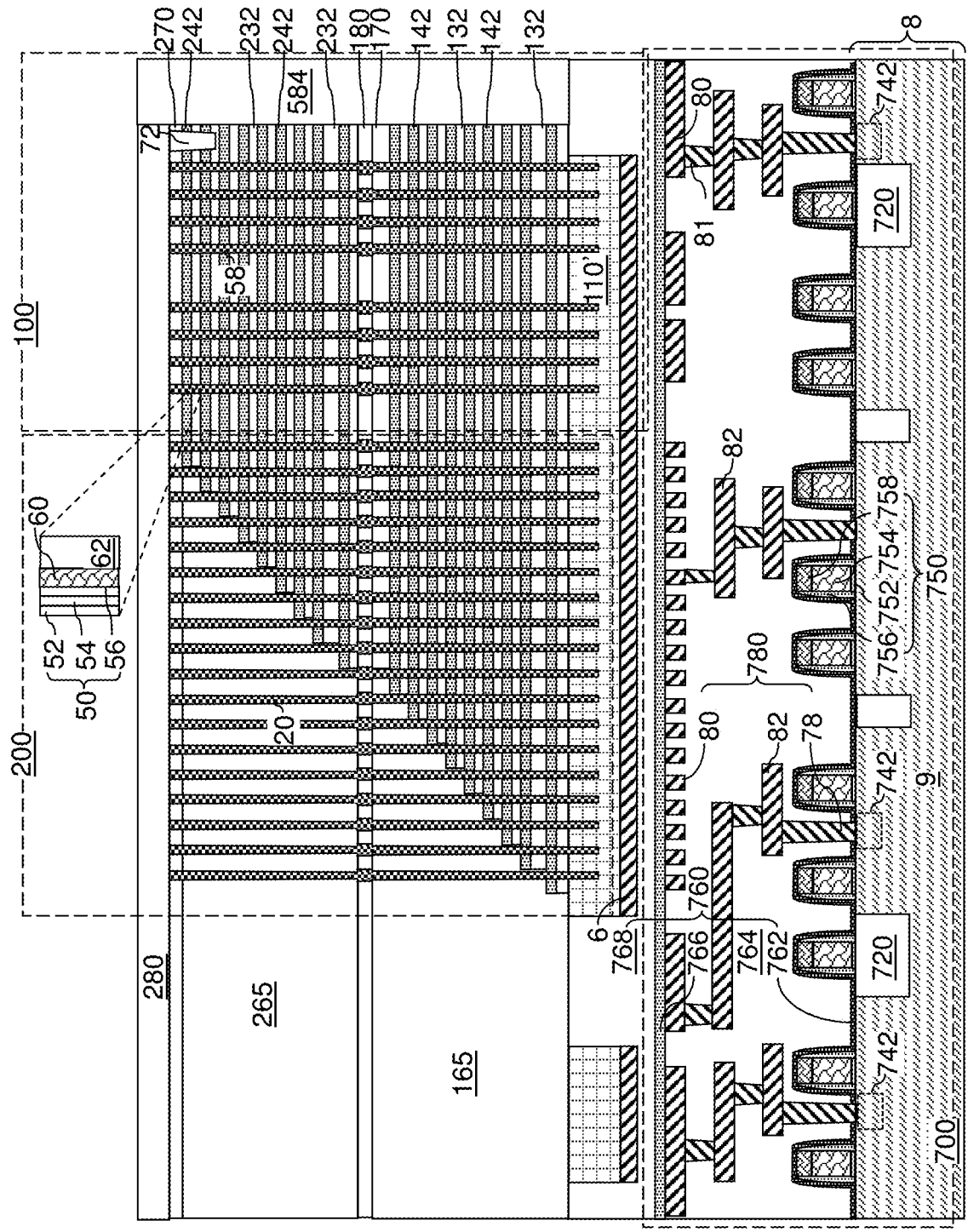

FIG. 13 is a vertical cross-sectional view of the exemplary structure after formation of dielectric pillar structures according to an embodiment of the present disclosure.

Figure 14A:
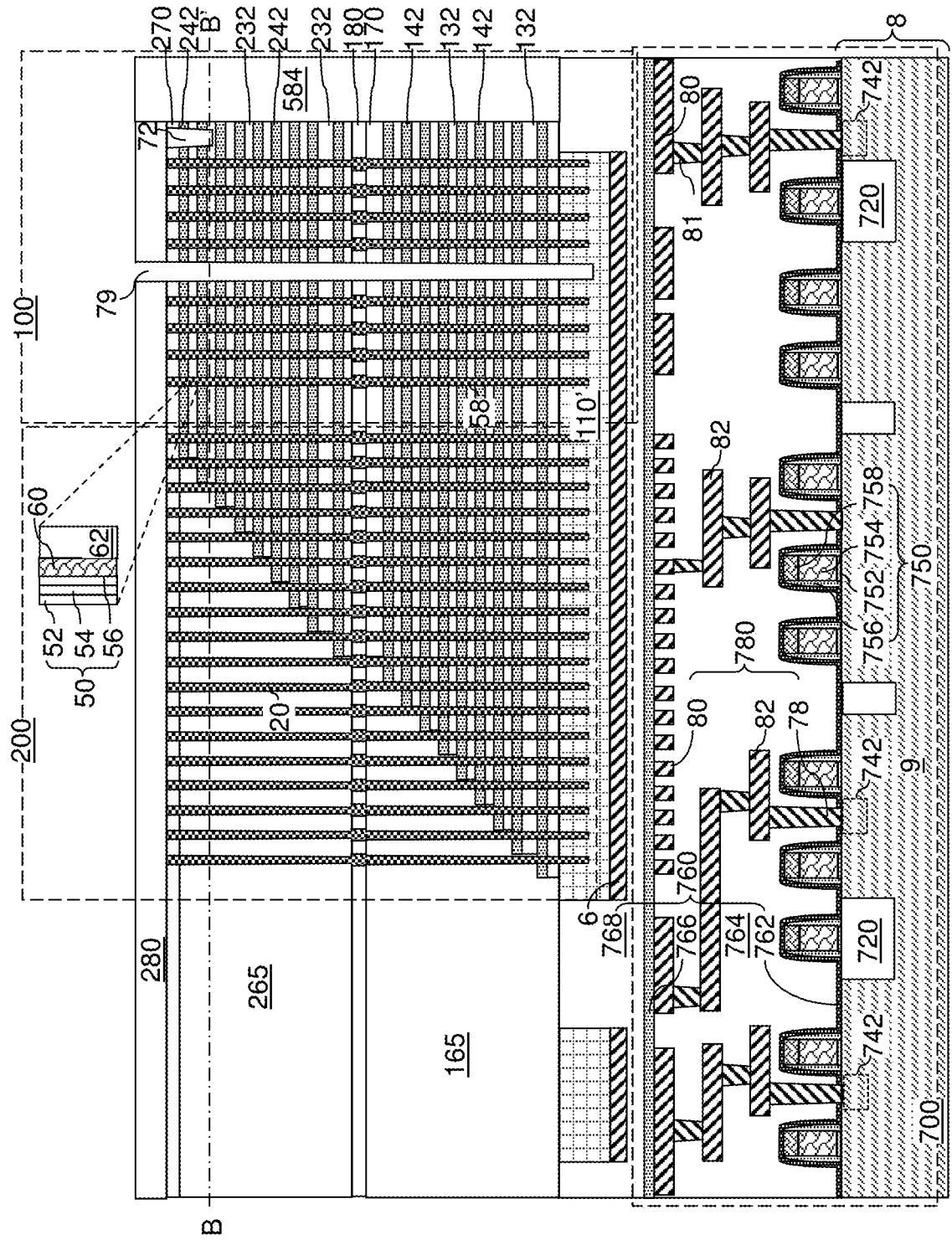

FIG. 14A is a vertical cross-sectional view of the exemplary structure after formation of a first contact-level dielectric layer and backside trenches according to an embodiment of the present disclosure.

Figure 14B:
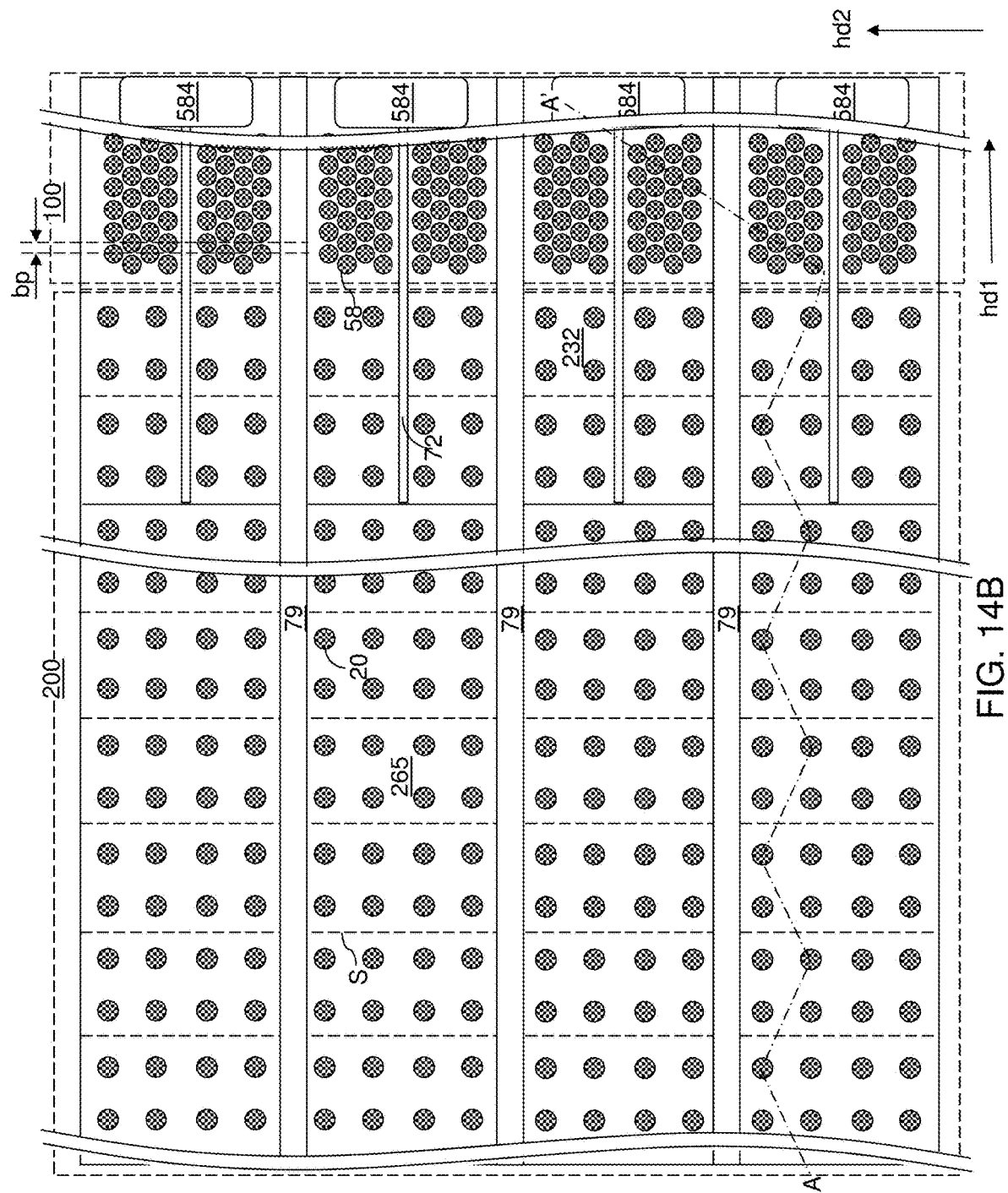

FIG. 14B is a horizontal cross-sectional view of the exemplary structure along the horizontal plane B-B' of FIG. 14A. The hinged vertical plane A-A' corresponds to the plane of the vertical cross-sectional view of FIG. 14A.

Figure 15:
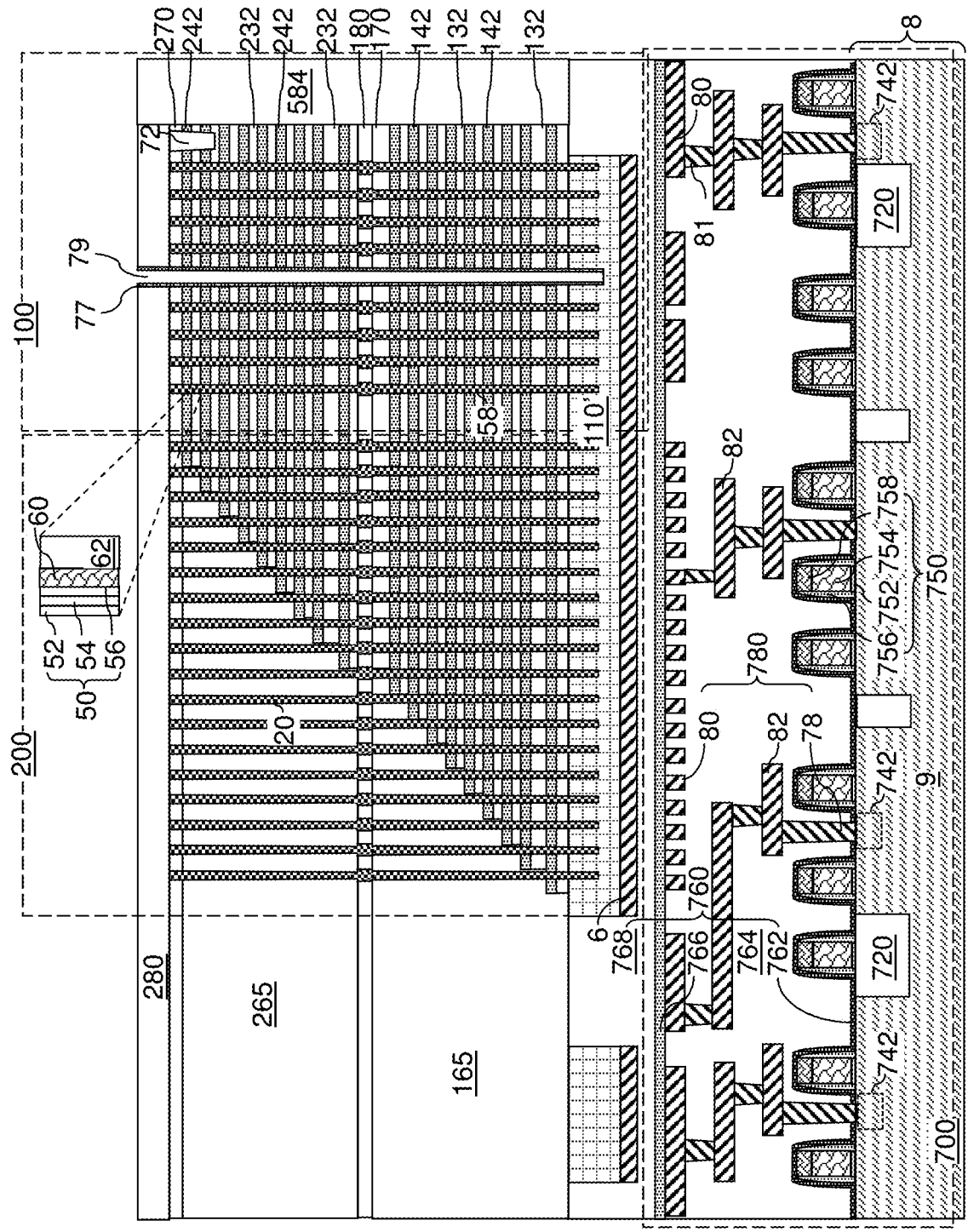

FIG. 15 is a vertical cross-sectional view of the exemplary structure after formation of backside trench spacers according to an embodiment of the present disclosure.

FIGS. 16A-16E illustrate sequential vertical cross-sectional views of memory opening fill structures and a backside trench during formation of source-level material layers according to an embodiment of the present disclosure.

Figure 17:
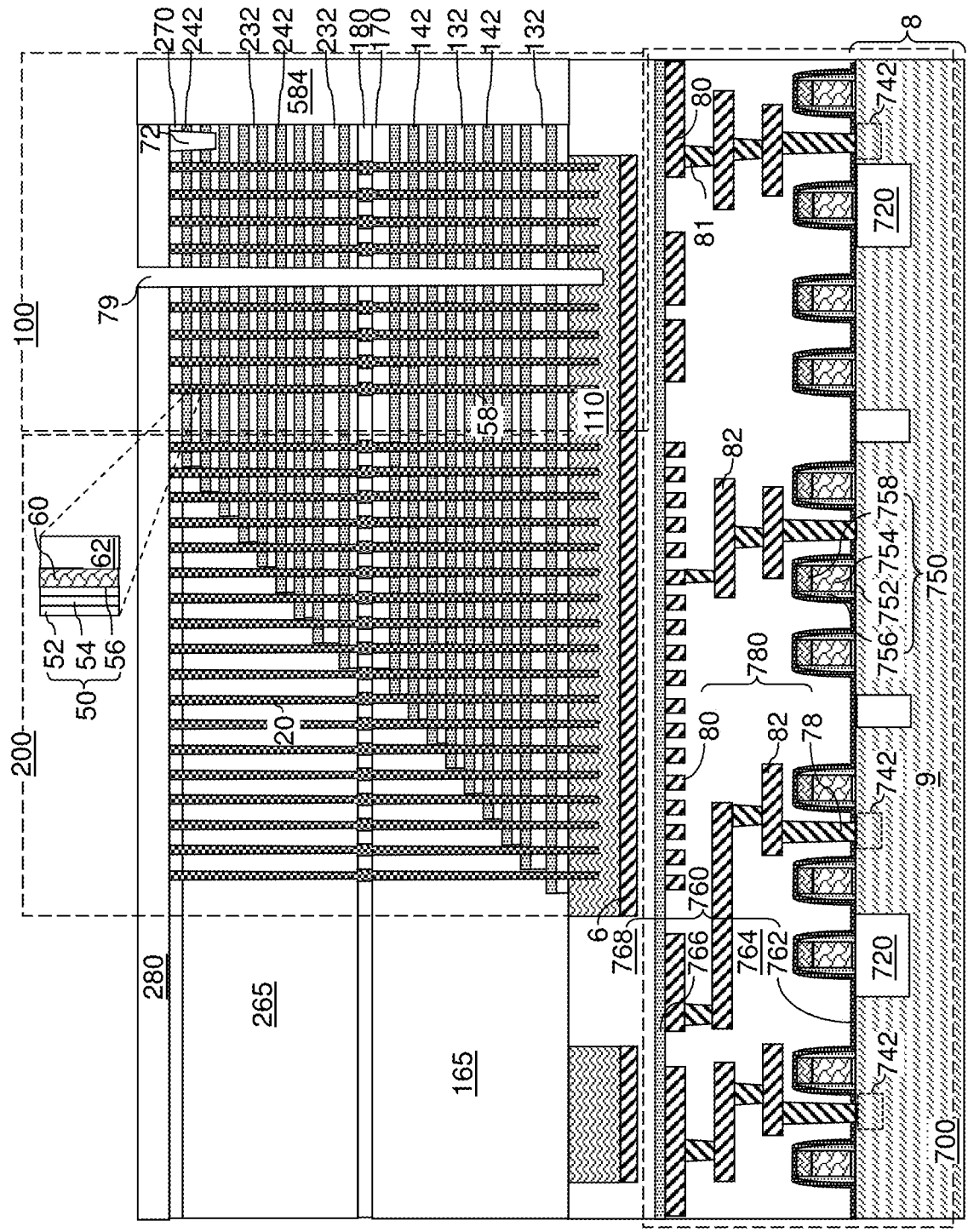

FIG. 17 is a vertical cross-sectional view of the exemplary structure after formation of source-level material layers according to an embodiment of the present disclosure.

Figure 18:
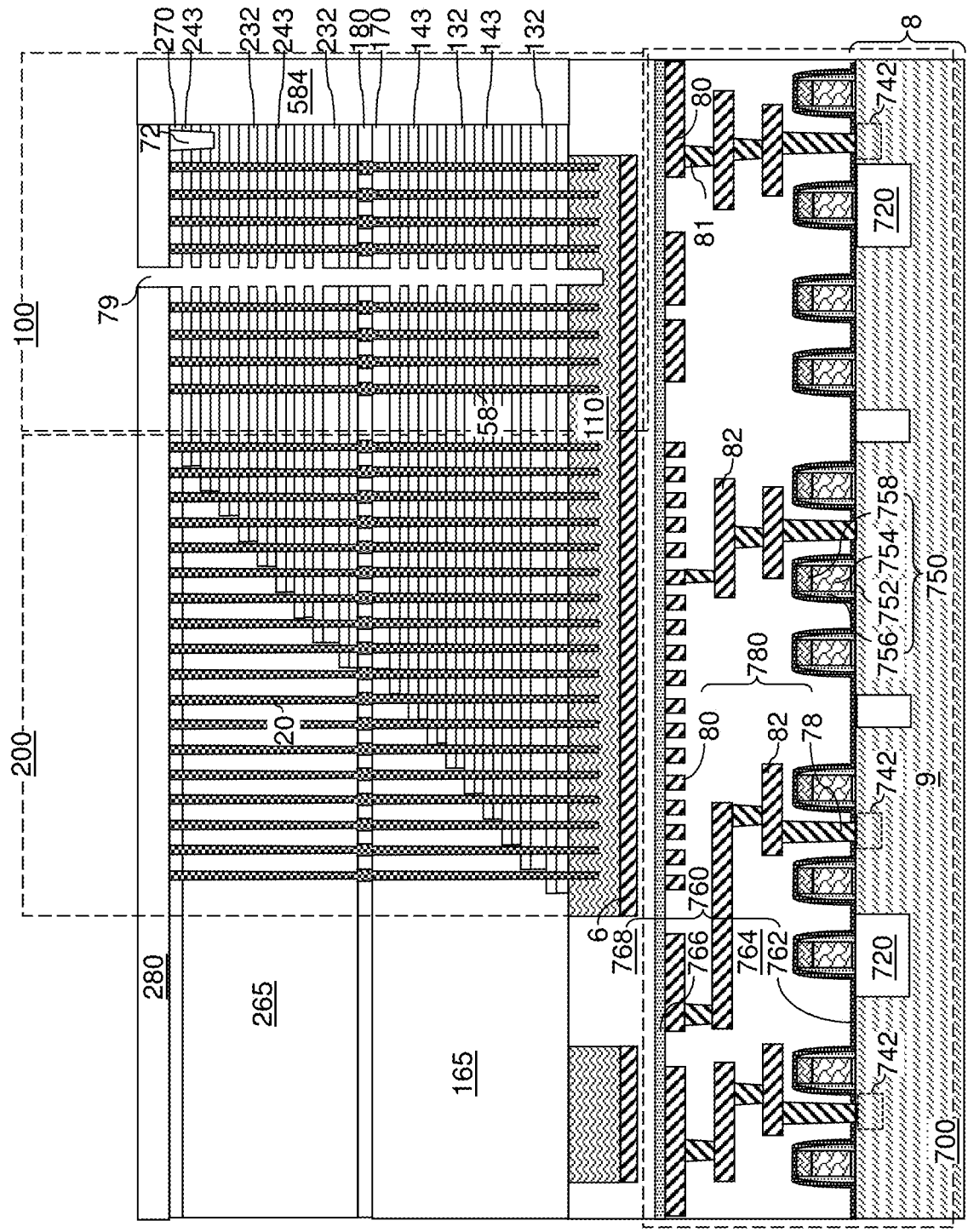

FIG. 18 is a vertical cross-sectional view of the exemplary structure after formation of backside recesses according to an embodiment of the present disclosure.

Figure 19A:
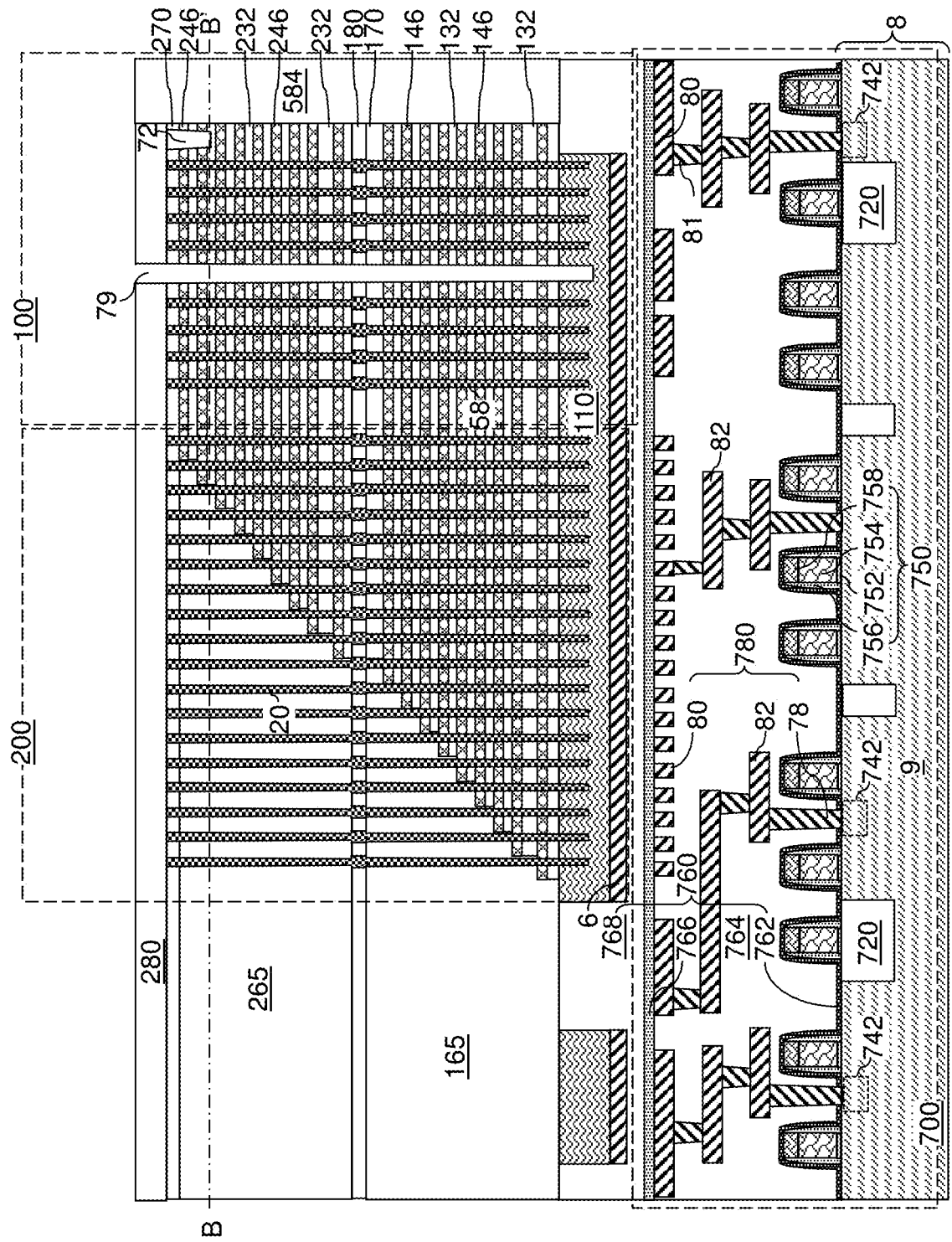

FIG. 19A is a vertical cross-sectional view of the exemplary structure after formation of electrically conductive layers according to an embodiment of the present disclosure.

Figure 19B:
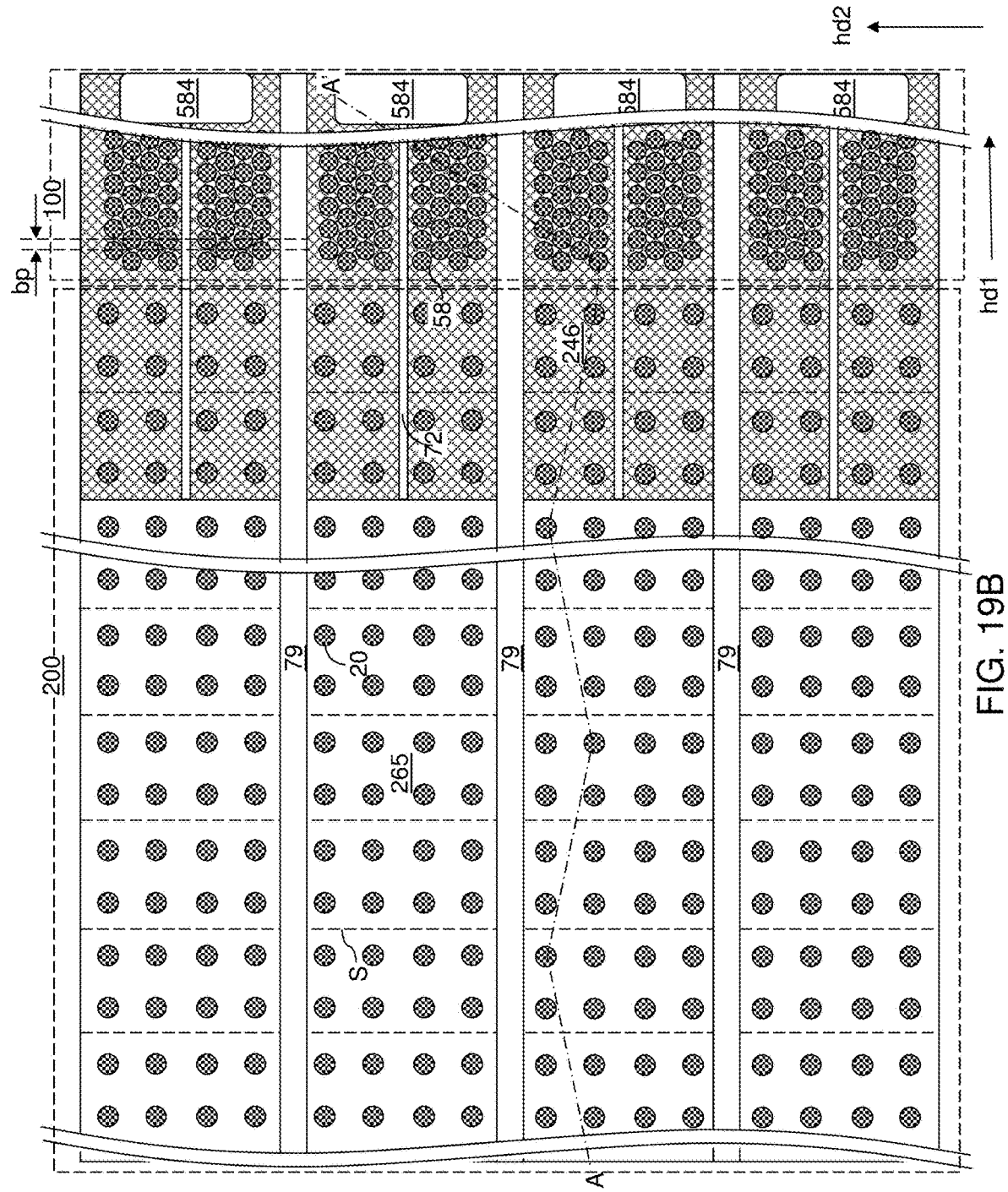

FIG. 19B is a horizontal cross-sectional view of the exemplary structure along the horizontal plane B-B' of FIG. 19A. The hinged vertical plane A-A' corresponds to the plane of the vertical cross-sectional view of FIG. 19A.

Figure 20A:
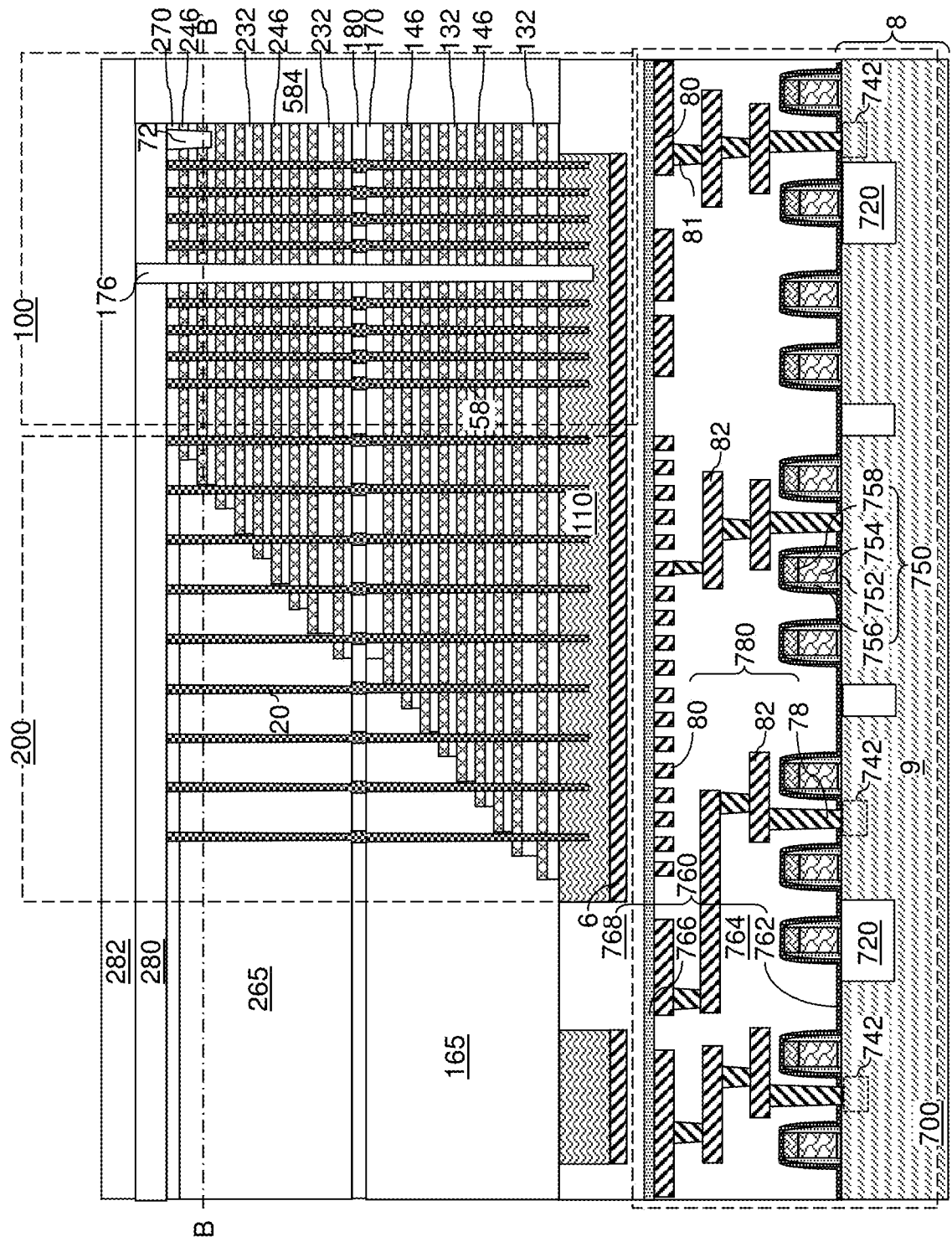

FIG. 20A is a vertical cross-sectional view of the exemplary structure after formation of backside trench fill structures in the backside trenches according to an embodiment of the present disclosure.

Figure 20B:
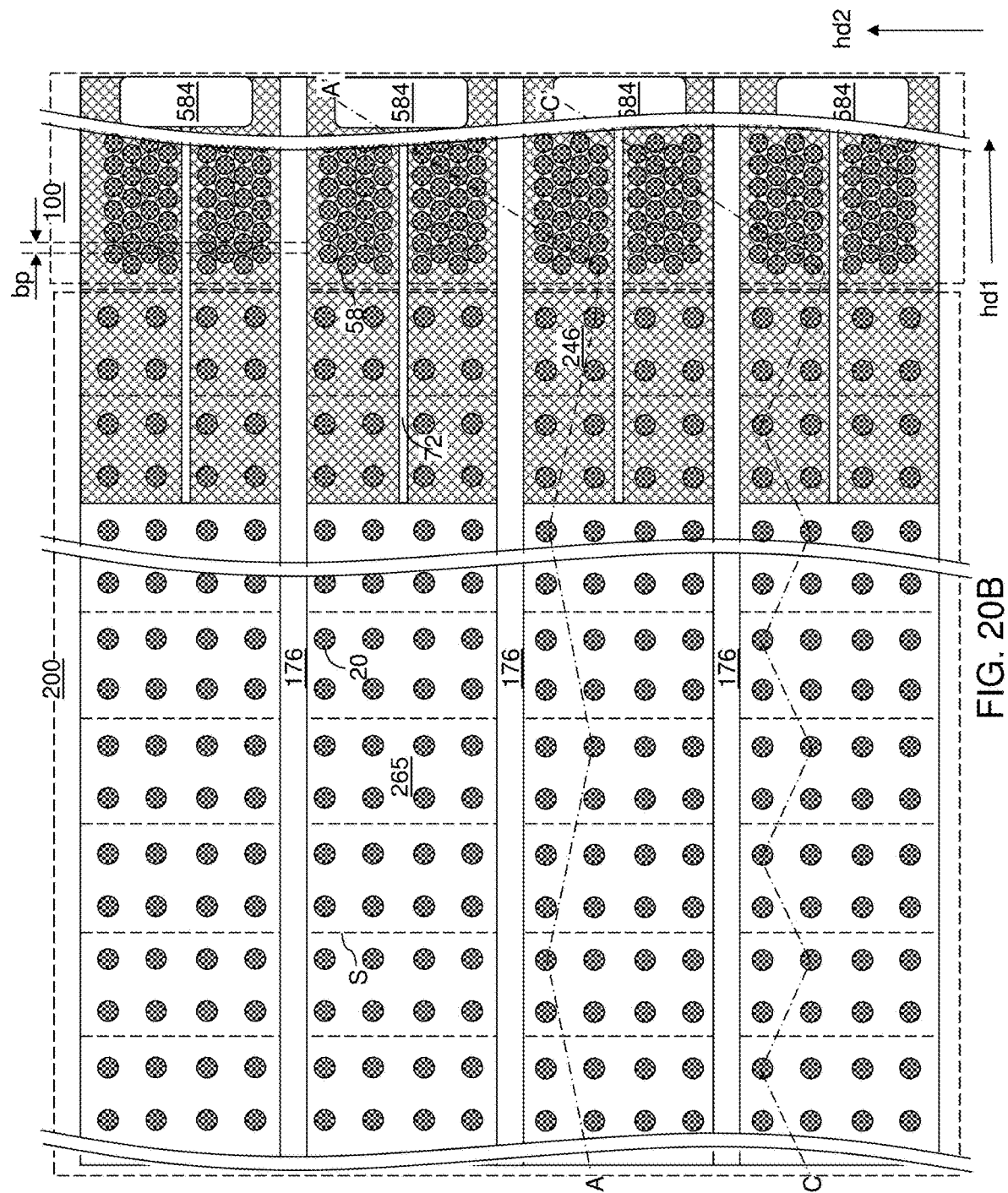

FIG. 20B is a horizontal cross-sectional view of the exemplary structure along the horizontal plane B-B' of FIG. 20A. The hinged vertical plane A-A' corresponds to the plane of the vertical cross-sectional view of FIG. 20A.

Figure 20C:
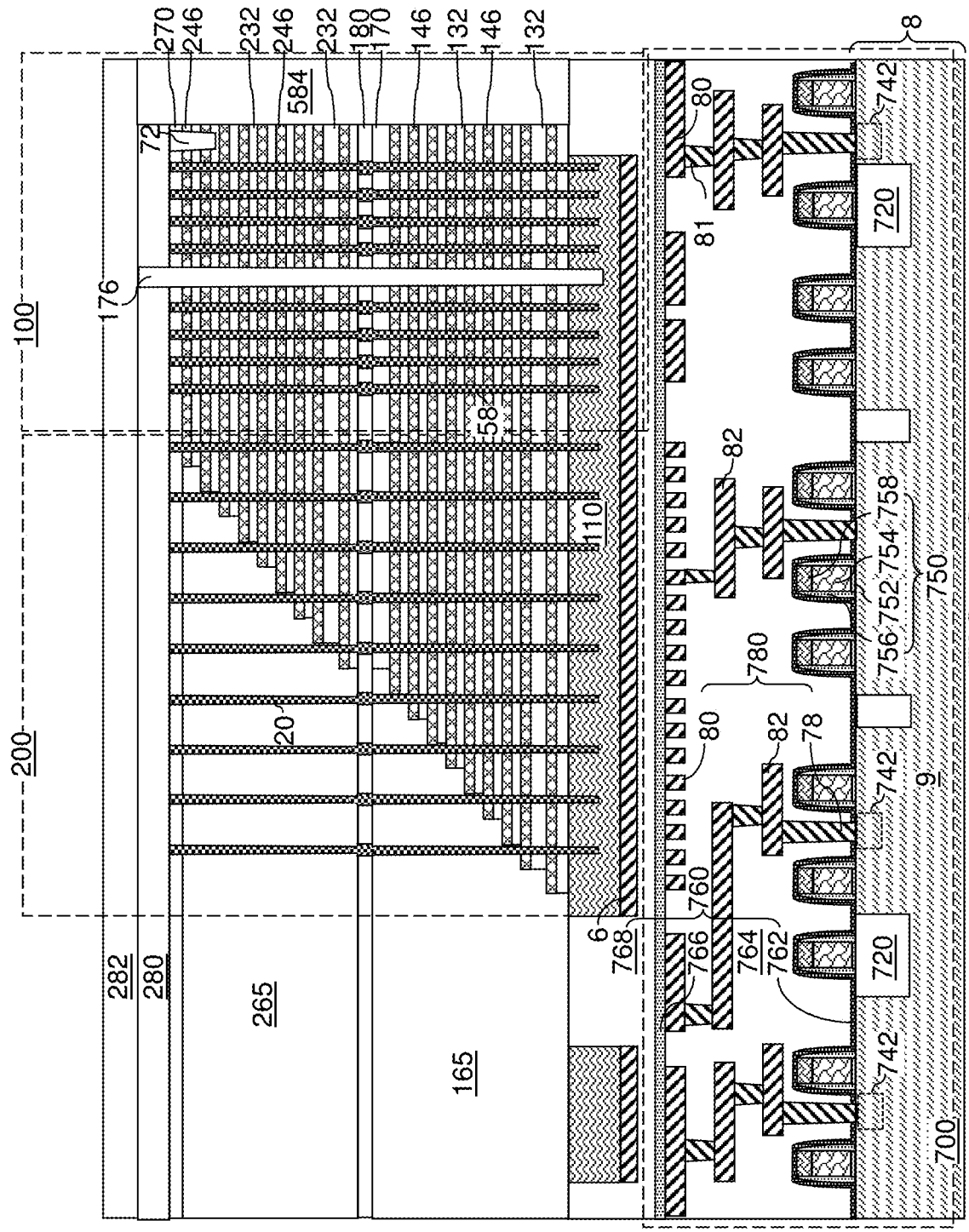

FIG. 20C is a vertical cross-sectional view of the exemplary structure along the vertical plane C-C' of FIG. 20B.

Figure 21A:
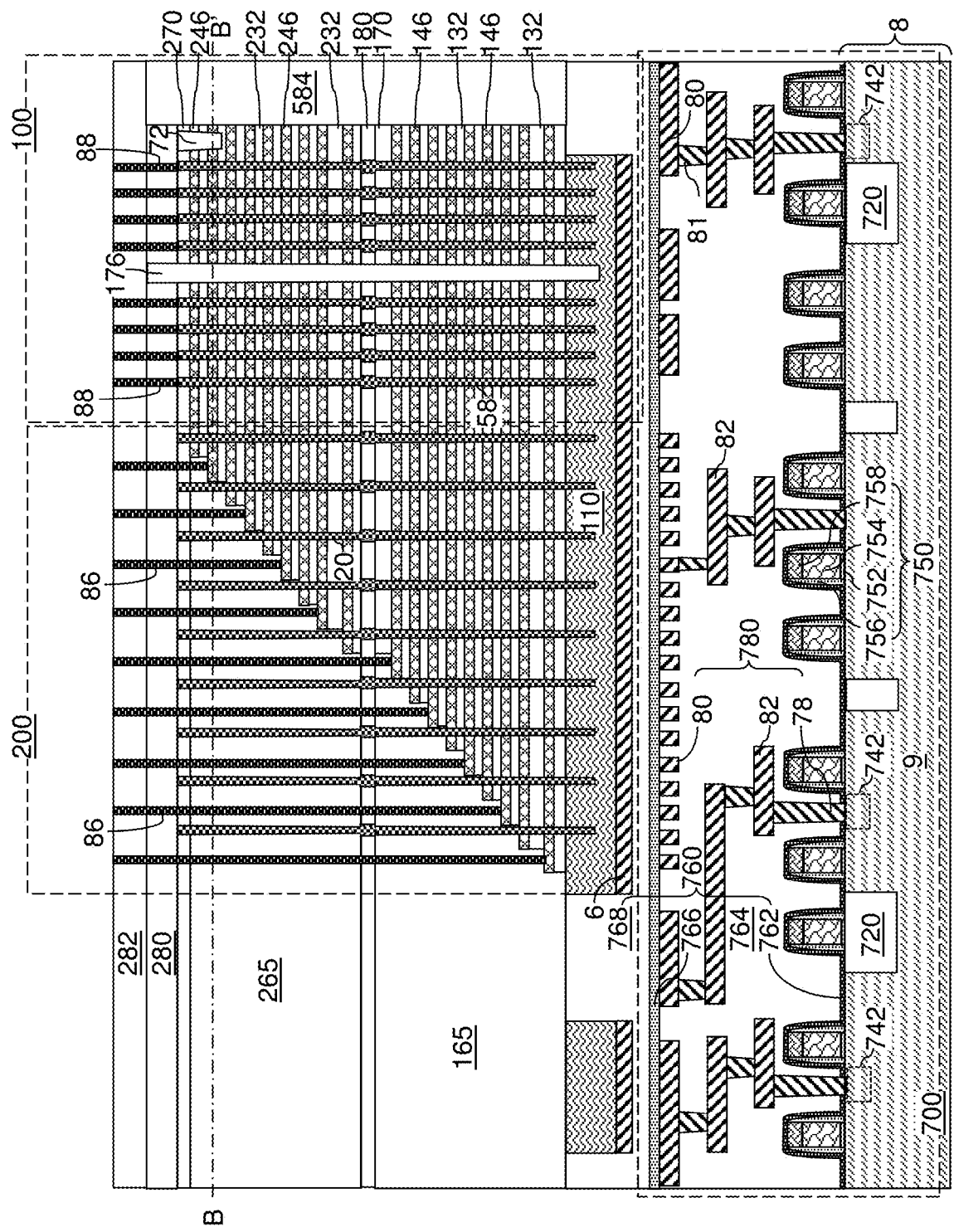

FIG. 21A is a vertical cross-sectional view of the exemplary structure after formation of a second contact-level dielectric layer and various contact via structures according to an embodiment of the present disclosure.

Figure 21B:
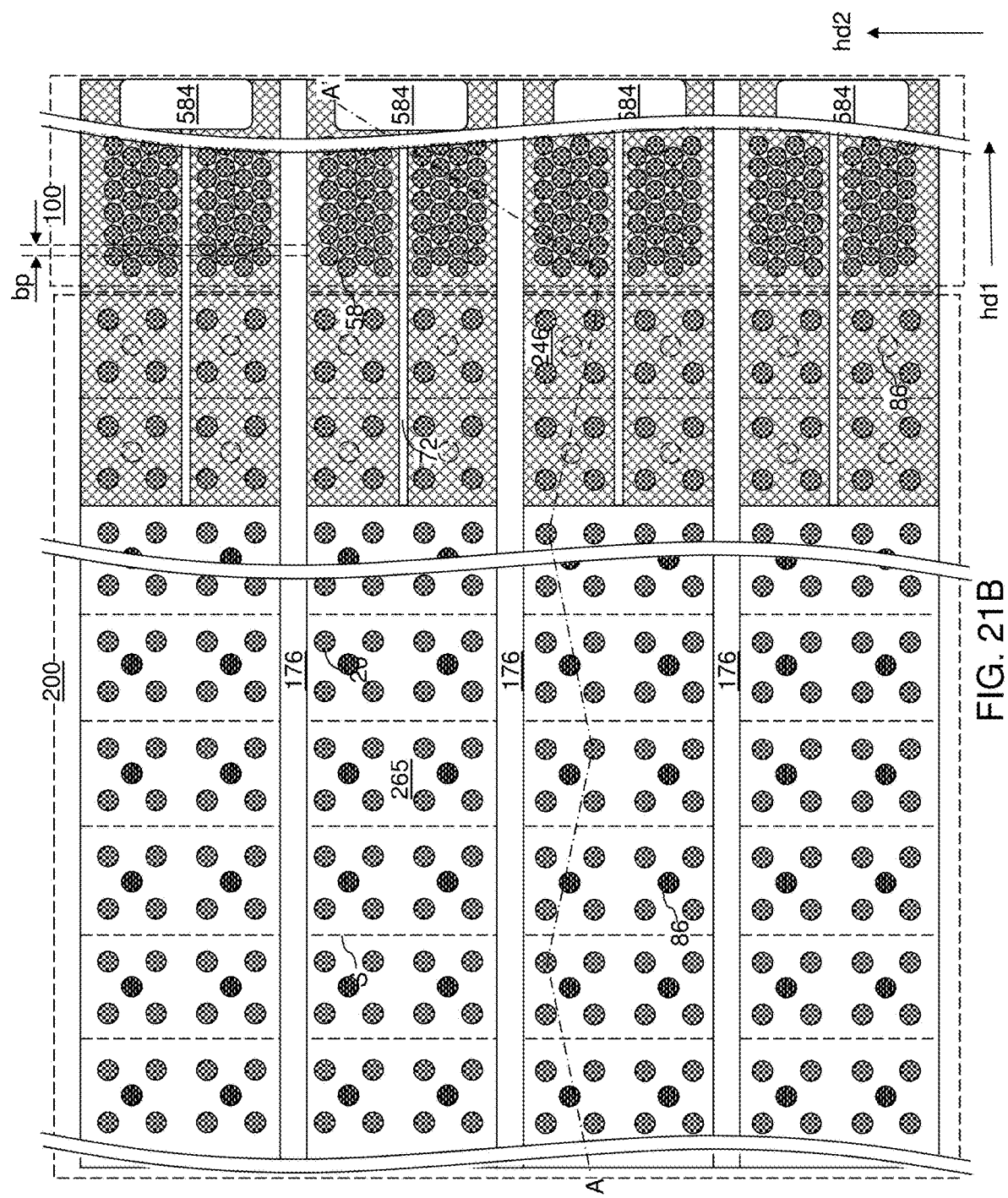

FIG. 21B is a horizontal cross-sectional view of the exemplary structure along the vertical plane B-B' of FIG. 21A. The hinged vertical plane A-A' corresponds to the plane of the vertical cross-sectional view of FIG. 21A.

Figure 22:
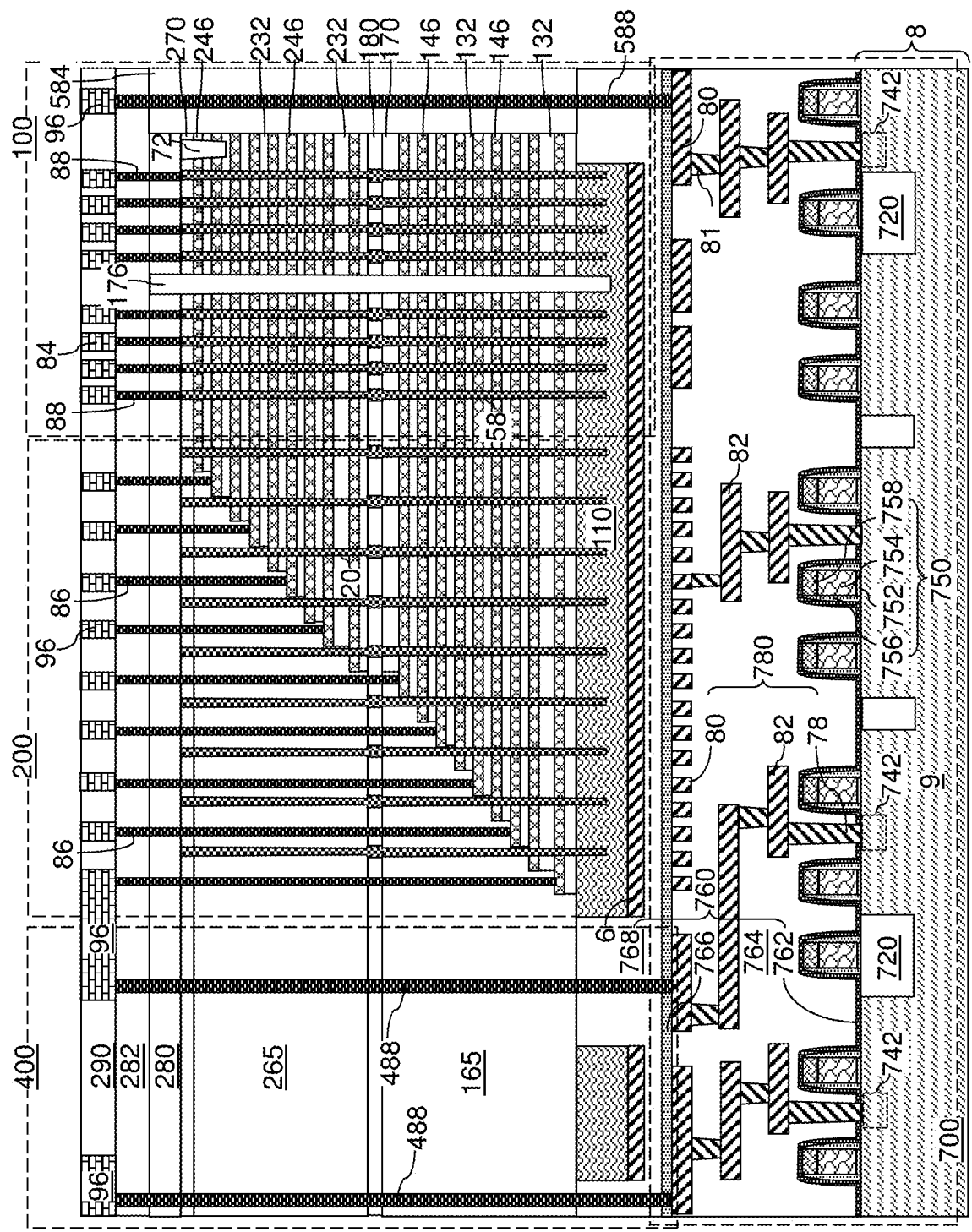

FIG. 22 is a vertical cross-sectional view of the exemplary structure after formation of through-memory-level via structures and upper metal line structures according to an embodiment of the present disclosure.

Figure 23:
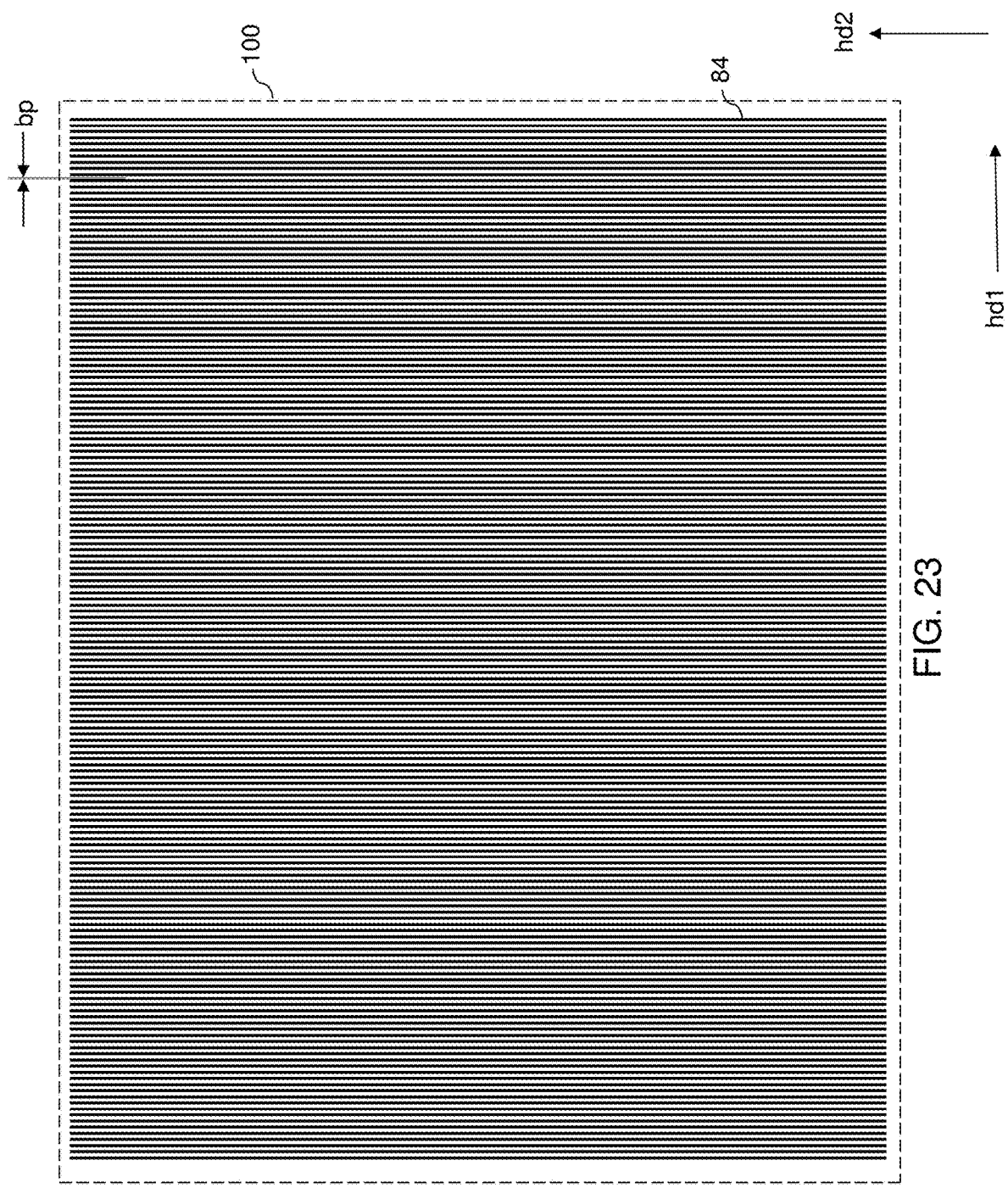

FIG. 23 is a top-down view of the exemplary structure after formation of bit lines according to an embodiment of the present disclosure.

Figure 24:
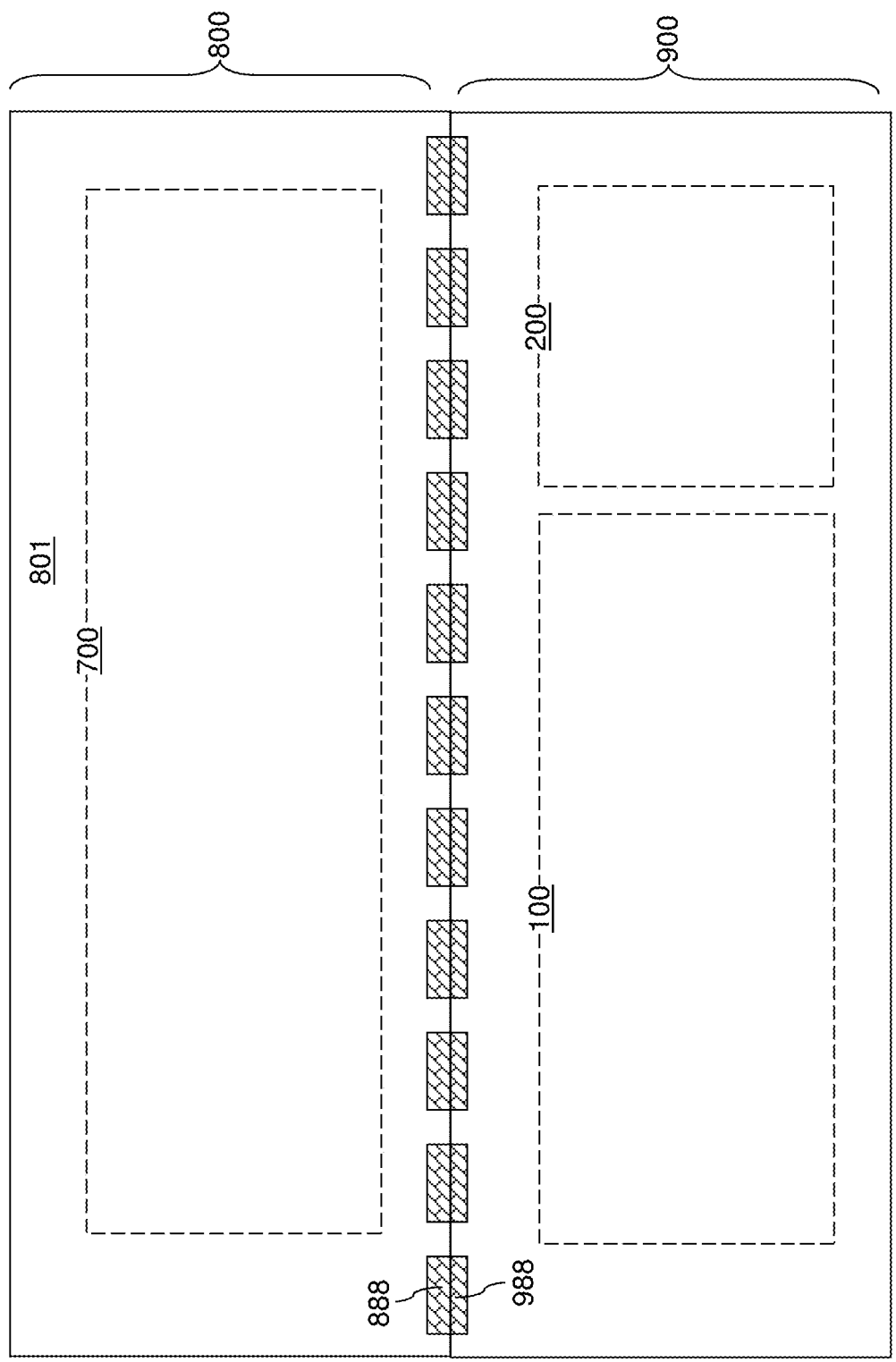

FIG. 24 is a vertical cross-sectional view of an alternative exemplary structure including a bonded assembly of a memory die and a logic die according to an embodiment of the present disclosure.

DETAILED DESCRIPTION

As discussed above, the present disclosure is directed to a three-dimensional memory device including sense amplifiers having a common width and separation and methods for forming the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Generally, a memory array can employ sense amplifiers that are electrically connected to bit lines to determine the state of each memory cell, i.e., to determine whether a specific memory cell encodes "0" or "1." The sense amplifiers may function differently in different circuit components, and generally include a field effect transistor and a set of metal lines providing electrical connection to each electrical node of the field effect transistor. Portions of the metal lines extending in the same direction (e.g., in the source to drain direction of the transistors) in regions overlying the field effect transistors of the sense amplifiers are referred to herein as metal tracks.

According to an aspect of the present disclosure, the sense amplifiers may have different functions in different circuit operating areas. Accordingly, the number of local metal tracks for wiring a sense amplifier may be different between different sense amplifier arrays employed for different functions. Such different functions may include sense operations, data latch operations, and column redundancy operations. For example, there may be four metal tracks overlying the sense amplifier transistors which perform column redundancy operations, while there may be three metal tracks overlying the sense amplifier transistors which perform sense or data latch operations. Thus, the sense amplifier transistors which perform the column redundancy operation require either a larger width (e.g., in the direction perpendicular to the source to drain direction) and/or larger spacing between transistors than the other sense amplifier transistors to accommodate the additional overlying metal track. However, variations in width and/or spacing of field effect transistors in a sense amplifier circuit can induce performance degradation due to variations in the electrical characteristics of the field effect transistors. Further, variations in metal routing for field effect transistors of the sense amplifier circuit can introduce additional variations in the electrical characteristics of the sense amplifiers. Therefore, in the prior art, the sense amplifier transistors which perform the sense or data latch operations may be formed with a larger width and/or spacing than necessary to match the larger width and/or spacing of the sense amplifier transistors which perform the column redundancy operation. However, since the sense amplifier transistors which perform the column redundancy operation comprise a minority of all sense amplifier transistors, the increase in width and/or spacing of the remaining majority of the sense amplifier transistors undesirably increases the chip area of the sense amplifier circuit, which increases the cost of the memory device.

Figure 1A:
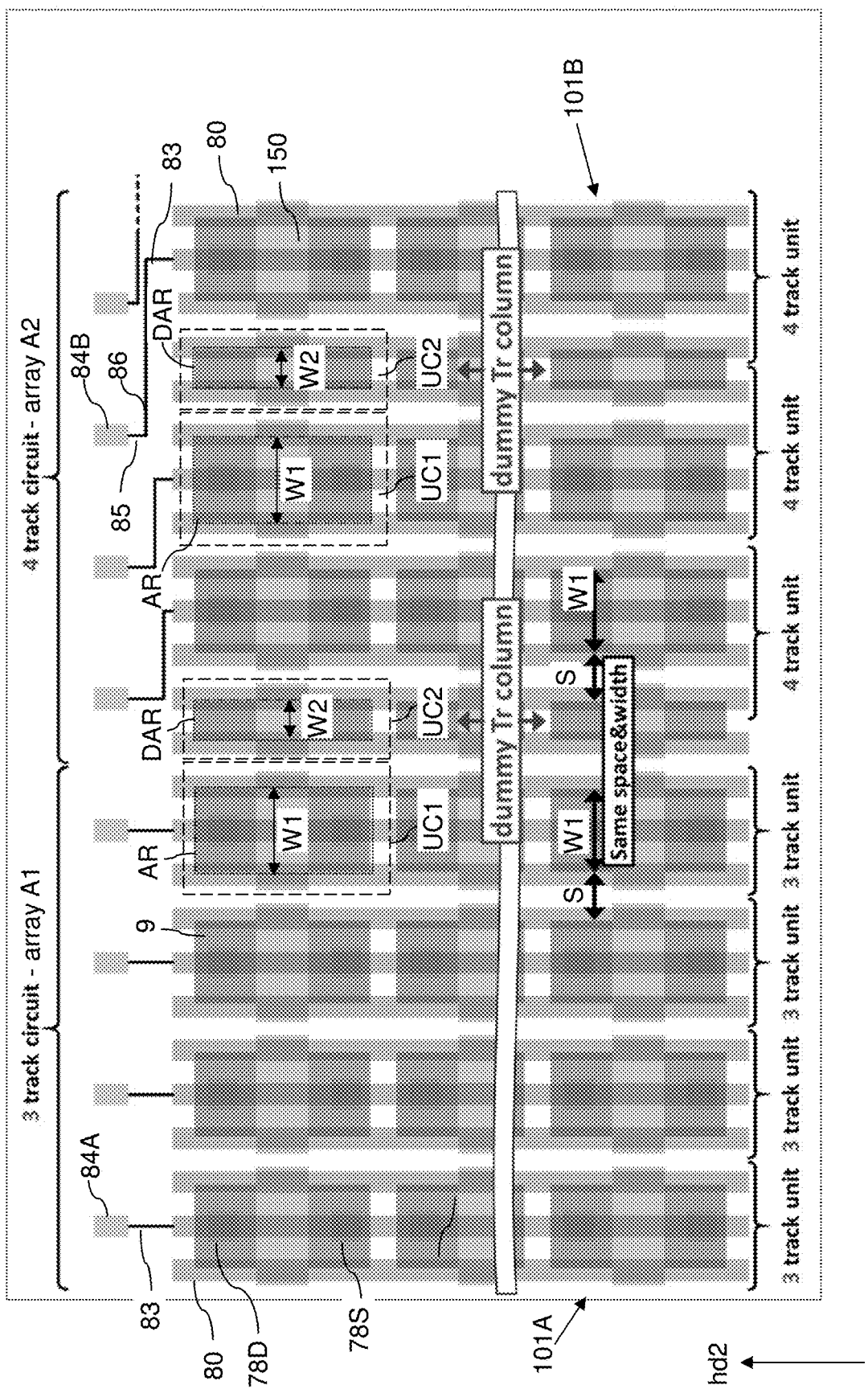
FIG. 1A is a plan view of a first exemplary sense amplifier circuit according to a first embodiment of the present disclosure.

As shown in FIG. 1A, the structures and methods of the embodiments of the present disclosure provide identical layout (e.g., width and spacing) for field effect transistors and metal interconnect structures in each sense amplifier active unit cell UC1 (containing an active sense amplifier transistor active region AR) irrespective of the variations in the number of metal tracks 80 overlying the sense amplifier unit cell UC1. Specifically, dummy unit cells UC2 containing dummy active regions DAR (e.g., at least portions of dummy transistors) are inserted between the active transistors in the higher density metal track areas (e.g., between the sense amplifier transistors which perform the column redundancy operation in array A2), and are omitted in lower density metal track areas (e.g., between the sense amplifier transistors which perform the sense or data latch operations in array A1). For example, array A1 may comprise a three track 80 circuit portion and array A2 may comprise a four track 80 circuit. A column of dummy unit cells UC2 (e.g., a column of dummy active regions or entire dummy transistors) is inserted between columns of active unit cells UC1 in array A2 but not in array A1. Thus, the minimum width and spacing of all of the active sense amplifier transistors is selected to equal to the width and spacing of the active sense amplifier transistors in the low metal track areas, such as the minimum width and spacing of the transistors which perform the sense and data latch operations. Thus, dummy active regions DAR are inserted as needed between the active transistors in the higher density track areas (e.g., in array A2), such that the locations of all active transistors are in registry with the periodic pattern of the metal tracks 80. Thus, each active region AR of the active transistors of the sense amplifiers within the entire sense amplifier circuit (e.g., in arrays A1 and A2) may have an identical layout (i.e., identical width and spacing) irrespective of the function performed by the transistor, without increasing the width and spacing of all transistors to meet the higher density metal track area space requirement. Furthermore, since the higher density metal track areas comprise the minority of the total area of the sense amplifier circuit, the addition of the dummy active regions DAR in such higher density metal track areas (e.g., in array A2) does not significantly increase the total area of the sense amplifier circuit.

Figure 1E:
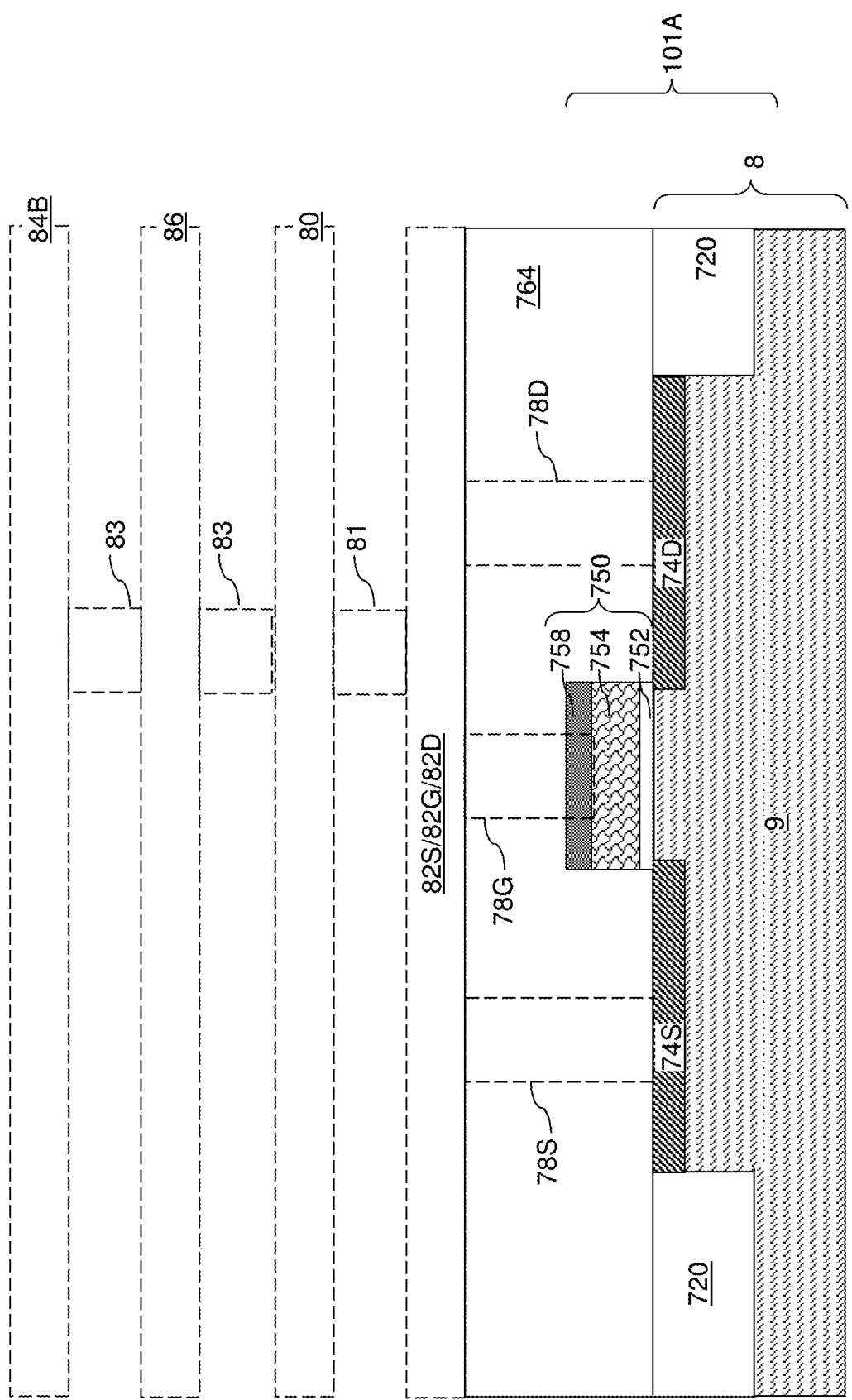
FIG. 1E is an enlarged schematic side view of the unit cell of FIG. 1C.
Figure 1F:
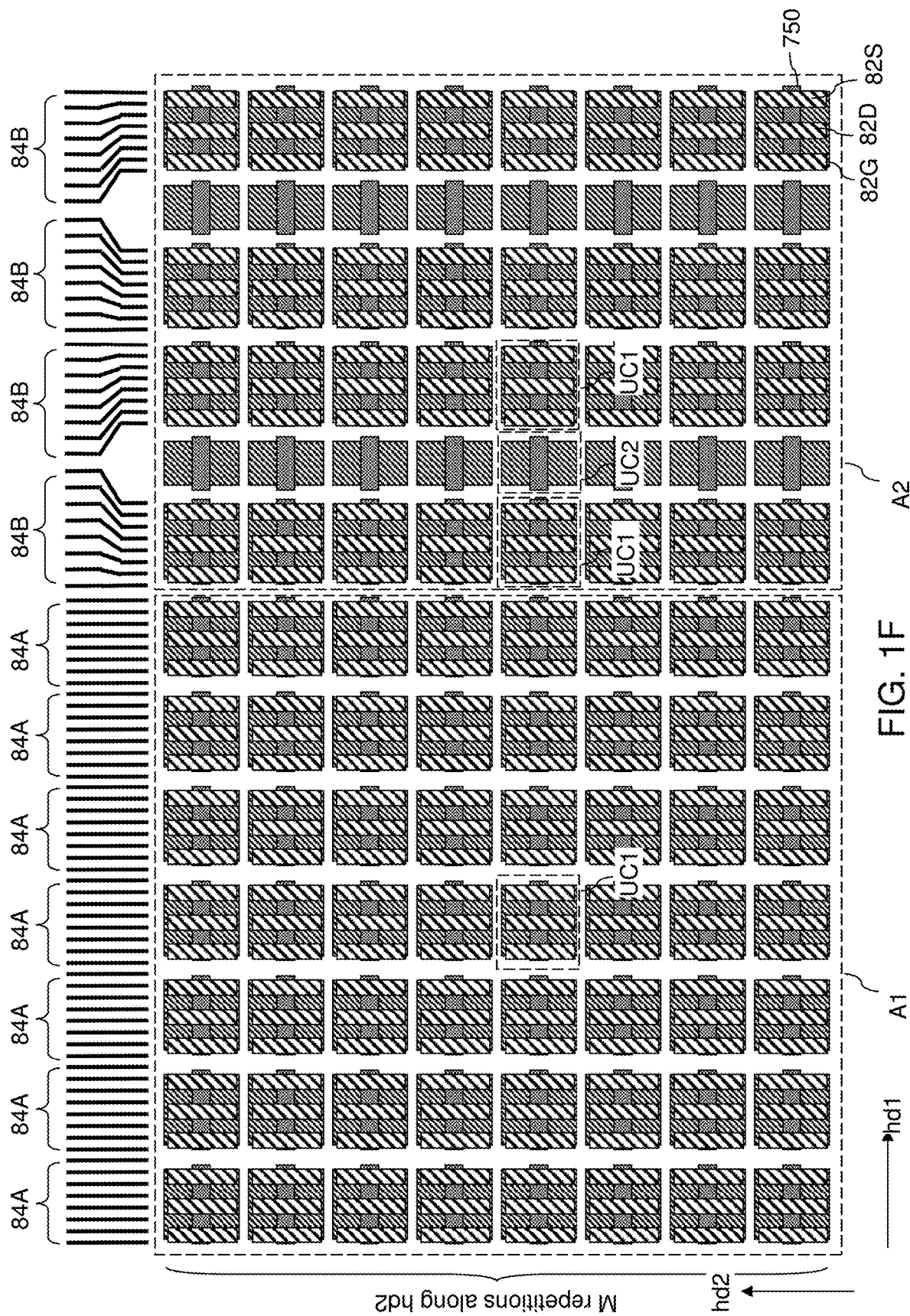
FIG. 1F is a top down view from a horizontal plane B-B' in FIGS. 1C and 1D of the first exemplary sense amplifier circuit of FIG. 1A.

Referring to FIGS. 1A-1H, a first exemplary sense amplifier circuit according to an embodiment of the present disclosure is illustrated. This circuit includes a N1×M rectangular periodic sense amplifier array A1 of first sense amplifier transistors 101A (e.g., sense amplifiers which perform sense or data latch operations) and an N2×M rectangular sense amplifier array A2 of second sense amplifier transistors 101B (e.g., sense amplifiers which perform the column redundancy operation), as shown in FIGS. 1A and 1F. In one embodiment, the sense amplifiers may be formed on a semiconductor substrate 8 including a substrate semiconductor layer 9, which may comprise a doped well in a silicon wafer or an epitaxial silicon layer located over a silicon or silicon-on-insulator substrate. Each of the first sense amplifiers and the second sense amplifiers comprises a respective transistor active region AR, which is a portion of the substrate semiconductor layer 9 that is laterally surrounded by a respective portion of a shallow trench isolation structure 720 including a dielectric fill material, such as silicon oxide, as shown in FIG. 1E.

All active regions AR in arrays A1 and A2 have the same first width W1 in the word line direction hd1. The dummy active region DAR has a second width W2 which is smaller than the first width W1. All active regions AR are spaced apart by the spacing S in the word line direction hd1. The active regions AR are spaced from the adjacent dummy active regions DAR by the same spacing S.

In one embodiment, M is an integer in a range from 2 to 128, which may be in a range from 4 to 64 and/or from 8 to 32. N1 times M may be the total number of bit lines in a primary memory array, i.e., the main memory array of a memory device. For example, N1, may be in a range from $2^{10}$ to $2^{40}$, such as from $2^{20}$ to $2^{36}$, although lesser and greater numbers may also be employed. N2 times M may be the total number of bit lines in an auxiliary device region, which may be a column redundancy memory array region or any other auxiliary memory array region that augments the function of the primary memory array. The ratio of N2 to N1 may be in a range from $2^{-30}$ to $2^{-1}$, such as from $2^{-20}$ to $2^{-6}$, although lesser and greater ratios may also be employed.

According to an aspect of the present disclosure, each active region AR within the N1×M rectangular periodic sense amplifier array A1 of first sense amplifiers and the N2×M rectangular sense amplifier array A2 of second sense amplifiers can have an identical shape, an identical size, and an identical orientation. As shown in FIG. 1E, each active region AR can have a respective source region 74S, a respective drain region 74D, and a respective channel region extending between the respective source region 74S and the respective drain region 74D. A gate stack 750 can be located over each channel region. Each gate stack 750 may comprise a respective gate dielectric 752, a respective gate electrode 754, and a respective gate cap dielectric 758. According to an aspect of the present disclosure, each gate stack 750 within the N1×M rectangular periodic sense amplifier array A1 of first sense amplifiers and the N2×M rectangular sense amplifier array A2 of second sense amplifiers can have an identical shape, an identical size, and an identical orientation.

Each of the sense amplifiers within the N1×M rectangular periodic sense amplifier array A1 and the N2×M rectangular sense amplifier array A2 may comprise a respective set of metal interconnect structures, which may include a source contact via structure 78S, a drain contact via structure 78D, and a gate contact via structure 78G (e.g., source and drain electrodes and a gate contact via). The contact via structures (78S, 78G, 78D) may extend through a contact-level dielectric material layer or layers 764, as shown in FIG. 1E. As shown in FIGS. 1B-1E, the respective set of metal interconnect structures may comprise first line-level metal interconnect structures 82, which may include a first source-connection metal line 82S, a first drain-connection metal line 82D, and a first gate-connection metal line 82G. The first source-connection metal line 82S may contact a top surface of the source contact via structure 78S. The first drain-connection metal line 82D may contact a top surface of the drain contact via structure 78D. The first gate-connection metal line 82G may contact a top surface of the gate contact via structure 78G.

The respective set of metal interconnect structures may comprise additional metal via structures such one or more levels of first via-level metal interconnect structures (e.g., first metal via structures 81) which electrically connect the first line-level metal interconnect structures 82 with the metal tracks 80, second via-level metal interconnect structures (e.g., second metal via structures 83) and third via-level metal interconnect structures (e.g., third metal via structures 85), etc. The second metal via structures 83 may electrically connect the metal tracks 80 in array A1 to first bit lines 84A, or electrically connected the metal tracks 80 in array A2 to crossed bit lines 86. The crossed bit lines 86 may extend in a direction which is non-parallel (e.g., perpendicular) to second bit lines 84B which extend in the bit line direction hd2. For example, the crossed bit line 86 may extend in the word line direction hd1. The third metal via structures 85 electrically connect the crossed bit lines 86 to the second bit lines 84B.

Bit lines 84A and 84B may be located above the level of the metal interconnect structures that provide electrical wiring for the sense amplifier circuit. The bit lines (84A, 84B) may, or may not, have an areal overlap with the sense amplifier circuit. The bit lines (84A, 84B) extend parallel to each other in the bit line direction hd2 over the memory array, as will be described in more detail below.

As shown in FIGS. 1G and 1H, each active unit cell UC1 may have the same first width W3 in the word line direction hd1. The metal track 80 pitch may equal to a fraction of the width W3, such as one third of W3. In the first embodiment, each dummy unit cell UC2 may have a smaller second width W4 in the word line direction hd1 than the first width W3. The first line-level metal interconnect structures 82 may be omitted over the dummy active regions DAR or may be presented over the dummy active regions DAR. However, the first line-level metal interconnect structures 82 are not electrically connected to the dummy source regions 73S and dummy drain regions 73D in the dummy active regions DAR in the substrate 8.

According to an aspect of the present disclosure, dummy active regions DAR (e.g., dummy active region columns which extend along the bit line direction hd2) are inserted as necessary between active regions AR of the active transistors of the second sense amplifiers within the N2×M rectangular sense amplifier array A2 such that the locations of the active regions AR of each sense amplifier array (A1, A2) is in registry with the periodic pattern of the metal tracks 80. Thus, each active region AR for active transistors of the sense amplifiers within the entire sense amplifier circuit may have an identical layout (e.g., an identical width in the word line direction hd1). Thus, more metal tracks 80 per the number of active unit cells UC1 can fit into the second array A2 due to the presence of the dummy unit cells UC2, than the number of metal tracks 80 per the number of active unit cells UC1 in the first array.

FIGS. 2A-2D illustrate a second exemplary sense amplifier circuit according to a second embodiment of the present disclosure, in which the second width W4 of the dummy unit cells UC2 is the same as the first width W3 of the active unit cells UC1. Furthermore, the width W1 of the active regions AR and the width W2 of the dummy active regions DAR may be the same. In this second embodiment, dummy first line-level metal interconnect structures 82A may be located over the dummy active areas DAR in the dummy unit cells UC2. However, the dummy first line-level metal interconnect structures 82A are not electrically connected to the metal tracks 80 and/or to the dummy source and drain regions (73S, 73D). For example, the source and drain electrodes (78S, 78D) may be omitted in the dummy unit cells UC2. Therefore, the dummy active regions DAR are electrically inactive and do not function as transistors. In this second embodiment, there is no layout variation in whole sense amplifier circuit. Therefore, the active transistor characteristics may be better controlled across the entire circuit during fabrication.

In the second embodiment, the pitch of the first bit lines 84A may be different from the pitch of the second bit lines 84B due to the differences in pitch of three and four metal tracks 80 located over the unit cells in respective arrays A1 and A2. However, different length crossed bit lines 86 are used to connect the unmatched pitch of the second bit lines 84B and the respective active regions AR (i.e., active transistors). Thus, the second bit lines 84B can be electrically connected to any desired active region AR of the active transistors by the crossed bit lines 86 which extend in the word line direction. Furthermore, additional dummy metal tracks 80D may extend over the dummy unit cells UC2.

The various embodiments of the present disclosure provide improvement in the areal efficiency of a sense amplifier circuit without introducing degradations in device characteristic and while minimizing variations in device characteristics.

FIGS. 3A-23 illustrate steps in forming an exemplary structure incorporating the sense amplifier circuit of FIGS. 1A-1H, the sense amplifier circuit of FIGS. 2A-2D, or any of the variations in the sense amplifier circuit of the embodiments present disclosure as described above. It is understood that the sense amplifier circuit of the embodiments of the present disclosure may be employed in memory devices having different configurations than the exemplary structure shown in FIGS. 3A-23.

Figure 3A:
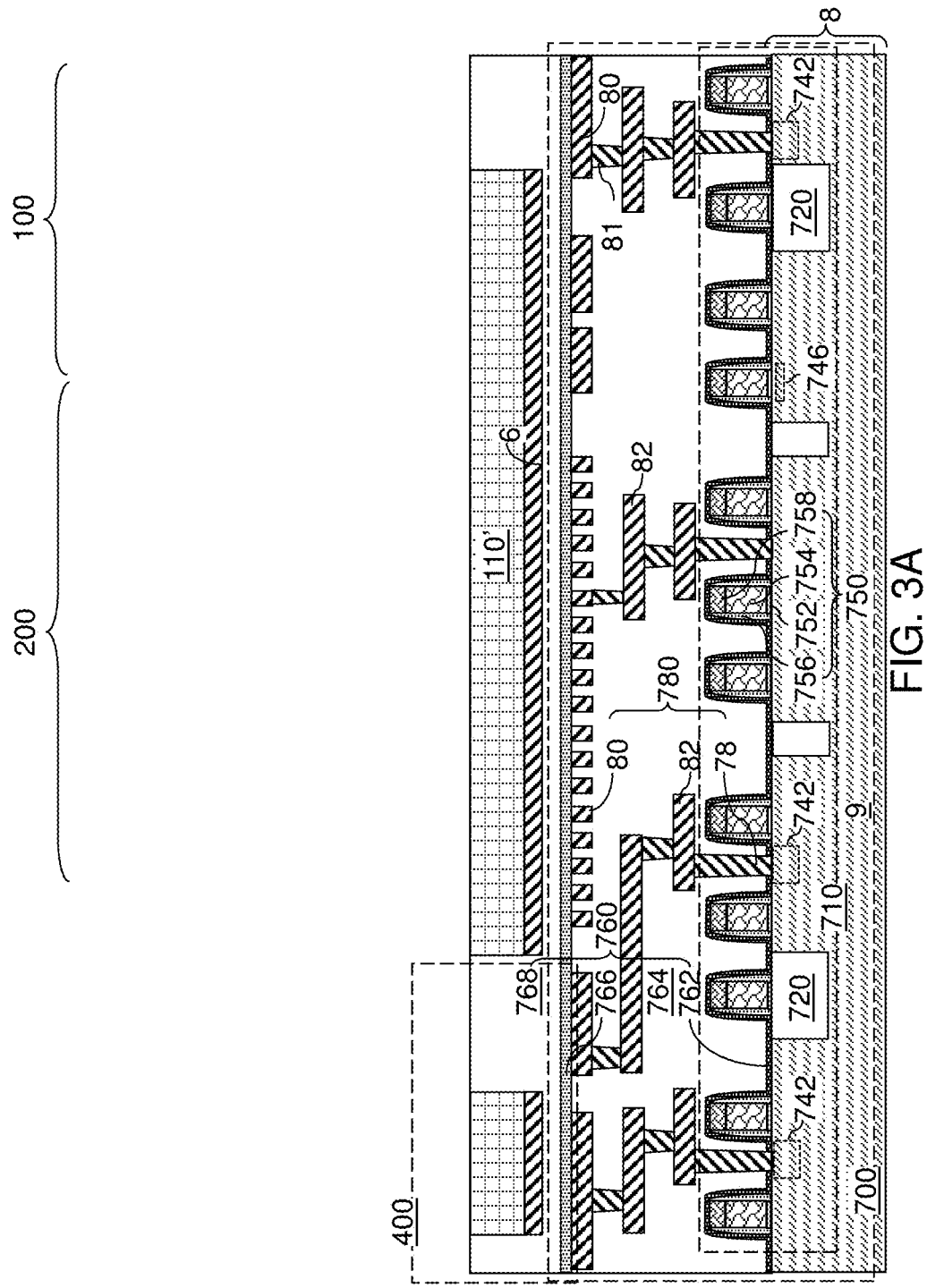
FIG. 3A is a top-down view of a region of an exemplary semiconductor structure after formation of a bit line switch array surrounded by a first-conductivity-type well according to a first embodiment of the present disclosure.
Figure 3C:
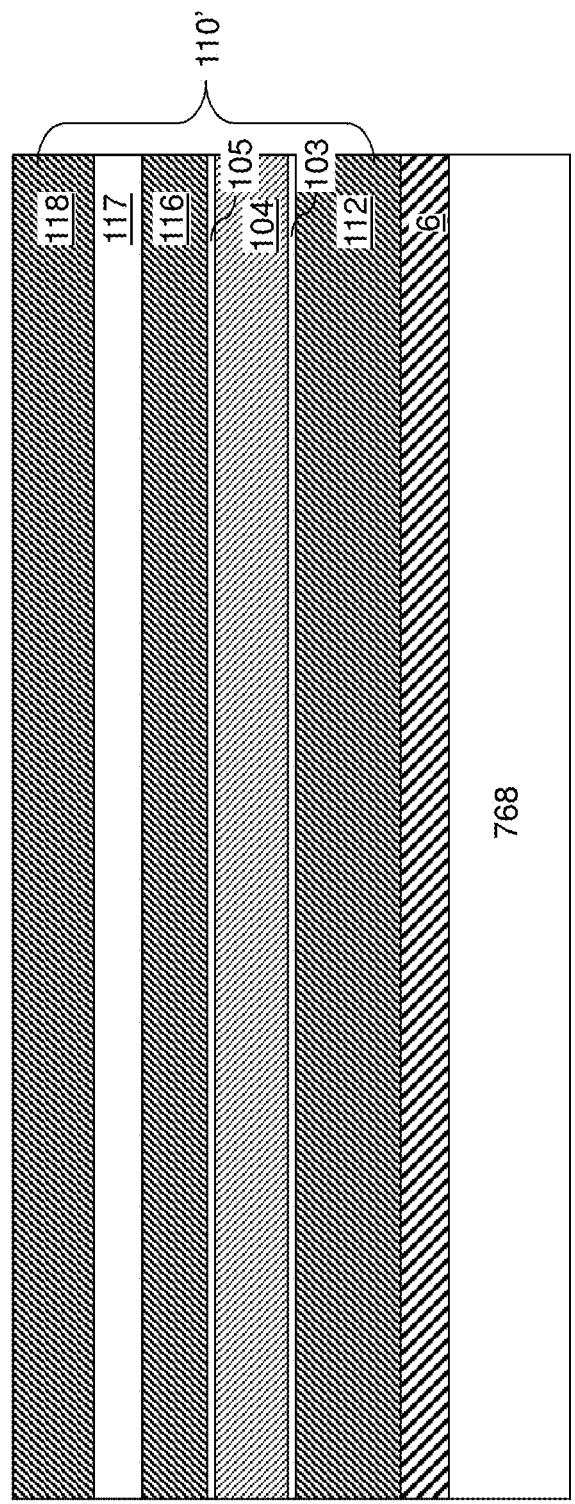
FIG. 3C is a magnified top-down view of a region C of FIG. 3A.

Referring to FIGS. 3A-3C, the exemplary structure is illustrated after formation of additional lower-level dielectric material layers 760 embedding lower-level metal interconnect structures 780. Generally, the shallow trench isolation structures 720 may be formed in an upper portion of the substrate semiconductor layer 9 to provide electrical isolation from other semiconductor devices. The semiconductor devices 710 include the sense amplifier circuit described above, and additional semiconductor devices that may employed to support operation of a three-dimensional memory array to be subsequently formed. The semiconductor devices 710 may include, for example, field effect transistors including respective source/drain regions 742 (which may include source regions 74S and the drain regions 74D described above), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, an optional dielectric liner 762 (such as a silicon nitride liner that blocks diffusion of mobile ions and/or apply appropriate stress to underlying structures), the first dielectric material layer or layers 764 that overlie the dielectric liner 762, a silicon nitride layer (e.g., hydrogen diffusion barrier) 766 that overlies the first dielectric material layers 764, and at least one second dielectric layer 768. A bottommost one of the first dielectric material layers 764 can include the contact-level dielectric layer 764 described above.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may comprise each of the first-line-level metal lines (82S, 82D, 82G, 82A), the first via-level metal interconnect structures (e.g., first metal via structures 81), and the metal tracks 80.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6 includes a conductive material such as a metal or a heavily doped semiconductor material.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the semiconductor substrate 8. The optional conductive plate layer 6 and the in-process source-level material layers 110' may be patterned to provide openings in areas in which through-memory-level contact via structures and through-dielectric contact via structures are to be subsequently formed.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760.

Through-memory-level contact via structures may be subsequently formed directly on the lower-level metal interconnect structures 780 to provide electrical connection to memory devices to be subsequently formed.

Figure 4:
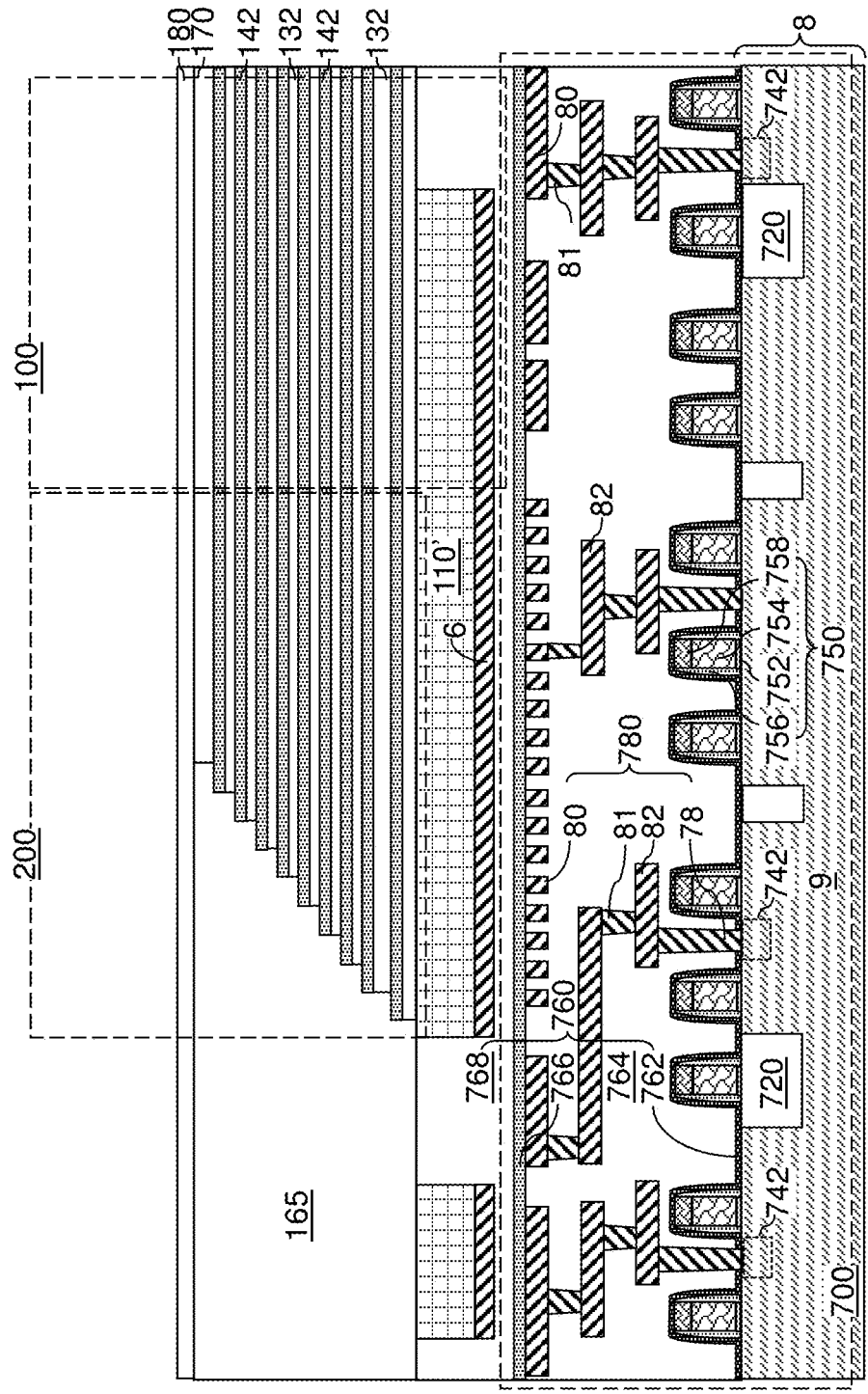
FIG. 4 is a vertical cross-sectional view of the exemplary structure after formation of a first alternating stack of first insulting layers and first spacer material layers and formation of a first retro-stepped dielectric material portion according to an embodiment of the present disclosure.

Referring to FIG. 4, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

In one embodiment, the first insulating layers 132 may include silicon oxide, and sacrificial material layers may include silicon nitride sacrificial material layers. The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142. A first insulating cap layer 170 is subsequently formed over the first alternating stack (132, 142). The first insulating cap layer 170 includes a dielectric material, which may be any dielectric material that may be used for the first insulating layers 132.

The first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The cavity overlying the first stepped surfaces is herein referred to as a first stepped cavity. A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165.

The first-tier alternating stack (132, 142) and the first retro-stepped dielectric material portion 165 collectively constitute a first-tier structure, which is an in-process structure that is subsequently modified. An inter-tier dielectric layer 180 may be optionally deposited over the first-tier structure (132, 142, 170, 165). The inter-tier dielectric layer 180 includes a dielectric material such as silicon oxide.

Figure 5A:
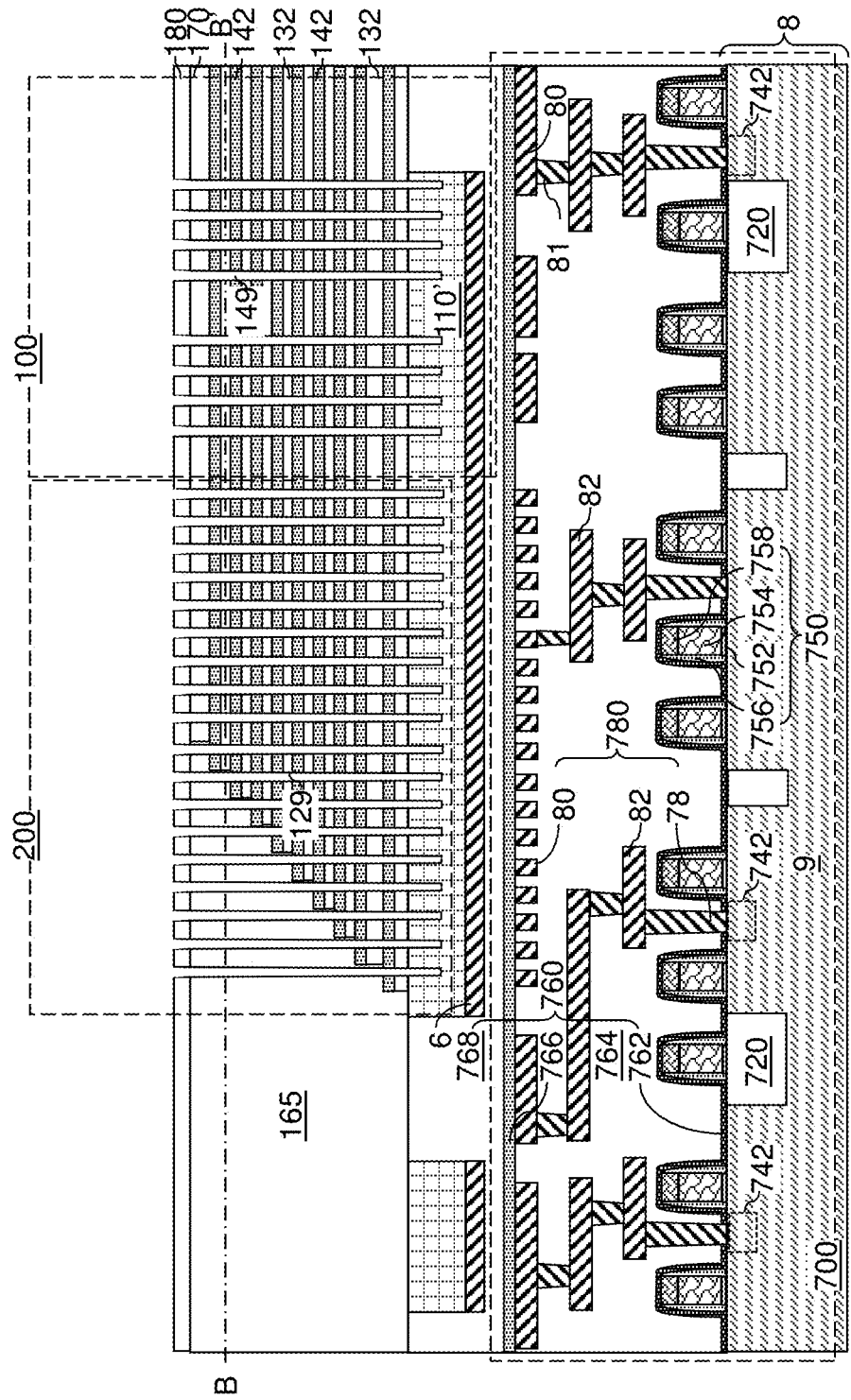
FIG. 5A is a vertical cross-sectional view of the exemplary structure after formation of first-tier memory openings and first-tier support openings according to an embodiment of the present disclosure.
Figure 5B:
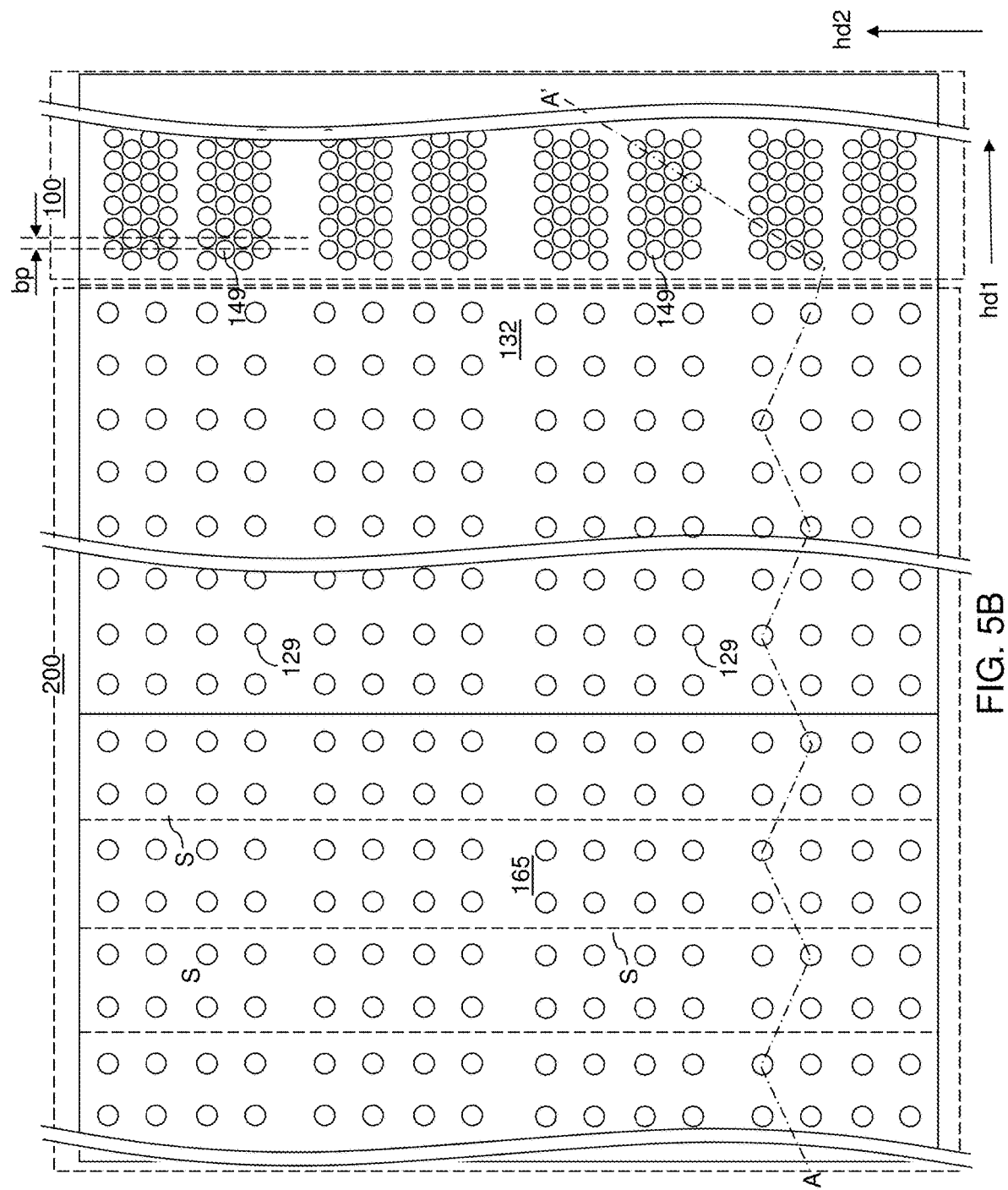
FIG. 5B is a horizontal cross-sectional view of the exemplary structure along the horizontal plane B-B' in FIG. 5A. The zig-zag vertical plane A-A' corresponds to the plane of the vertical cross-sectional view of FIG. 5A.

Referring to FIGS. 5A and 5B, various first-tier openings (149, 129) may be formed through the inter-tier dielectric layer 180 and the first-tier structure (132, 142, 170, 165) and into the in-process source-level material layers 110'. The various first-tier openings (149, 129) may include first-tier memory openings 149 and first-tier support openings 129. Locations of steps S in the first alternating stack (132, 142) are illustrated as dotted lines in FIG. 5B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

Figure 6:
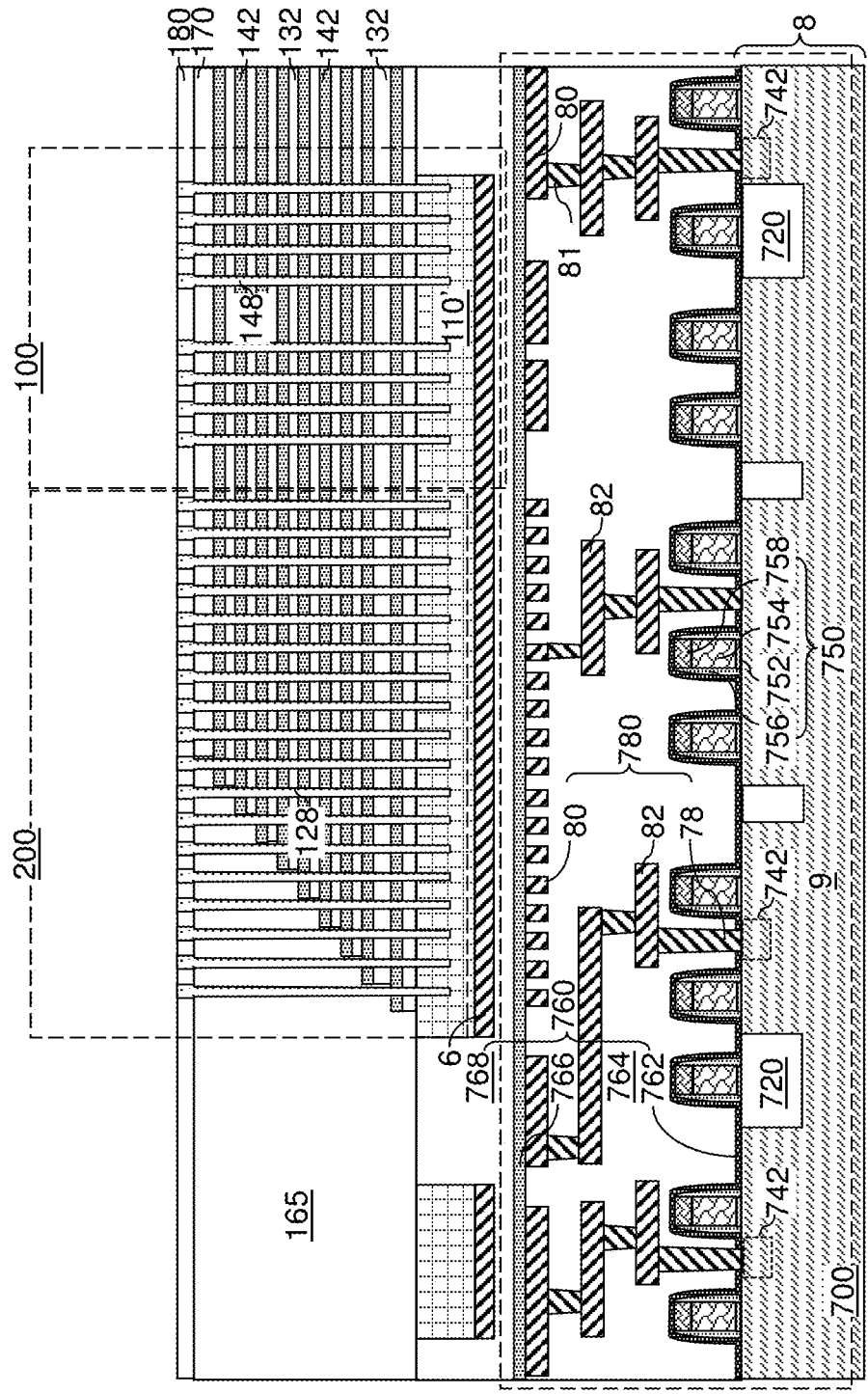
FIG. 6 is a vertical cross-sectional view of the exemplary structure after formation of sacrificial memory opening fill portions and sacrificial support opening fill portions according to an embodiment of the present disclosure.

Referring to FIG. 6, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142. Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 7:
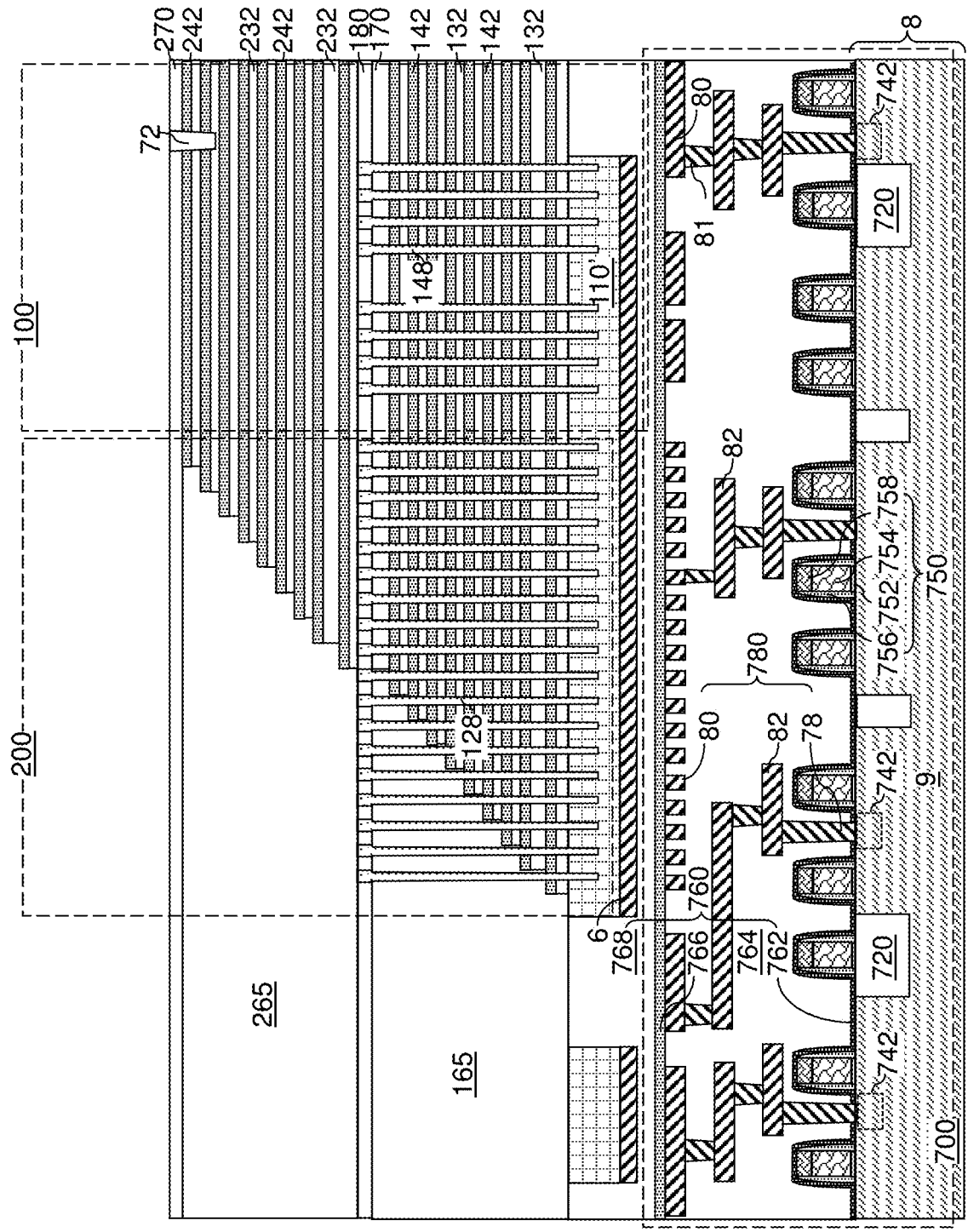
FIG. 7 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 7, a second-tier structure may be formed over the first-tier structure (132, 142, 170, 148). The second-tier structure may include an additional alternating stack of insulating layers and spacer material layers, which may be sacrificial material layers. The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200. A second insulating cap layer 270 may be subsequently formed over the second alternating stack (232, 242).

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242). Optionally, drain-select-level isolation structures 72 may be formed through a subset of layers in an upper portion of the second-tier alternating stack (232, 242).

Figure 8A:
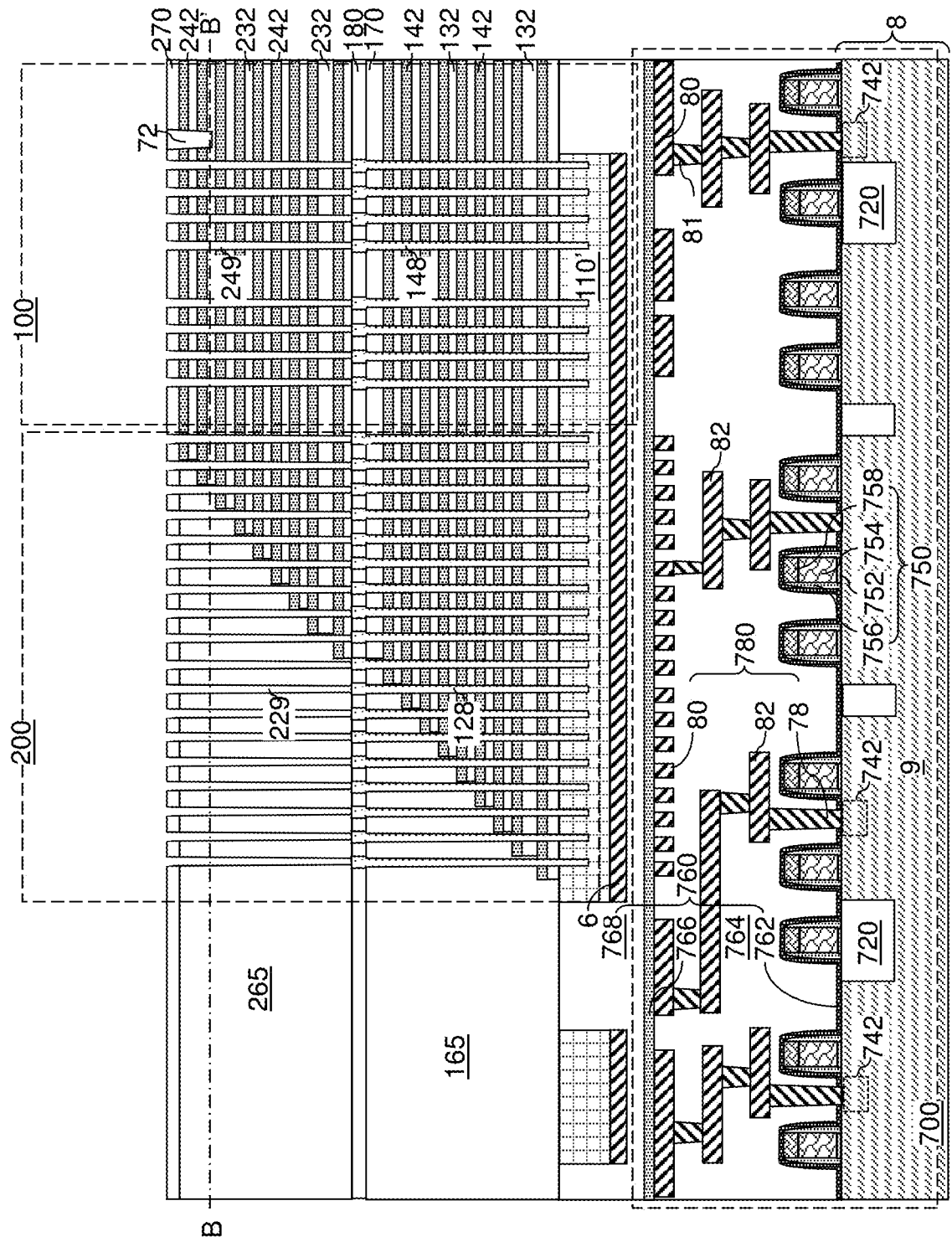
FIG. 8A is a vertical cross-sectional view of the exemplary structure after formation of second-tier memory openings and second-tier support openings according to an embodiment of the present disclosure.
Figure 8B:
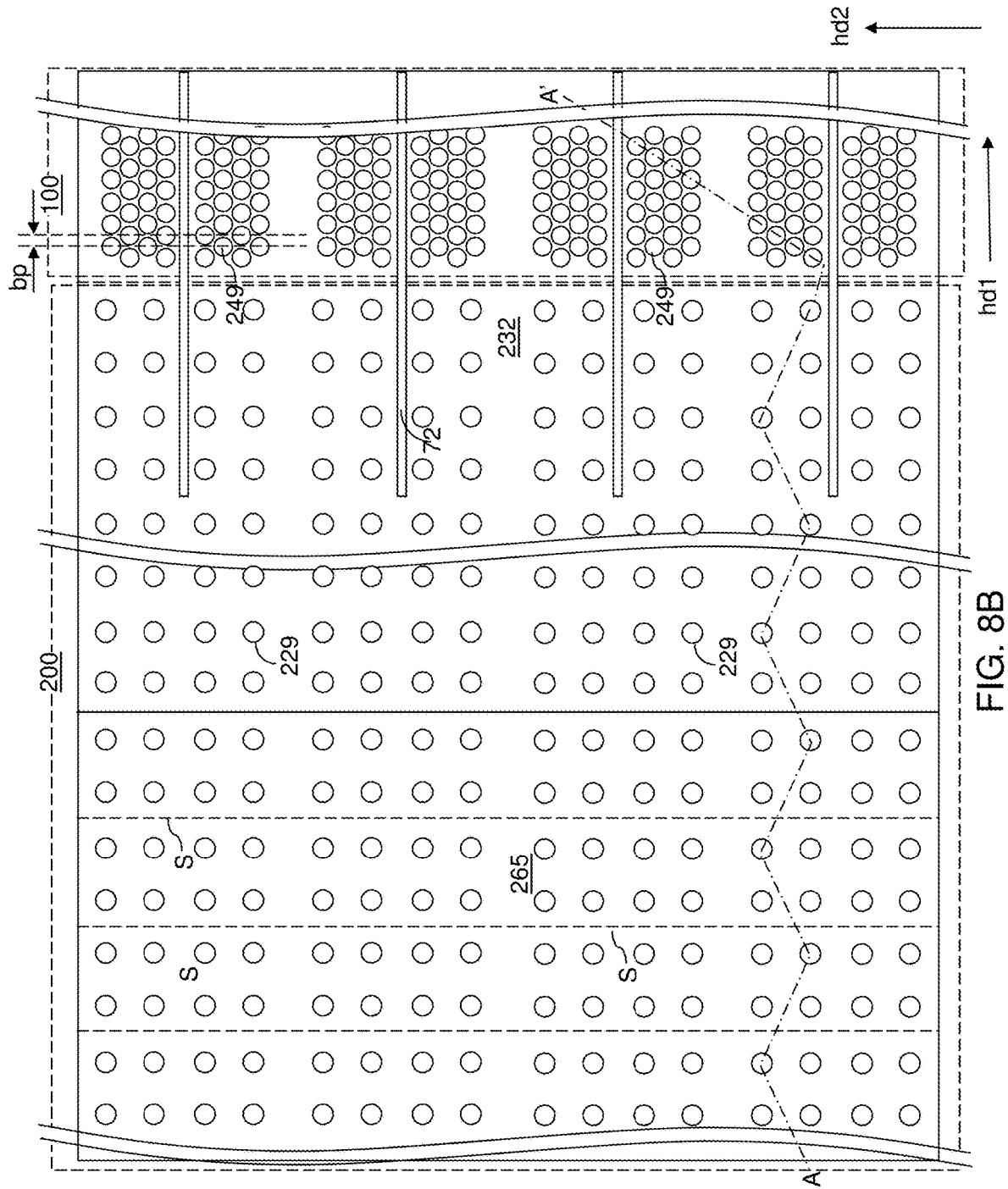
FIG. 8B is a horizontal cross-sectional view of the exemplary structure along the horizontal plane B-B' of FIG. 8A. The hinged vertical plane A-A' corresponds to the plane of the vertical cross-sectional view of FIG. 8A.

Referring to FIGS. 8A and 8B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 8B.

Figure 9:
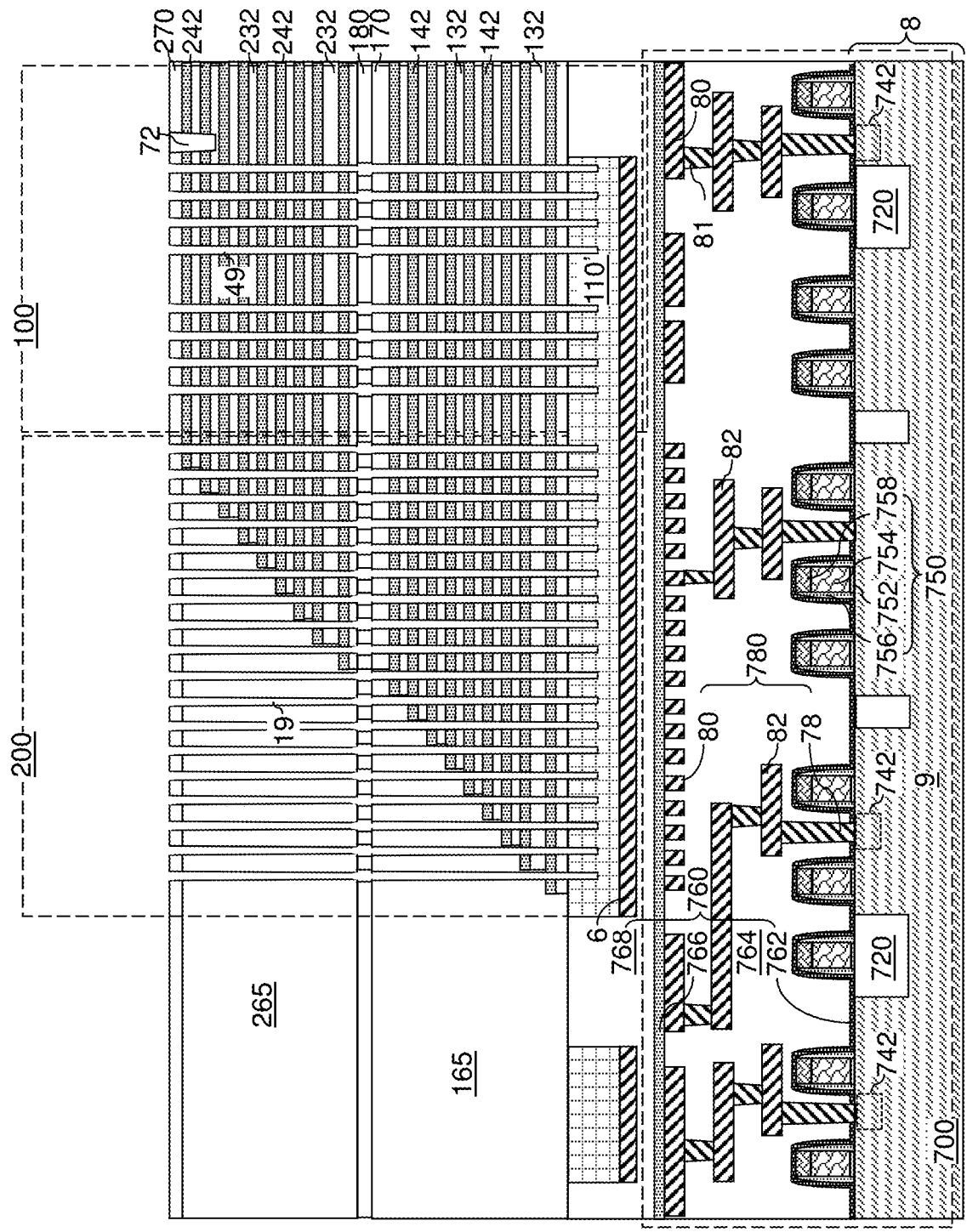
FIG. 9 is a vertical cross-sectional view of the exemplary structure after formation of inter-tier memory openings and inter-tier support openings according to an embodiment of the present disclosure.

Referring to FIG. 9, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 10A-10D provide sequential cross-sectional views of a memory opening 49 during formation of a memory opening fill structure. The same structural change occurs in each of the memory openings 49 and the support openings 19.

Referring to FIG. 10A, a memory opening 49 in the first exemplary device structure of FIG. 16 is illustrated. The memory opening 49 extends through the first-tier structure and the second-tier structure.

Referring to FIG. 11B, a stack of layers including a blocking dielectric layer 52, a charge storage layer 54, a tunneling dielectric layer 56, and a semiconductor channel material layer 60L may be sequentially deposited in the memory openings 49.

Referring to FIG. 10C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The horizontal portion of the dielectric core layer overlying the second insulating cap layer 270 may be removed, for example, by a recess etch. Each remaining portion of the dielectric core layer constitutes a dielectric core 62.

Referring to FIG. 10D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process. Each remaining portion of the doped semiconductor material of the second conductivity type constitutes a drain region 63.

Each remaining portion of the semiconductor channel material layer 60L constitutes a vertical semiconductor channel 60 through which electrical current may flow when a vertical NAND device including the vertical semiconductor channel 60 is turned on. Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 11:
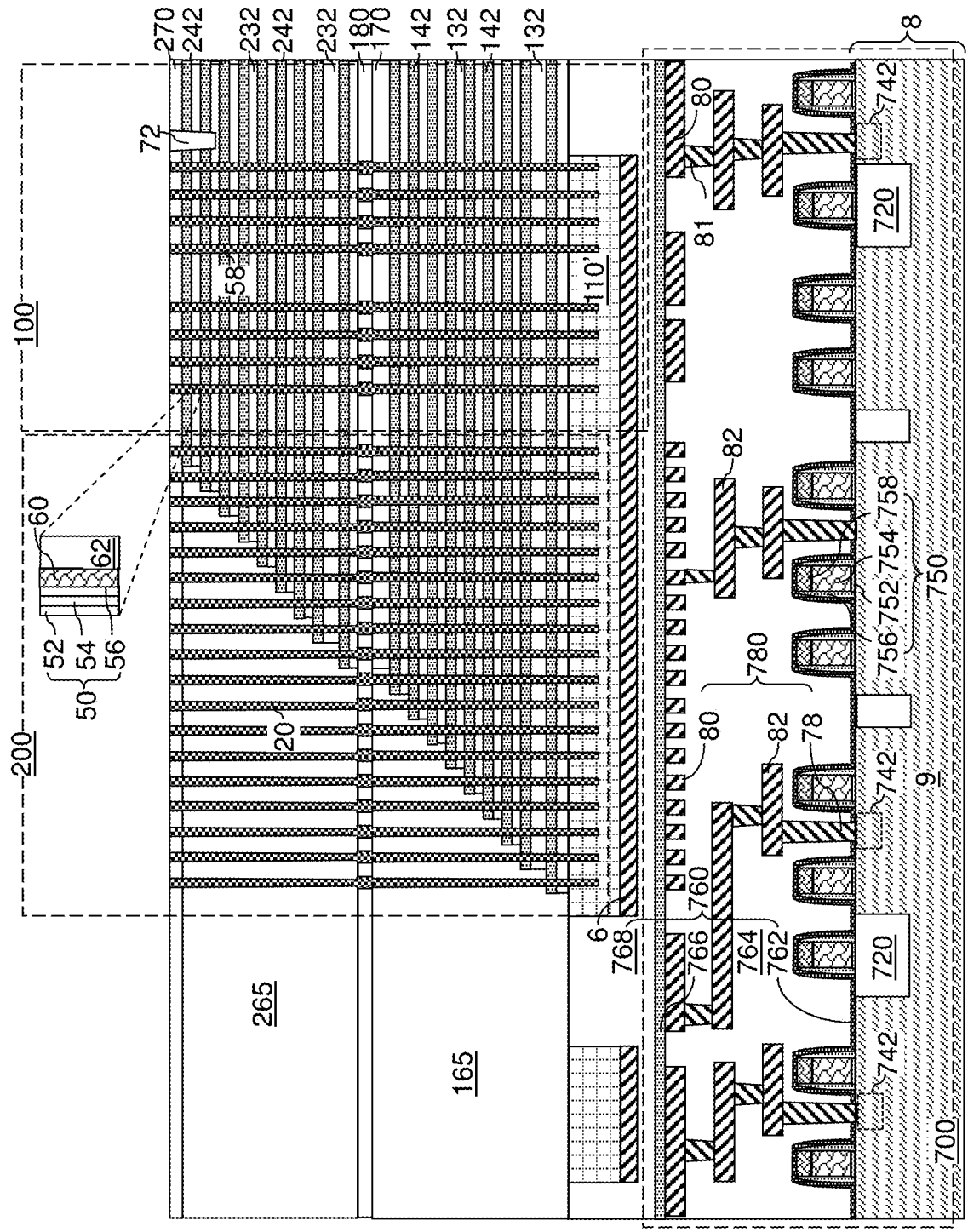
FIG. 11 is a vertical cross-sectional view of the exemplary structure after formation of memory opening fill structures and support pillar structures according to an embodiment of the present disclosure.

Referring to FIG. 11, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 12A:
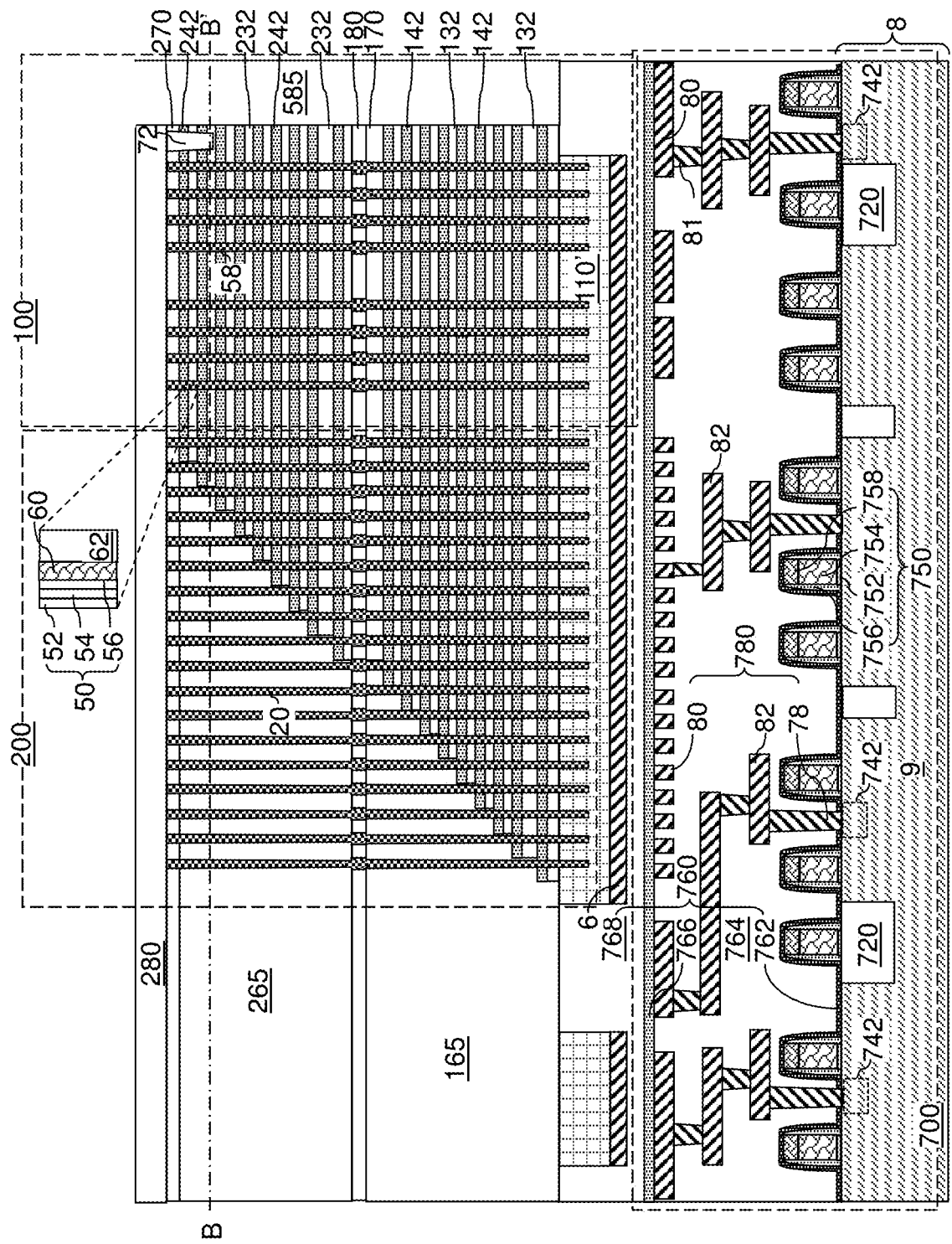
FIG. 12A is a vertical cross-sectional view of the exemplary structure after formation of pillar cavities according to an embodiment of the present disclosure.
Figure 12B:
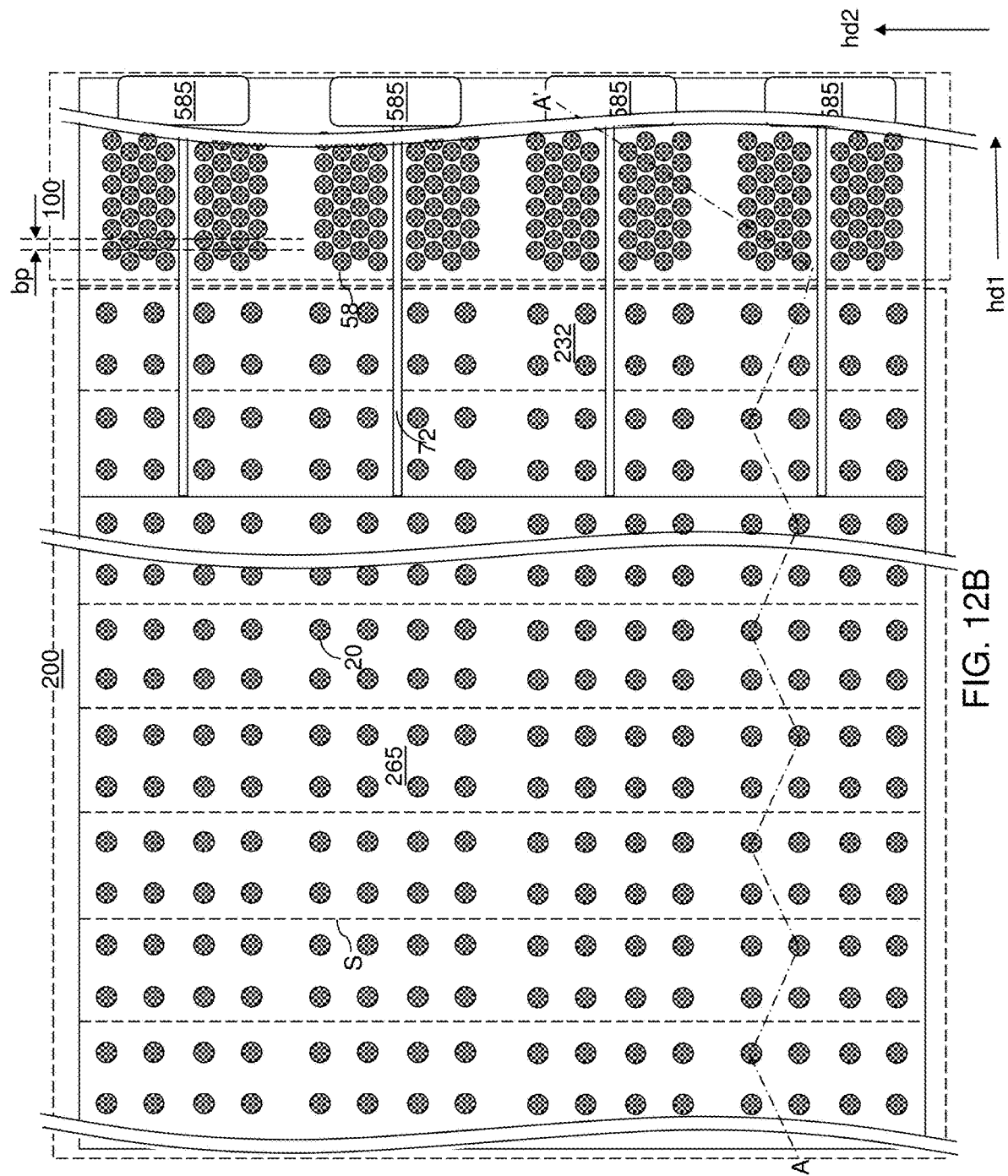
FIG. 12B is a horizontal cross-sectional view of the exemplary structure along the horizontal plane B-B' of FIG.

Referring to FIGS. 12A and 12B, a first contact-level dielectric layer 280 may be formed over the second-tier structure (232, 242, 270, 265, 72). A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Referring to FIG. 13, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Referring to FIGS. 14A and 14B, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 170, 165), and into the in-process source-level material layers 110'. Portions of the first contact-level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 16A:
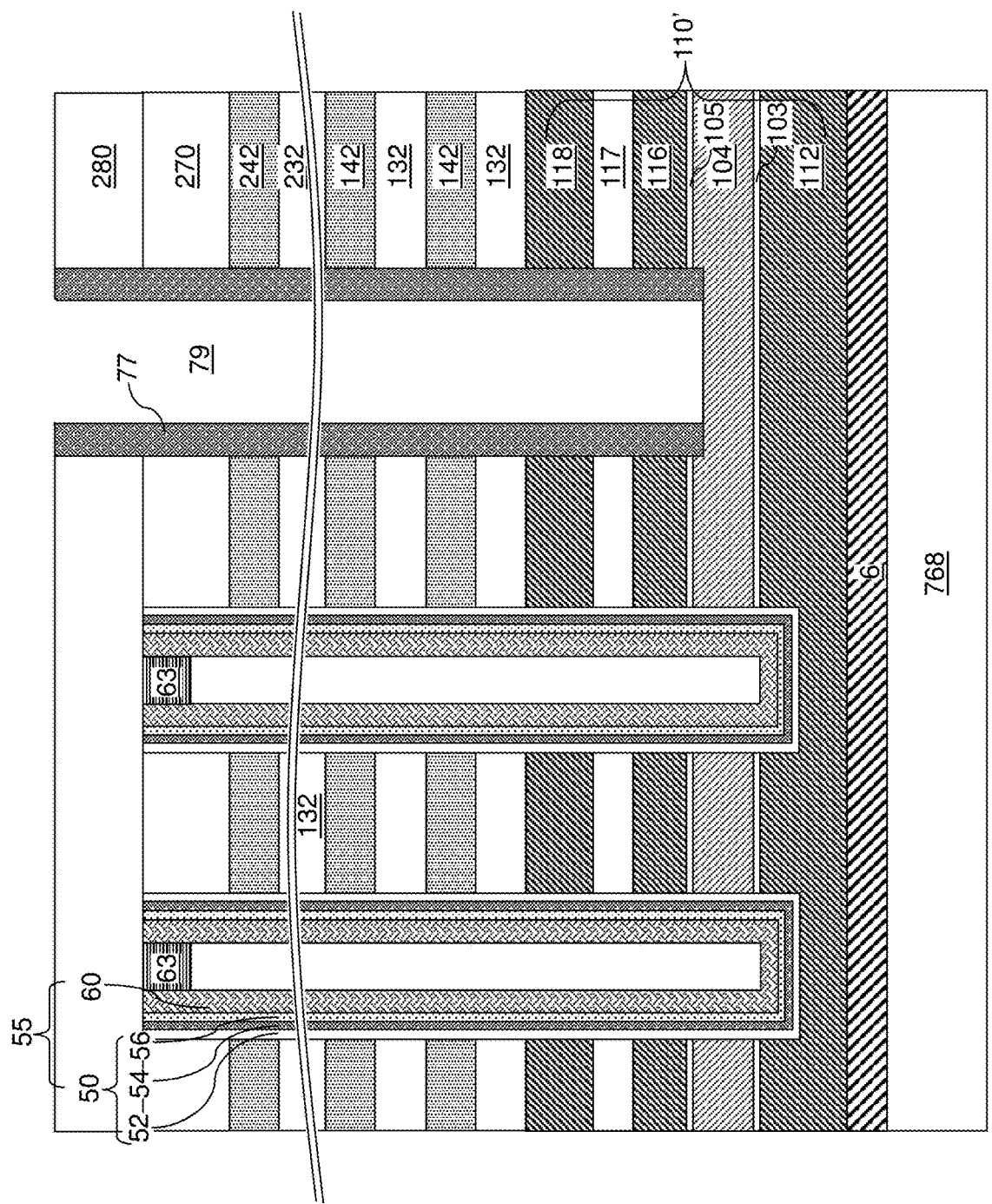

Referring to FIGS. 15 and 16A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 16B:
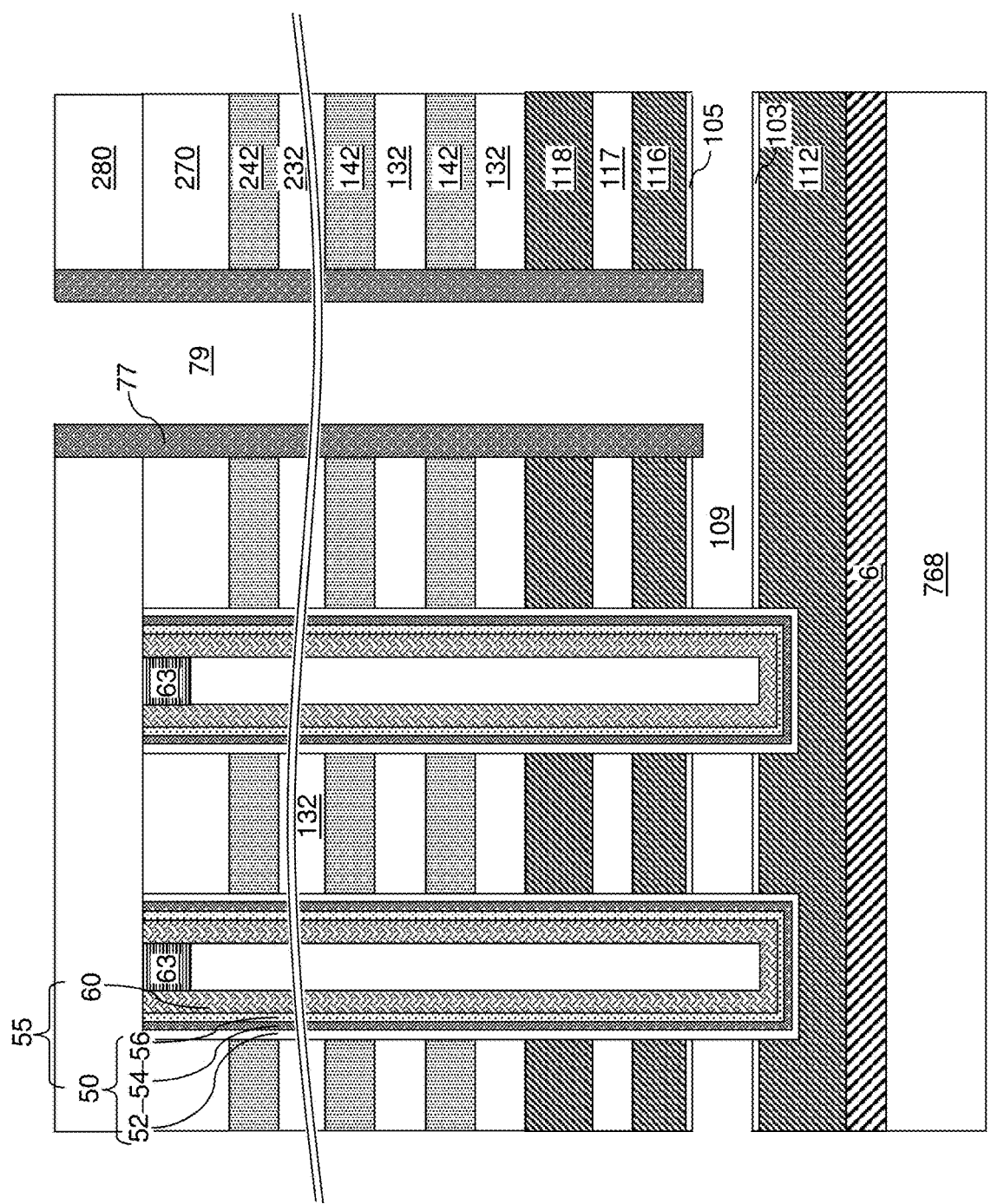

Referring to FIG. 16B, an etchant that etches the material of the source-level sacrificial layer 104 selective to the materials of the first alternating stack (132, 142), the second alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. A source cavity 109 is formed in the volume from which the source-level sacrificial layer 104 is removed.

Figure 16C:
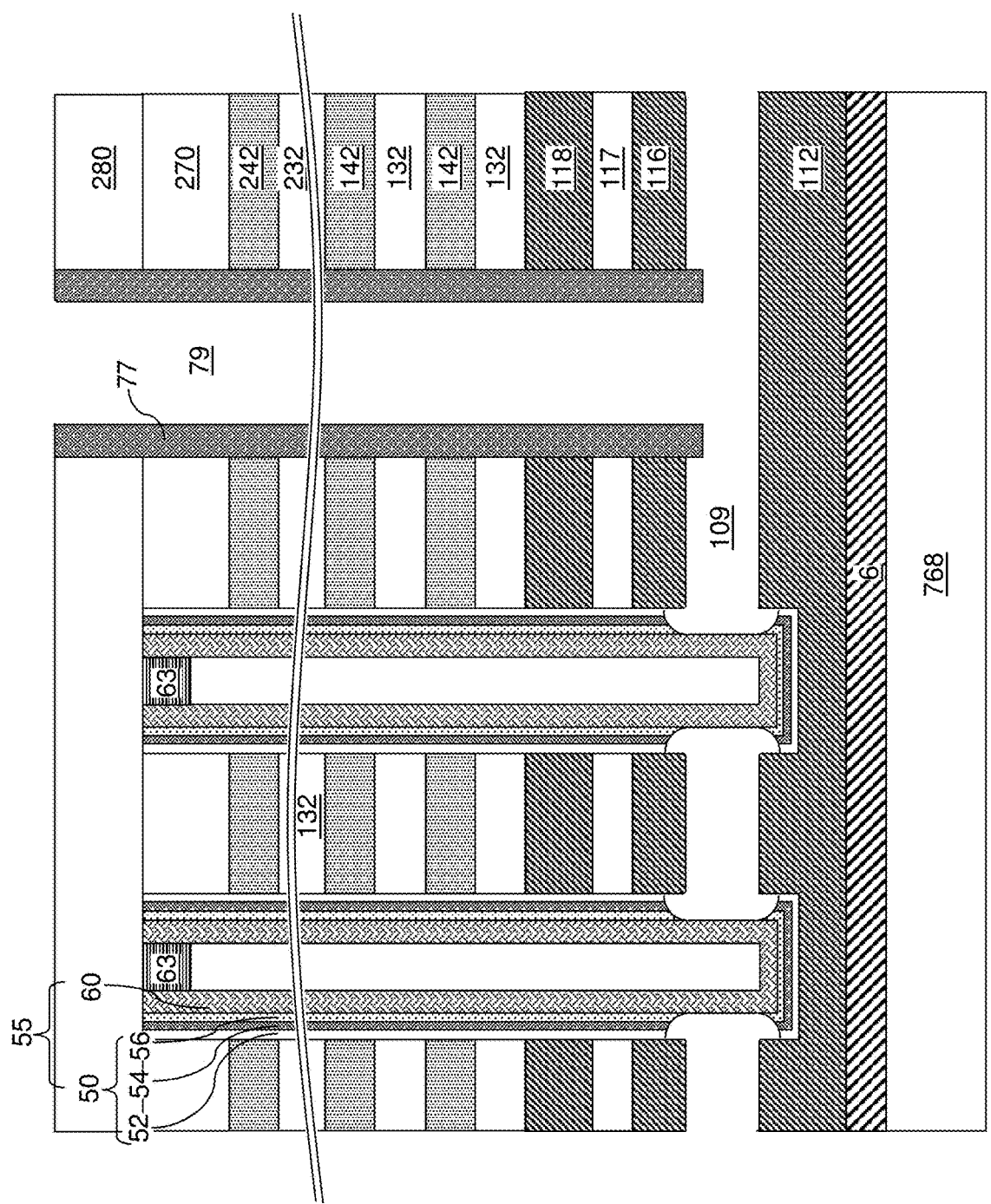

Referring to FIG. 16C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 16D:
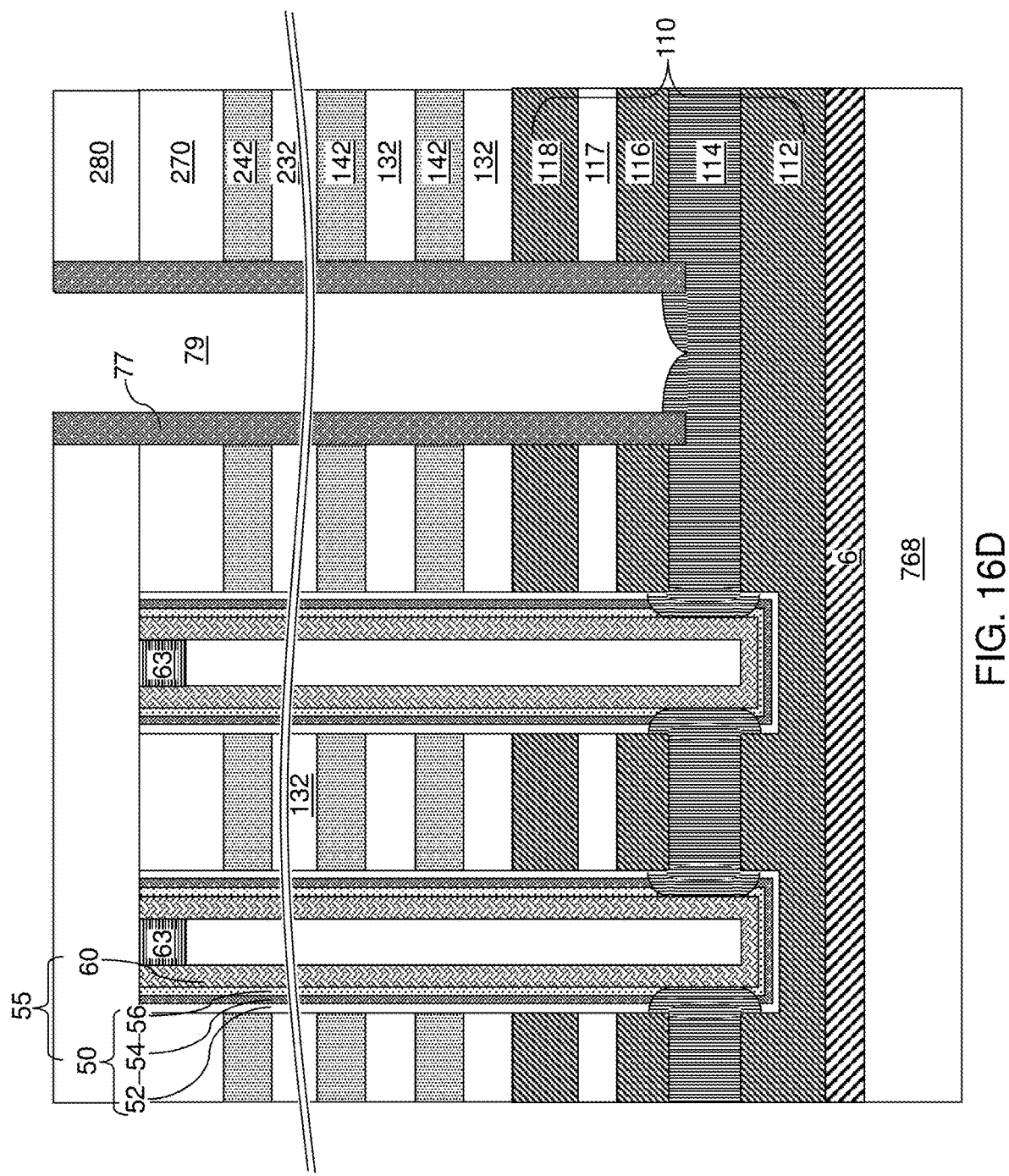

Referring to FIG. 16D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 16E:
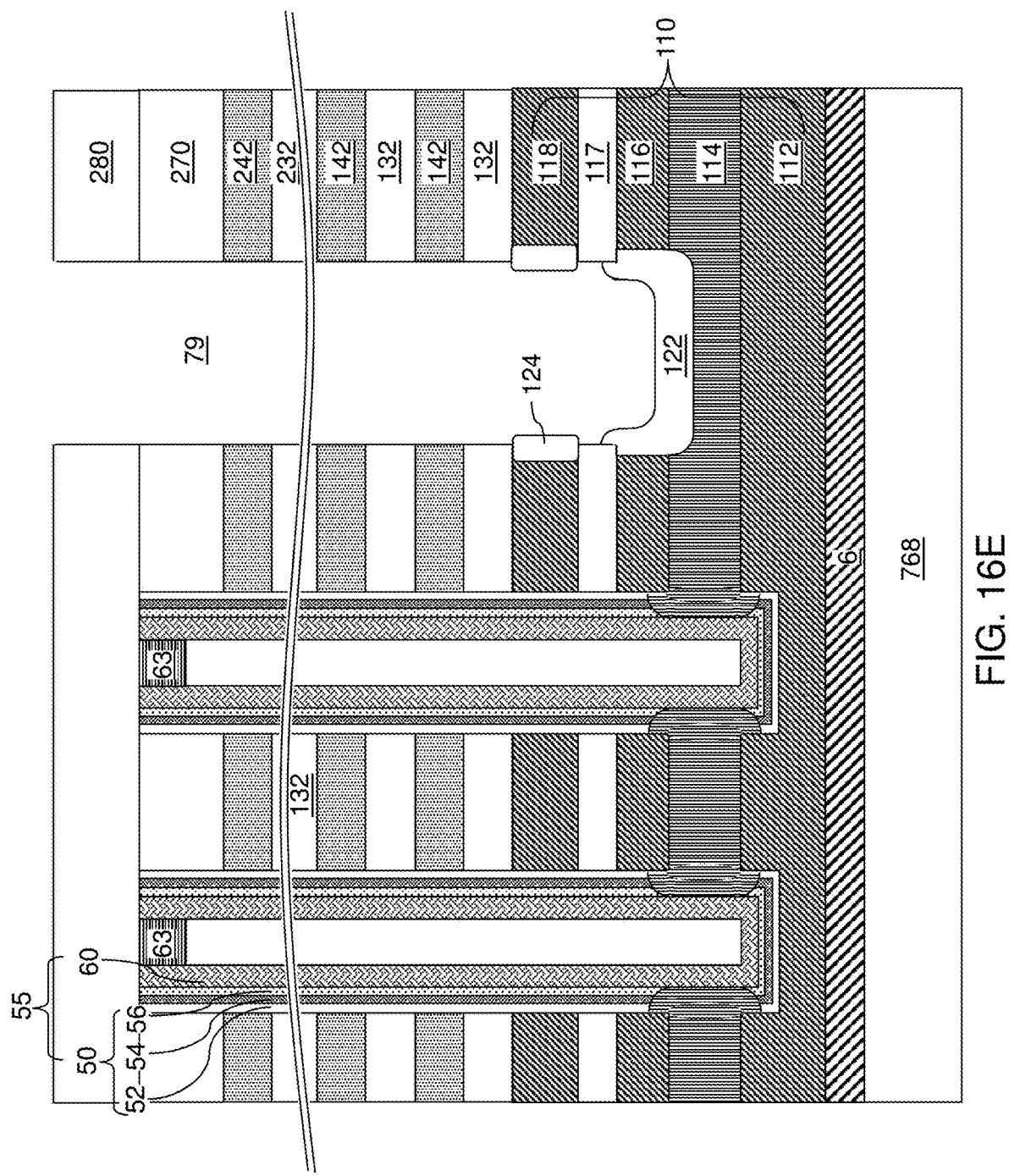

Referring to FIGS. 16E and 17, the backside trench spacers 77 may be removed selective to the insulating layers (132, 232), the first and second insulating cap layers (170, 270), the first contact-level dielectric layer 280, and the source contact layer 114 using an isotropic etch process. An oxidation process may be performed to convert physically exposed surface portions of semiconductor materials into dielectric semiconductor oxide portions.

Referring to FIG. 18, the sacrificial material layers (142, 242) are may be removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed.

Referring to FIGS. 19A and 19B, a backside blocking dielectric layer (not shown) may be optionally deposited in the backside recesses (143, 243) and the backside trenches 79 and over the first contact-level dielectric layer 280. At least one conductive material may be deposited in the plurality of backside recesses (143, 243), on the sidewalls of the backside trenches 79, and over the first contact-level dielectric layer 280. Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. The continuous metallic material layer may be removed from inside the backside trenches 79 by an etch process, which may employ an isotropic etch step and/or an anisotropic etch step. Sidewalls of the first electrically conductive material layers 146 and the second electrically conductive layers may be physically exposed to a respective backside trench 79.

Each electrically conductive layer (146, 246) may be a conductive sheet including openings laterally surrounding the memory opening fill structures 58 and the support pillar structures 20. A first subset of the openings through each electrically conductive layer (146, 246) may be filled with memory opening fill structures 58. A second subset of the openings through each electrically conductive layer (146, 246) may be filled with the support pillar structures 20.

Referring to FIGS. 20A-20C, a dielectric fill material may be conformally deposited in the backside trenches 79 and over the first contact-level dielectric layer 280 by a conformal deposition process. The dielectric fill material may include, for example, silicon oxide. The portion of the dielectric fill material that fills a backside trench 79 constitutes a backside trench fill structure 176. The portion of the dielectric fill material that overlies the first contact-level dielectric layer 280 constitutes a second contact-level dielectric layer 282.

Referring to FIGS. 21A and 21B, a photoresist layer (not shown) may be applied over the second contact-level dielectric layer 282, and may be lithographically patterned to form various contact via openings. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246).

Referring to FIG. 22, peripheral-region via cavities may be formed through the second and first contact-level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 84 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488.

Referring to FIG. 23, the exemplary structure of FIG. 22 is illustrated in a top-down view. The bit lines 84 can laterally extend along the second horizontal direction hd2, and may be laterally spaced apart with the bit line pitch bp.

In some embodiments, the memory array of the embodiments of the present disclosure may comprise an alternating stack of insulating layers (132, 232) and electrically conductive layers (146, 246) overlying a semiconductor material layer (such as a source contact layer 112); memory openings vertically extending through the alternating stack {(132, 146), (232, 246)}; and memory opening fill structures 58 located within the memory openings 49, wherein each of the memory opening fill structures 58 comprises a vertical semiconductor channel 60 and a memory film 50 that vertically extend through the alternating stack {(132, 146), (232, 246)}.

In one embodiment, the memory film 50 comprises a layer stack including a blocking dielectric layer 52, a charge storage layer 54, and a tunneling dielectric layer 56. In one embodiment, the semiconductor structure comprises: a semiconductor substrate 8, wherein the sense amplifier circuit is located on the semiconductor substrate 8; first dielectric layers (such as the lower-level dielectric material layers 760) embedding first metal interconnect structures (such as the lower-level metal interconnect structures 780) that provide interconnection within components of the sense amplifier circuit, wherein the semiconductor material layer (such as the source contact layer 112) and the alternating stack {(132, 146), (232, 246)} overlies the first dielectric layers; and second dielectric layers (such as the second and first contact-level dielectric layers (282, 280) and the line-level dielectric layer 290) overlying the alternating stack {(132, 146), (232, 246)} and embedding the bit lines 84.

An alternative embodiment of the present disclosure may be implemented in a CMOS-bonded to array (CBA) configuration shown in FIG. 24. FIG. 24 illustrates an alternative exemplary structure including a bonded assembly of a memory die 900 and a logic die 800. In this case, the sense amplifier circuit 700 of the embodiments of the present disclosure can be provided on a logic-side semiconductor substrate 801 of the logic die 800 that comprises an array of logic-side bonding pads 888. Specifically, the logic die 800 may comprise a peripheral device region 700 that includes the sense amplifier circuit described above.

The alternating stack {(132, 146), (232, 246)}, the bit lines 84, and the memory opening fill structures 58 may be provided in the memory die 900. The memory die 900 can be bonded to the logic die 800 through an array of memory-side bonding pads 988 provided within the memory die 900. In this case, the array of logic-side bonding pads 888 can be bonded to the array of memory-side bonding pads 988 via metal-to-metal bonding or via an array of solder material portions.

In one embodiment, the memory die 900 may comprises an alternating stack of insulating layers (132, 232) and electrically conductive layers (146, 246); memory openings vertically extending through the alternating stack {(132, 146), (232, 246)}; and memory opening fill structures 58 located within the memory openings 49, wherein each of the memory opening fill structures 58 comprises a vertical semiconductor channel 60 and a memory film 50 that vertically extend through the alternating stack {(132, 146), (232, 246)}.

In one embodiment, a semiconductor structure includes a memory array 100 including first and second bit lines (84A, 84B) and a sense amplifier circuit 700. The sense amplifier circuit 700 includes a first sense amplifier array A1 containing first active sense amplifier transistors 101A that each have an active region AR having a first width W1, where the first active sense amplifier transistors 101A are electrically connected to the first bit lines 84A. The sense amplifier circuit 700 also includes a second sense amplifier array A2 including second active sense amplifier transistors 101B that each have the active region AR having the first width W1, where the second active sense amplifier transistors 101B are electrically connected to the second bit lines 84B, and dummy active regions DAR which are electrically inactive located between columns of the second active sense amplifier transistors 101B.

In one embodiment, the sense amplifier circuit 700 also includes metal tracks 80 located over the first and the second sense amplifier arrays (A1, A2). In one embodiment, each of the first active sense amplifier transistors 101A and each of the second active sense amplifier transistors 101B is located in a respective active unit cell UC1 of the sense amplifier circuit 700, and each of the dummy active regions DAR are located in a respective dummy unit cell UC2 of the sense amplifier circuit 799.

In one embodiment, the active unit cells UC1 are arranged in first columns in the first and the second sense amplifier arrays (A1, A2), the dummy unit cells UC2 are arranged in second columns between the first columns in the second sense amplifier array A2, and the dummy unit cells UC2 containing the dummy active regions DAR are not present in the first sense amplifier array A1.

In one embodiment, more metal tracks 80 per first column are located over the second sense amplifier array A2 than over the first sense amplifier array A1. In one embodiment, four metal tracks 80 per first column are located over the second sense amplifier array A2, and three metal tracks 80 per first column are located over the first sense amplifier array A1. The metal tracks 80 may extend over the active unit cells UC1 in the first and the second sense amplifier arrays (A1, A2) and over the dummy unit cells UC2 in the second sense amplifier array A2.

In one embodiment, the first and the second bit lines (84A, 84B) extend in a bit line direction hd2, and the metal tracks 80 extend in the same bit line direction hd2. The active regions AR have the first width W1 along a word line direction hd1 which is perpendicular to the bit line direction hd2. In one embodiment, crossed bit lines 86 extend in the word line direction hd2 and electrically connect the second bit lines 84B to the second active sense amplifier transistors 101B.

In the first embodiment shown in FIG. 1A, the dummy active regions DAR have a second width W2 along the word line direction hd1 which is less than the first width W1. In the second embodiment shown in FIG. 2A, the dummy active regions DAR have the same first width W1 along the word line direction hd1 as the active regions AR. Dummy metal tracks 80D may extend over the dummy unit cells UC2.

Figure 2A:
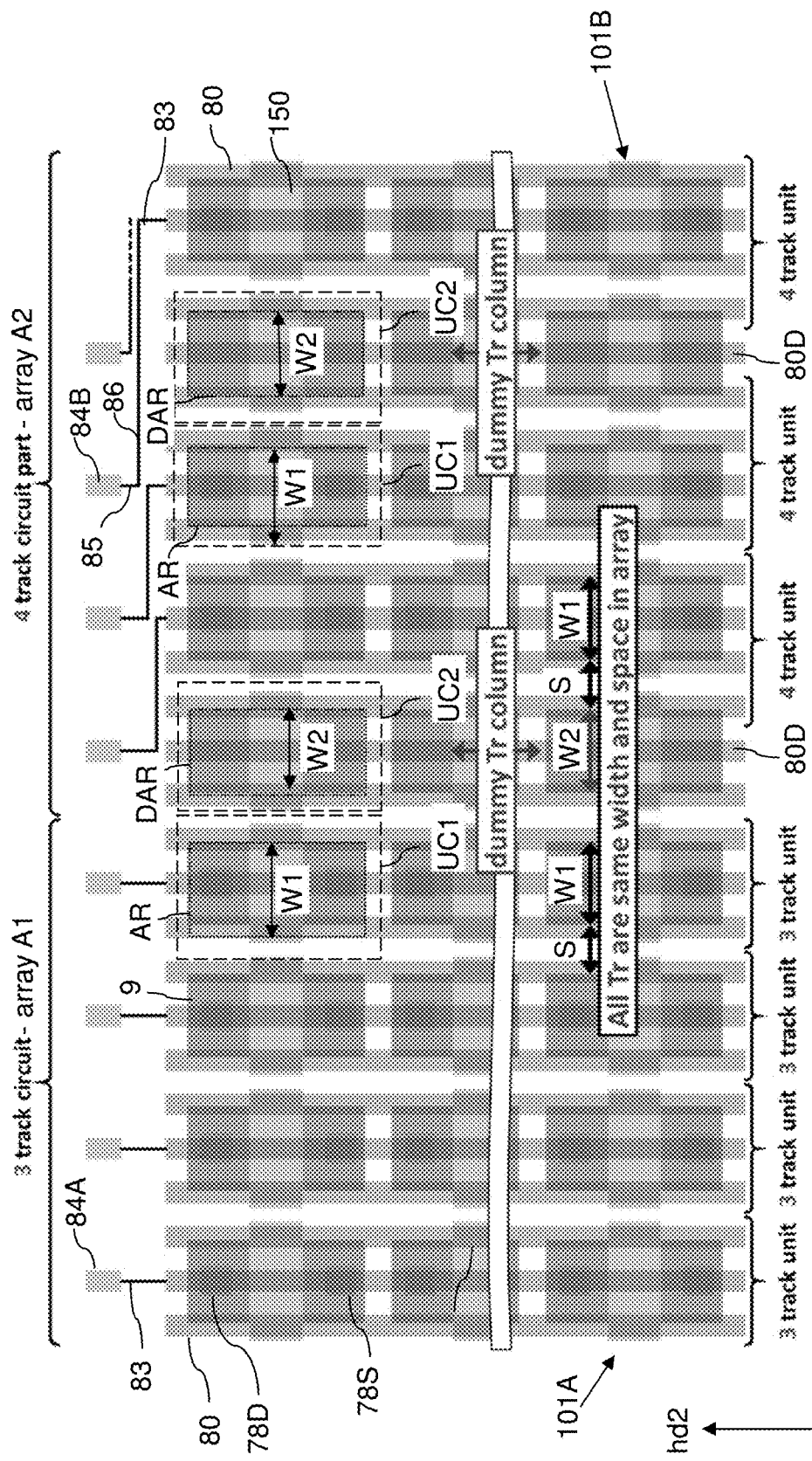
FIG. 2A is a plan view of a second exemplary sense amplifier circuit according to a second embodiment of the present disclosure.
Figure 2D:
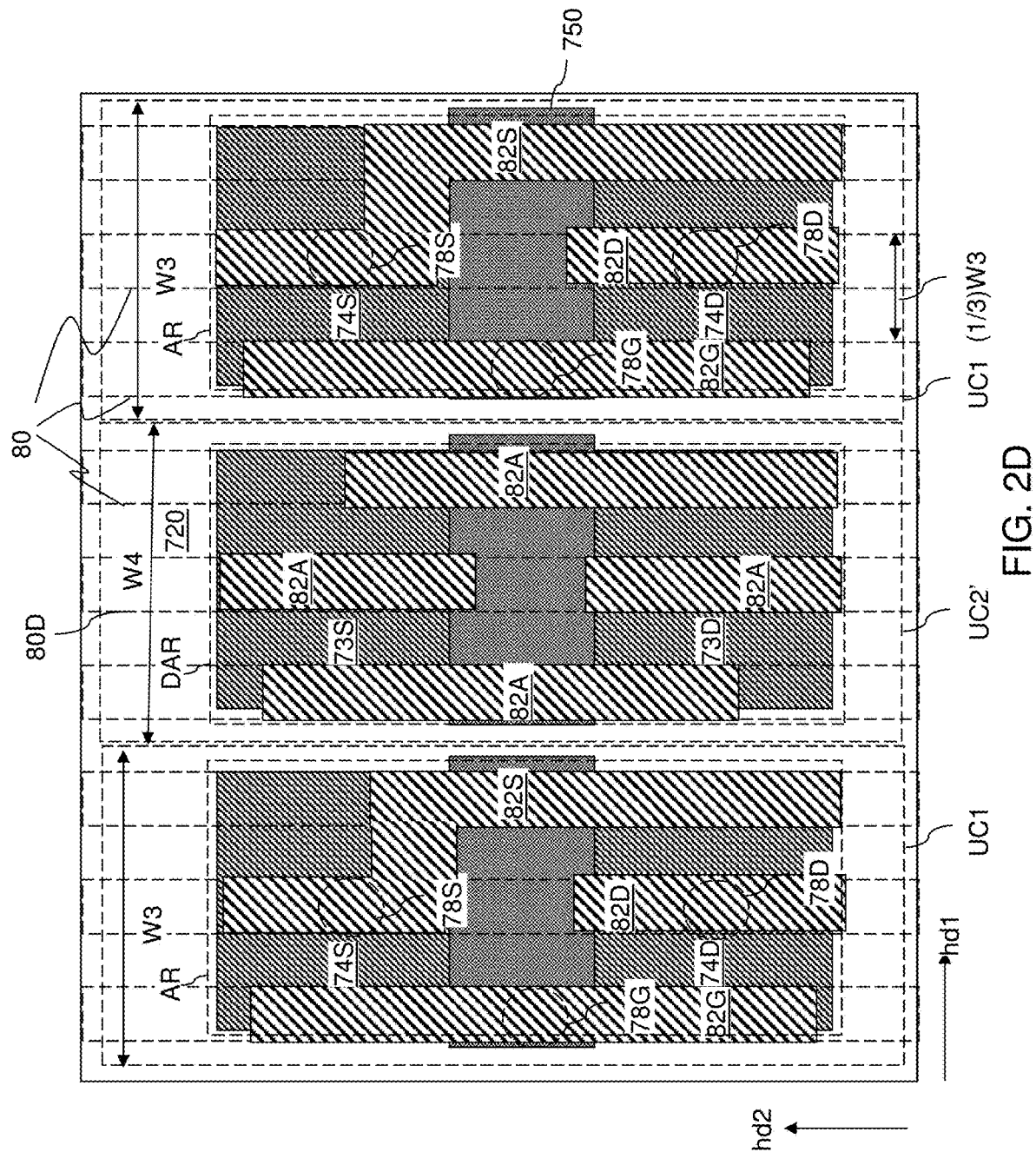
FIG. 2D is a top down view from a horizontal plane B-B' in FIGS. 1C and 1D magnified view of a region within a N2×M rectangular sense amplifier array A2 of second sense amplifiers in the second exemplary sense amplifier circuit of FIG. 2A.

In one embodiment, all active unit cells UC1 in the first and the second sense amplifier arrays (A1, A2) have a same third width W3 along the word line direction hd1. As shown in FIGS. 1A and 2A, a spacing "S" along the word line hd1 direction between adjacent active regions AR is the same in the first and the second sense amplifier arrays (A1, A2), and equals to the spacing "S" along the word line direction hd1 between an active region AR and an adjacent dummy active region DAR. In one embodiment, the metal tracks 80 overlying the first sense amplifier array A1 and the metal tracks 80 overlying the second sense amplifier array A2 have a same pitch.

In one embodiment, source and drain regions (74S, 74D) of the first and second active sense amplifier transistors (101A, 101B) are electrically connected to respective source and drain electrodes (78S, 78D), the drain electrodes 78D are electrically connected to the respective first or second bit lines (84A, 84B), and dummy source and drain regions (73S, 73D) of the dummy active regions DAR are not electrically connected to source and drain electrodes.

In one embodiment, the memory array 100 comprises an alternating stack of insulating layers (132, 232) and electrically conductive layers (146, 246), memory openings 49 vertically extending through the alternating stack, and memory opening fill structures 58 located within the memory openings 49. Each of the memory opening fill structures 58 comprises a vertical semiconductor channel 60 and a memory film 50 that vertically extend through the alternating stack. In one embodiment, the memory film 50 comprises a layer stack including a blocking dielectric layer 52, a charge storage layer 54, and a tunneling dielectric layer 56.

In the embodiment of FIG. 24, the sense amplifier circuit 700 is located on a logic-side semiconductor substrate 801 of a logic die 800 that comprises an array of logic-side bonding pads 888. The alternating stack, the bit lines 84, and the memory opening fill structures 58 are located in a memory die 900 containing an array of memory-side bonding pads 988. The array of logic-side bonding pads 888 is bonded to the array of memory-side bonding pads 988.

The various embodiments of the present disclosure may be employed to provide an area-efficient sense amplifier circuit for a memory device including a primary memory array and at least one auxiliary memory array, which may comprise a column redundancy memory array. By adding the dummy unit cells UC2, the metal tracks 80 can be employed with the same metal track pitch throughout the circuit.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:
a memory array comprising first and second bit lines; and
a sense amplifier circuit comprising:

a first sense amplifier array comprising first active sense amplifier transistors that each have an active region having a first width, wherein the first active sense amplifier transistors are electrically connected to the first bit lines;

a second sense amplifier array comprising:
second active sense amplifier transistors that each have the active region having the first width, wherein the second active sense amplifier transistors are electrically connected to the second bit lines; and
dummy active regions which are electrically inactive located between columns of the second active sense amplifier transistors.

2. The semiconductor structure of claim 1, further comprising metal tracks located over the first and the second sense amplifier arrays.

3. The semiconductor structure of claim 2, wherein each of the first active sense amplifier transistors and each of the second active sense amplifier transistors are located in a respective active unit cell of the sense amplifier circuit, and each of the dummy active regions are located in a respective dummy unit cell of the sense amplifier circuit.

4. The semiconductor structure of claim 3, wherein:
the active unit cells are arranged in first columns in the first and the second sense amplifier arrays;
the dummy unit cells are arranged in second columns between the first columns in the second sense amplifier array; and
the dummy unit cells containing the dummy active regions are not present in the first sense amplifier array.

5. The semiconductor structure of claim 4, wherein more metal tracks per first column are located over the second sense amplifier array than over the first sense amplifier array.

6. The semiconductor structure of claim 5, wherein four metal tracks per first column are located over the second sense amplifier array, and three metal tracks per first column are located over the first sense amplifier array.

7. The semiconductor structure of claim 5, wherein the metal tracks extend over the active unit cells in the first and the second sense amplifier arrays and over the dummy unit cells in the second sense amplifier array.

8. The semiconductor structure of claim 3, wherein the first and the second bit lines extend in a bit line direction, and the metal tracks extend in the bit line direction.

9. The semiconductor structure of claim 8, wherein the active regions have the first width along a word line direction which is perpendicular to the bit line direction.

10. The semiconductor structure of claim 9, further comprising crossed bit lines which extend in the word line direction and which electrically connect the second bit lines to the second active sense amplifier transistors.

11. The semiconductor structure of claim 9, wherein the dummy active regions have a second width along the word line direction which is less than the first width.

12. The semiconductor structure of claim 9, wherein the dummy active regions have the first width along the word line direction.

13. The semiconductor structure of claim 12, further comprising dummy metal tracks which extend over the dummy unit cells.

14. The semiconductor structure of claim 9, wherein all active unit cells in the first and the second sense amplifier arrays have a same third width along the word line direction.

15. The semiconductor structure of claim 14, wherein a spacing along the word line direction between adjacent active regions is the same in the first and the second sense amplifier arrays, and equals to the spacing along the word line direction between an active region and an adjacent dummy active region.

16. The semiconductor structure of claim 9, wherein the metal tracks overlying the first sense amplifier array and the metal tracks overlying the second sense amplifier array have a same pitch.

17. The semiconductor structure of claim 1, wherein:
source and drain regions of the first and the second active sense amplifier transistors are electrically connected to respective source and drain electrodes;
the drain electrodes are electrically connected to the respective first or second bit lines;
dummy source and drain regions of the dummy active regions are not electrically connected to source and drain electrodes.

18. The semiconductor structure of claim 1, wherein the memory array comprises:
an alternating stack of insulating layers and electrically conductive layers;
memory openings vertically extending through the alternating stack; and
memory opening fill structures located within the memory openings, wherein each of the memory opening fill structures comprises a vertical semiconductor channel and a memory film that vertically extend through the alternating stack.

19. The semiconductor structure of claim 18, wherein the memory film comprises a layer stack including a blocking dielectric layer, a charge storage layer, and a tunneling dielectric layer.

20. The semiconductor structure of claim 18, wherein:
the sense amplifier circuit is located on a logic-side semiconductor substrate of a logic die that comprises an array of logic-side bonding pads;
the alternating stack, the bit lines, and the memory opening fill structures are located in a memory die containing an array of memory-side bonding pads; and
the array of logic-side bonding pads is bonded to the array of memory-side bonding pads.

* * * * *